(12) United States Patent
Khaderbad et al.

(10) Patent No.: US 11,756,864 B2
(45) Date of Patent: Sep. 12, 2023

(54) CONTACT PLUGS FOR SEMICONDUCTOR DEVICE

(71) Applicant: Taiwan Semiconductor Manufacturing Co., Ltd., Hsinchu (TW)

(72) Inventors: Mrunal A Khaderbad, Hsinchu (TW); Yasutoshi Okuno, Hsinchu (TW); Sung-Li Wang, Zhubei (TW); Pang-Yen Tsai, Jhubei (TW); Shen-Nan Lee, Jhudong Township (TW); Teng-Chun Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 123 days.

(21) Appl. No.: 17/101,158

(22) Filed: Nov. 23, 2020

(65) Prior Publication Data
US 2021/0104431 A1  Apr. 8, 2021

Related U.S. Application Data

(63) Continuation of application No. 16/112,122, filed on Aug. 24, 2018, now Pat. No. 10,847,413.

(Continued)

(51) Int. Cl.
*H01L 23/48* (2006.01)
*H01L 23/485* (2006.01)
(Continued)

(52) U.S. Cl.
CPC ...... *H01L 23/485* (2013.01); *H01L 21/02634* (2013.01); *H01L 21/28562* (2013.01);
(Continued)

(58) Field of Classification Search
CPC ....... H01L 29/41; H01L 29/417; H01L 29/43; H01L 23/528; H01L 23/532;
(Continued)

(56) References Cited

U.S. PATENT DOCUMENTS 8,772,109 B2  7/2014  Colinge
8,785,285 B2  7/2014  Tsai et al.
(Continued)

FOREIGN PATENT DOCUMENTS

CN  101728320 A  6/2010
CN  102239546 A  11/2011
(Continued)

OTHER PUBLICATIONS

Gall Daniel, "Electron Mean Free Path in Elemental Metals," Journal of Applied Physics 119, 085101, Feb. 23, 2016, 6 pages.

*Primary Examiner* — Shouxiang Hu
(74) *Attorney, Agent, or Firm* — Slater Matsil, LLP

(57) ABSTRACT

A semiconductor device and a method of forming the same are provided. A method includes forming a gate over a semiconductor structure. An epitaxial source/drain region is formed adjacent the gate. A dielectric layer is formed over the epitaxial source/drain region. An opening extending through the dielectric layer and exposing the epitaxial source/drain region is formed. A conductive material is non-conformally deposited in the opening. The conductive material fills the opening in a bottom-up manner.

20 Claims, 58 Drawing Sheets

Related U.S. Application Data

(60) Provisional application No. 62/592,714, filed on Nov. 30, 2017.

(51) Int. Cl.

| | | |
|---|---|---|
| *H01L 21/768* | (2006.01) | |
| *H01L 29/66* | (2006.01) | |
| *H01L 21/311* | (2006.01) | |
| *H01L 21/02* | (2006.01) | |
| *H01L 21/285* | (2006.01) | |
| *H01L 29/417* | (2006.01) | |
| *H01L 29/78* | (2006.01) | |
| *H01L 21/8234* | (2006.01) | |
| *H01L 29/45* | (2006.01) | |
| *H01L 21/8238* | (2006.01) | |
| *H01L 23/532* | (2006.01) | |
| *H01L 23/528* | (2006.01) | |
| *H01L 29/08* | (2006.01) | |
| *H01L 29/41* | (2006.01) | |

(52) U.S. Cl.
CPC .. *H01L 21/31116* (2013.01); *H01L 21/76814* (2013.01); *H01L 21/76822* (2013.01); *H01L 21/76826* (2013.01); *H01L 21/76831* (2013.01); *H01L 21/76846* (2013.01); *H01L 21/76847* (2013.01); *H01L 21/823431* (2013.01); *H01L 21/823821* (2013.01); *H01L 23/528* (2013.01); *H01L 23/532* (2013.01); *H01L 29/0847* (2013.01); *H01L 29/41* (2013.01); *H01L 29/417* (2013.01); *H01L 29/41791* (2013.01); *H01L 29/456* (2013.01); *H01L 29/66545* (2013.01); *H01L 29/66795* (2013.01); *H01L 29/785* (2013.01); *H01L 29/7848* (2013.01)

(58) Field of Classification Search
CPC ... H01L 23/525; H01L 23/522; H01L 23/538; H01L 29/08; H01L 29/45; H01L 27/088; H01L 21/76822; H01L 21/823821; H01L 29/456; H01L 29/66545; H01L 21/823431; H01L 29/785; H01L 29/41791; H01L 21/28562; H01L 21/76846; H01L 21/76847; H01L 21/02634; H01L 21/31116; H01L 21/76814; H01L 29/66795; H01L 29/7848; H01L 21/3105; H01L 21/28556; H01L 23/53257; H01L 23/53242; H01L 23/53209; H01L 21/76849; H01L 23/485; H01L 21/76895; H01L 21/76886; H01L 21/76877; H01L 21/76831; H01L 21/76826; H01L 21/76897; H01L 21/76843

See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,502,265 B1 | 11/2016 | Jiang et al. |
| 9,520,482 B1 | 12/2016 | Chang et al. |
| 9,576,814 B2 | 2/2017 | Wu et al. |
| 10,008,382 B2 | 6/2018 | Lin et al. |
| 10,134,872 B2 | 11/2018 | Chiou et al. |
| 2010/0099256 A1 | 4/2010 | Asako et al. |
| 2010/0155846 A1 | 6/2010 | Mukherjee et al. |
| 2014/0191400 A1 | 7/2014 | Chien et al. |
| 2015/0179579 A1 | 6/2015 | Jezewski et al. |
| 2015/0206945 A1 | 7/2015 | Chen et al. |
| 2015/0243526 A1 | 8/2015 | Hsiao et al. |
| 2016/0190321 A1 | 6/2016 | Wang et al. |
| 2016/0336412 A1* | 11/2016 | Hung ............... H01L 29/66636 |
| 2017/0186743 A1 | 6/2017 | Chiou et al. |
| 2020/0286836 A1 | 9/2020 | Jezewski et al. |
| 2020/0303184 A1 | 9/2020 | Lin et al. |

FOREIGN PATENT DOCUMENTS

| | | |
|---|---|---|
| CN | 106068549 A | 11/2016 |
| CN | 106409654 A | 2/2017 |
| CN | 106920751 A | 7/2017 |
| JP | 2012508989 A | 4/2012 |
| KR | 20170015062 A | 2/2017 |
| KR | 20170077771 A | 7/2017 |
| KR | 20170110000 A | 10/2017 |
| WO | 2010080276 A2 | 7/2010 |

* cited by examiner

CONTACT PLUGS FOR SEMICONDUCTOR DEVICE

PRIORITY CLAIM AND CROSS-REFERENCE

This application is a continuation of U.S. patent application Ser. No. 16/112,122, filed on Aug. 24, 2018, entitled "Method of Forming Contact Plugs for Semiconductor Device," which claims the benefit of U.S. Provisional Application No. 62/592,714, filed on Nov. 30, 2017, entitled "Contact Plugs for Semiconductor Device and Method of Forming Same," which applications are hereby incorporated herein by reference in their entireties.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-5A are cross-sectional views of intermediate stages in the manufacture of a FinFET device in accordance with some embodiments.

FIGS. 16B-19B are cross-sectional views of intermediate stages in the manufacture of a FinFET device in accordance with some embodiments.

FIGS. 23B-42B are cross-sectional views of intermediate stages in the manufacture of a FinFET device in accordance with some embodiments.

DETAILED DESCRIPTION

Figure 1:
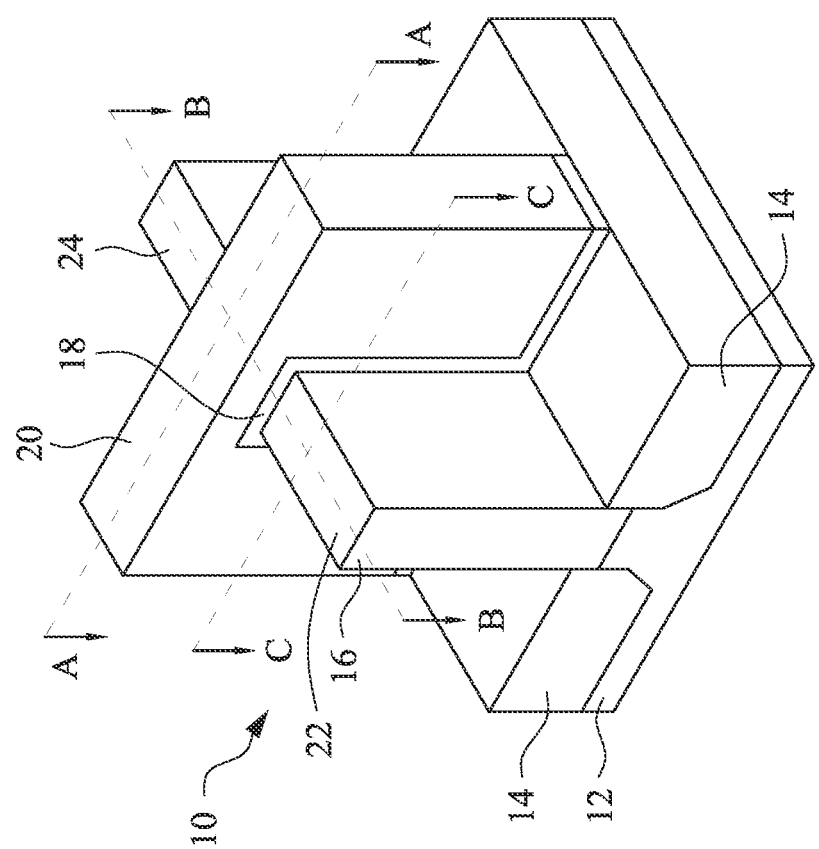
FIG. 1 is a perspective view of a fin field-effect transistor ("FinFET") device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a fin field-effect transistor (FinFET) device and a method of forming the same. Various embodiments presented herein are discussed in the context of a FinFET device formed using a gate-last process. In other embodiments, a gate-first process may be used. Also, some embodiments contemplate aspects used in planar transistor devices, multiple-gate transistor devices, 2D transistor devices, gate-all-around transistor devices, nanowire transistor devices, or the like. Various embodiments discussed herein allow for forming low-resistance contact plugs, allow for reducing or avoiding peeling and corrosion/damage of contact plugs during performing a chemical mechanical polishing (CMP) process. Various embodiments discussed herein also allow for enlarging gapfill capability while forming contact plugs and reducing contact plug resistance by non-conformally and selectively forming barrier layers, by eliminating barrier layers, by using bottom-up deposition process, and by forming alloy or non-alloy interfaces between conductive plugs and corresponding conductive vias.

FIG. 1 illustrates an example of a fin field-effect transistor (FinFET) 10 in a three-dimensional view. The FinFET 10 comprises a fin 16 on a substrate 12. The substrate 12 includes isolation regions 14, and the fin 16 protrudes above and from between neighboring isolation regions 14. A gate dielectric 18 is along sidewalls and over a top surface of the fin 16, and a gate electrode 20 is over the gate dielectric 18. Source/drain regions 22 and 24 are disposed in opposite sides of the fin 16 with respect to the gate dielectric 18 and gate electrode 20. The FinFET 10 illustrated in FIG. 1 is provided for illustrative purposes only and is not meant to limit the scope of the present disclosure. As such, many variations are possible, such as epitaxial source/drain regions, multiple fins, multilayer fins, etc.

FIGS. 2A-11A, 13A-15A, 6B-11B, 13B-19B, 23B-42B, and 7C-12C are cross-sectional views of intermediate stages in the manufacturing of a FinFET device in accordance with some embodiments. In FIGS. 2A-11A, 13A-15A, 6B-11B, 13B-19B, 23B-42B, and 7C-12C, figures ending with an "A" designation are illustrated along the reference cross-section A-A illustrated in FIG. 1, except for multiple FinFETs and multiple fins per FinFET; figures ending with a "B" designation are illustrated along the reference cross-section B-B illustrated in FIG. 1; and figures ending with a "C" designation are illustrated along the cross-section C-C illustrated in FIG. 1.

Figure 2A:
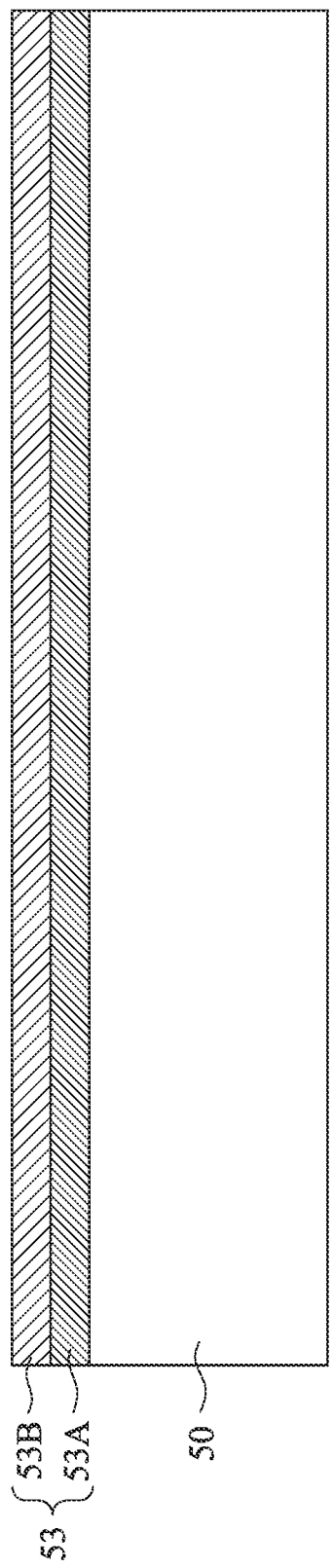

FIG. 2A illustrates a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof; or the like.

The substrate 50 may further include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the resulting FinFET device. The integrated circuit devices may be formed using any suitable methods.

In some embodiments, appropriate wells (not shown) may be formed in the substrate 50. In some embodiments where the resulting FinFET device is an n-type device, the wells are p-wells. In some embodiments where the resulting FinFET device is a p-type device, the wells are n-wells. In other embodiments, both p-wells and n-wells are formed in the substrate 50. In some embodiments, p-type impurities are implanted into the substrate 50 to form the p-wells. The p-type impurities may be boron, $BF_2$, or the like, and may be implanted to a concentration of equal to or less than $10^{18}$ $cm^{-3}$, such as in a range from about $10^{17}$ $cm^{-3}$ to about $10^{22}$ $cm^{-3}$. In some embodiments, n-type impurities are implanted into the substrate 50 to form the n-wells. The n-type impurities may be phosphorus, arsenic, or the like, and may be implanted to a concentration of equal to or less than $10^{22}$ $cm^{-3}$, such as in a range from about $10^{17}$ $cm^{-3}$ to about $10^{22}$ $cm^{-3}$. After implanting the appropriate impurities, an annealing process may be performed on the substrate to activate the p-type and n-type impurities that were implanted.

FIG. 2A further illustrates the formation of a mask 53 over the substrate 50. In some embodiments, the mask 53 may be used in a subsequent etching step to pattern the substrate 50 (see FIG. 3A). In some embodiments, the mask 53 may comprise one or more mask layers. As shown in FIG. 2A, in some embodiments, the mask 53 may include a first mask layer 53A and a second mask layer 53B over the first mask layer 53A. The first mask layer 53A may be a hard mask layer, may comprise silicon oxide, silicon nitride, silicon oxynitride, silicon carbide, silicon carbonitride, a combination thereof, or the like, and may be formed using any suitable process, such as thermal oxidation, thermal nitridation, atomic layer deposition (ALD), physical vapor deposition (PVD), chemical vapor deposition (CVD), a combination thereof, or the like. The first mask layer 53A may be used to prevent or minimize etching of the substrate 50 underlying the first mask layer 53A in the subsequent etch step (see FIG. 3A). The second mask layer 53B may comprise a photoresist, and in some embodiments, may be used to pattern the first mask layer 53A for use in the subsequent etching step. The second mask layer 53B may be formed using a spin-on technique and may be patterned using acceptable photolithography techniques. In some embodiments, the mask 53 may comprise three or more mask layers.

Figure 3A:
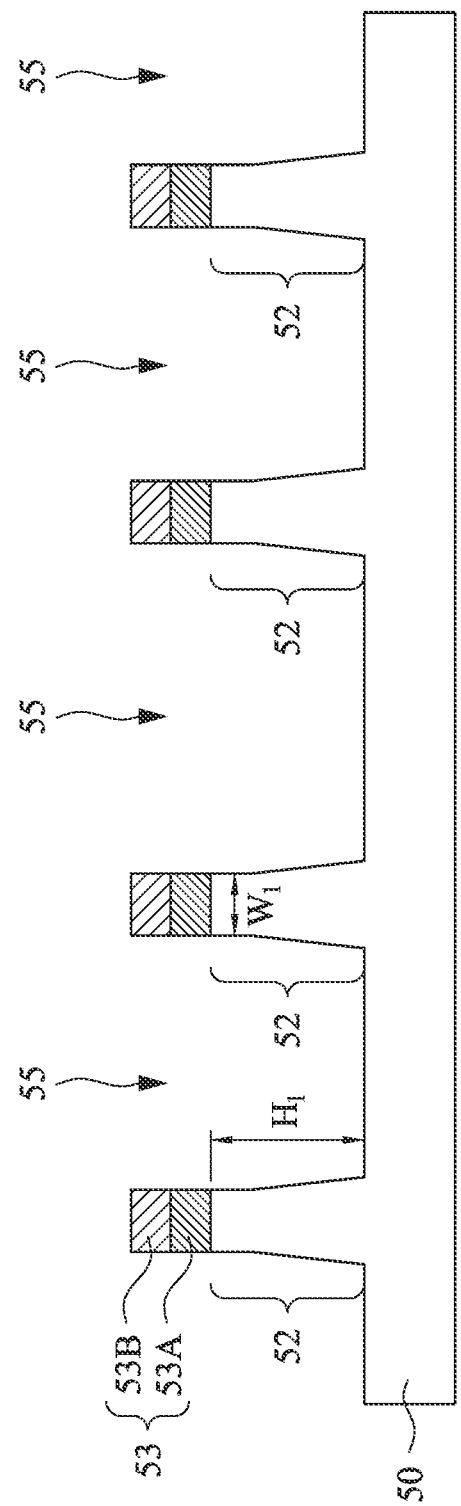

FIG. 3A illustrates the formation of semiconductor strips 52 in the substrate 50. First, mask layers 53A and 53B may be patterned, where openings in mask layers 53A and 53B expose areas of the substrate 50 where trenches 55 will be formed. Next, an etching process may be performed, where the etching process creates the trenches 55 in the substrate 50 through the openings in the mask 53. The remaining portions of the substrate 50 underlying a patterned mask 53 form a plurality of semiconductor strips 52. The etching may be any acceptable etch process, such as a reactive ion etch (RIE), neutral beam etch (NBE), a combination thereof, or the like. The etch process may be anisotropic. In some embodiments, after forming the semiconductor strips 52, any remaining portions of the mask 53 may be removed by any suitable process. In other embodiments, portions of the mask 53, such as the first mask layer 53A, may remain over the semiconductor strips 52. In some embodiments, the semiconductor strips 52 may have a height $H_1$ between about 5 nm and about 500 nm. In some embodiments, the semiconductor strips 52 may have a width $W_1$ between about 2 nm and about 100 nm.

Figure 4A:
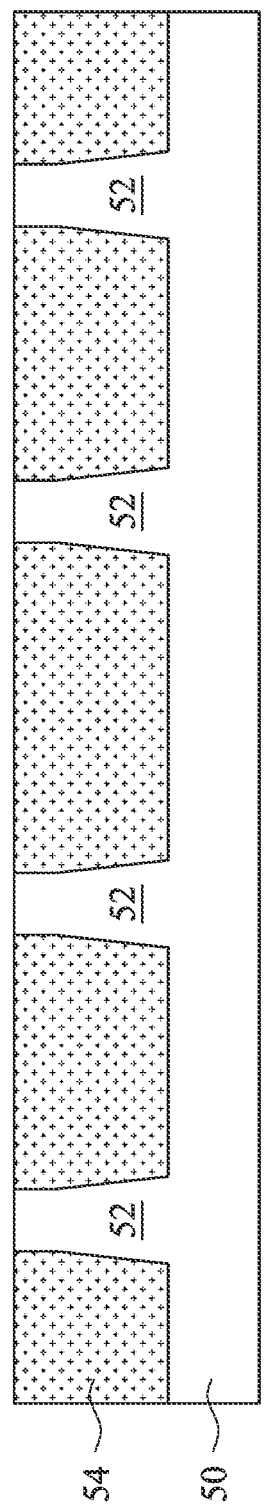

FIG. 4A illustrates the formation of an insulation material in the trenches 55 (see FIG. 3A) between neighboring semiconductor strips 52 to form isolation regions 54. The insulation material may be an oxide, such as silicon oxide, a nitride, such as silicon nitride, a combination thereof, or the like, and may be formed by a high density plasma chemical vapor deposition (HDP-CVD), a flowable CVD (FCVD) (e.g., a CVD-based material deposition in a remote plasma system and post curing to make it convert to another material, such as an oxide), a combination thereof, or the like. Other insulation materials formed by any acceptable processes may be also used.

Furthermore, in some embodiments, the isolation regions 54 may include a conformal liner (not illustrated) formed on sidewalls and bottom surfaces of the trenches 55 (see FIG. 3A) prior to filling the trenches 55 with the insulation material of the isolation regions 54. In some embodiments, the liner may comprise a semiconductor (e.g., silicon) nitride, a semiconductor (e.g., silicon) oxide, a thermal semiconductor (e.g., silicon) oxide, a semiconductor (e.g., silicon) oxynitride, a polymer, combinations thereof, or the like. The formation of the liner may include any suitable method, such as ALD, CVD, HDP-CVD, PVD, a combination thereof, or the like. In such embodiments, the liner may prevent (or at least reduce) the diffusion of the semiconductor material from the semiconductor strips 52 (e.g., Si and/or Ge) into the surrounding isolation regions 54 during the subsequent annealing of the isolation regions 54. In some embodiments, after the insulation material of the isolation regions 54 is deposited, an annealing process may be performed on the insulation material of the isolation regions 54.

Referring further to FIG. 4A, a planarization process, such as a chemical mechanical polishing (CMP), may remove any excess insulation material of the isolation regions 54, such that top surfaces of the isolation regions 54 and top surfaces of the semiconductor strips 52 are coplanar. In some embodiments where portions of the mask 53 remain over the semiconductor strips 52 after forming the semiconductor strips 52, the planarization process may also remove the remaining portions of the mask 53.

Figure 5A:
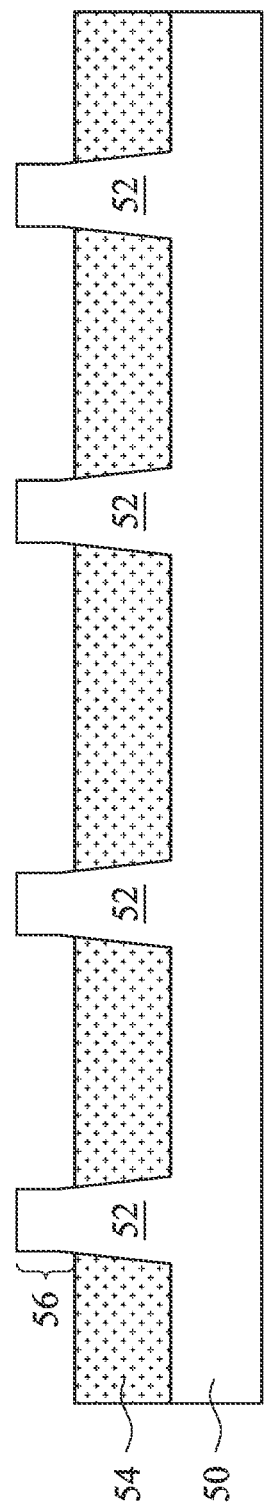

FIG. 5A illustrates the recessing of the isolation regions 54 to form Shallow Trench Isolation (STI) regions 54. The isolation regions 54 are recessed such that fins 56 protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch, an Applied Materials SICONI tool, or dilute hydrofluoric (dHF) acid may be used.

A person having ordinary skill in the art will readily understand that the process described with respect to FIGS. 2A through 5A is just one example of how the fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In yet other embodiments, heteroepitaxial structures can be used for the fins. For example, the semiconductor strips 52 in FIG. 4A can be recessed, and one or more materials different from the semiconductor strips 52 may be epitaxially grown in their place. In even further embodiments, a dielectric layer can be formed over a top surface of the substrate 50; trenches can be etched through the dielectric layer; heteroepitaxial structures can be epitaxially grown in the trenches using one or more materials different from the substrate 50; and the dielectric layer can be recessed such that the heteroepitaxial structures protrude from the dielectric layer to form fins 56.

In some embodiments where homoepitaxial or heteroepitaxial structures are epitaxially grown, the grown materials may be in situ doped during growth. In other embodiments, homoepitaxial or heteroepitaxial structures may be doped using, for example, ion implantation after homoepitaxial or heteroepitaxial structures are epitaxially grown. In various embodiments, the fins 56 may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6A:
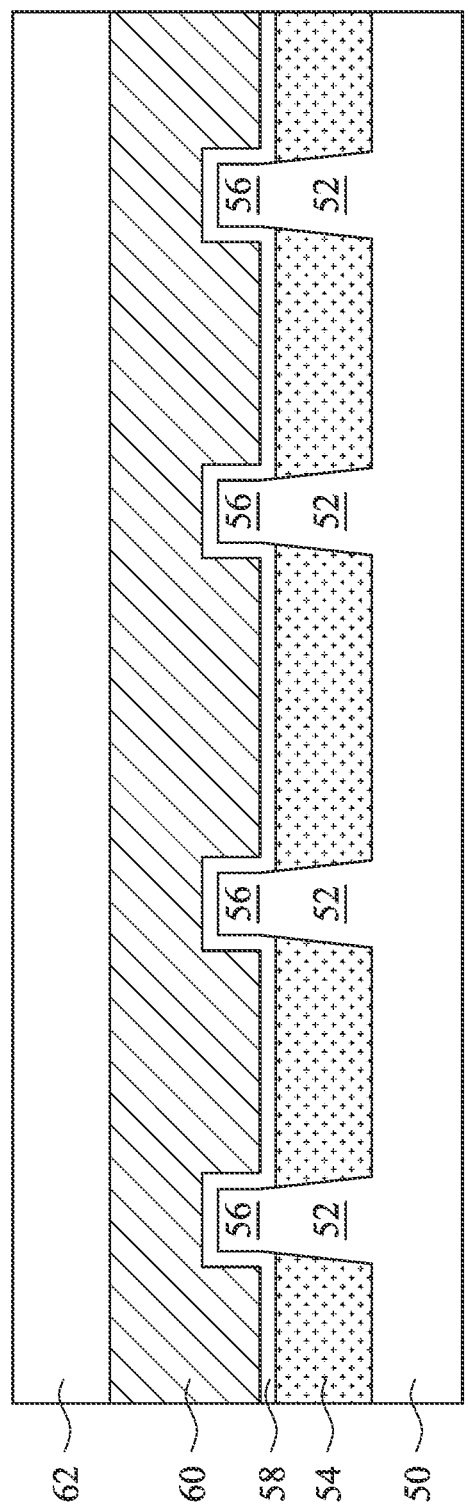
FIGS. 6A and 6B are cross-sectional views of an intermediate stage in the manufacture of a FinFET device in accordance with some embodiments.
Figure 6B:
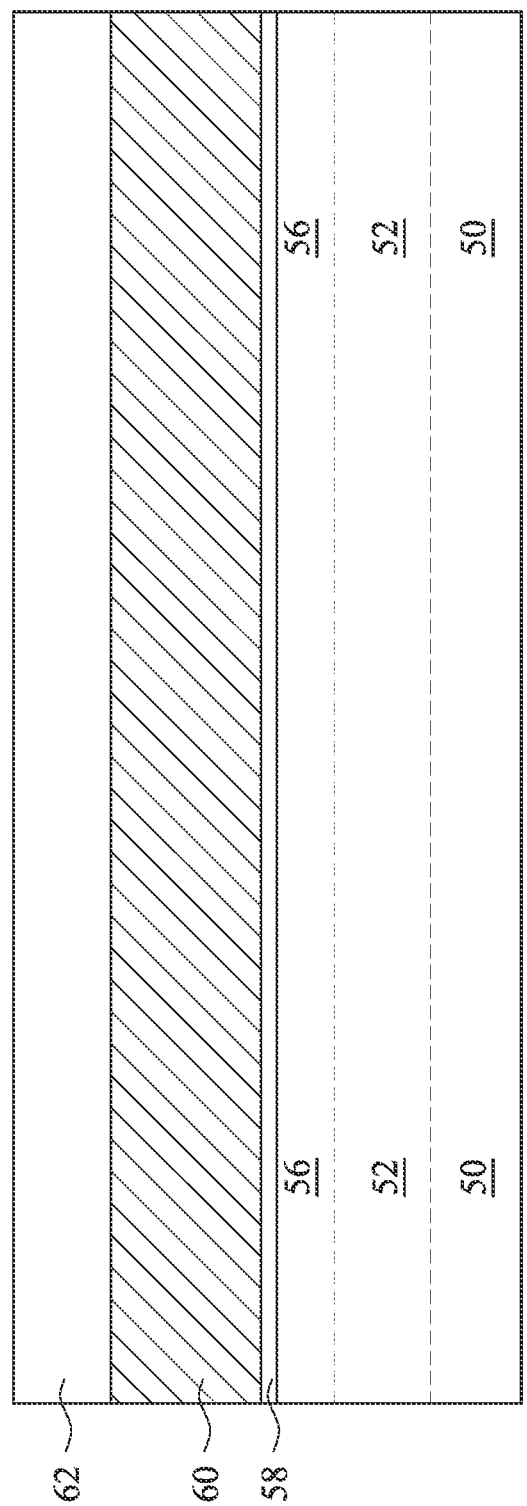

Referring to FIGS. 6A and 6B, a dielectric layer 58 is formed on sidewalls and top surfaces of the fins 56. In some embodiments, the dielectric layer 58 may be also formed over the isolation regions 54. In other embodiments, top surfaces of the isolation regions 54 may be free from the dielectric layer 58. The dielectric layer 58 may comprise an oxide, such as silicon oxide, or the like, and may be deposited (using, for example, ALD, CVD, PVD, a combination thereof, or the like) or thermally grown (for example, using thermal oxidation, or the like) according to acceptable techniques. In some embodiments, the dielectric layer 58 may comprise a dielectric material that has an acceptable breakdown voltage and leakage performance. A gate electrode layer 60 is formed over the dielectric layer 58, and a mask 62 is formed over the gate electrode layer 60. In some embodiments, the gate electrode layer 60 may be deposited over the dielectric layer 58 and then planarized using, for example, a CMP process. The mask 62 may be deposited over the gate electrode layer 60. The gate electrode layer 60 may be made of, for example, polysilicon, although other materials that have a high etching selectivity with respect to the material of the isolation regions 54 may also be used. The mask 62 may include one or more layers of, for example, silicon oxide, silicon nitride, silicon oxynitride, silicon carbide, silicon carbonitride, a combination thereof, or the like, and may be formed using any suitable process, such as thermal oxidation, thermal nitridation, ALD, PVD, CVD, a combination thereof, or the like.

Figure 7A:
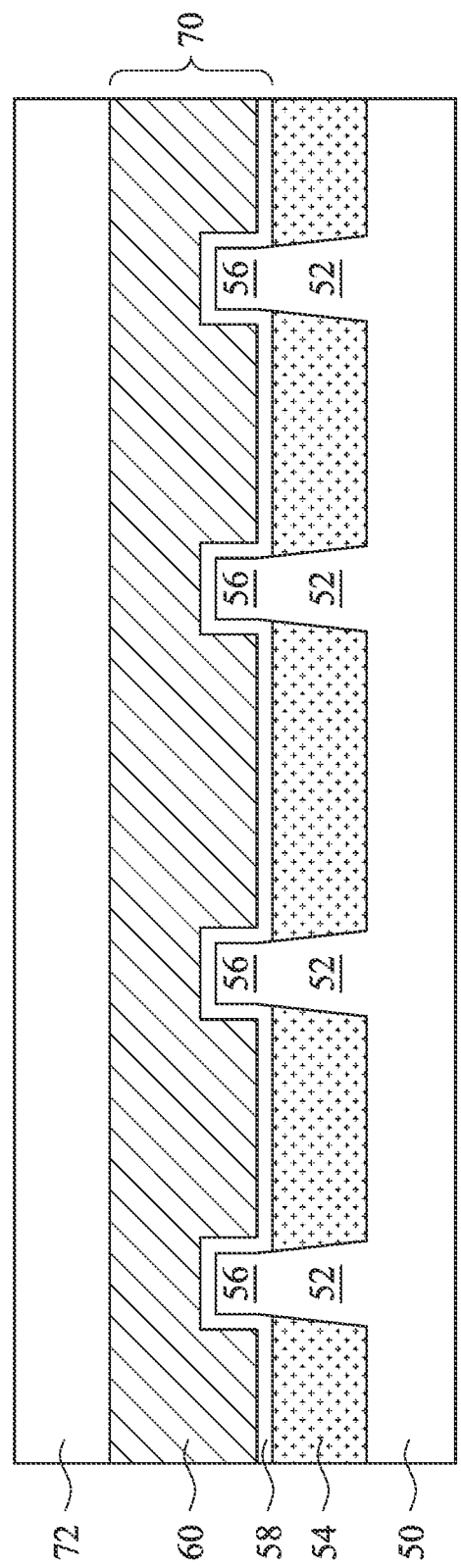
FIGS. 7A, 7B and 7C are cross-sectional views of an intermediate stage in the manufacture of a FinFET device in accordance with some embodiments.
Figure 7B:
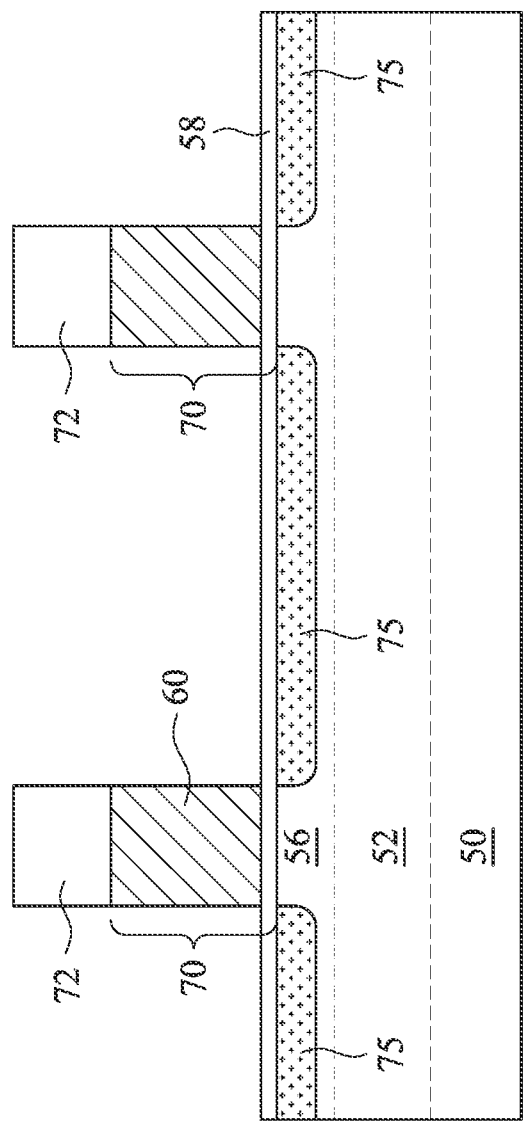
Figure 7C:
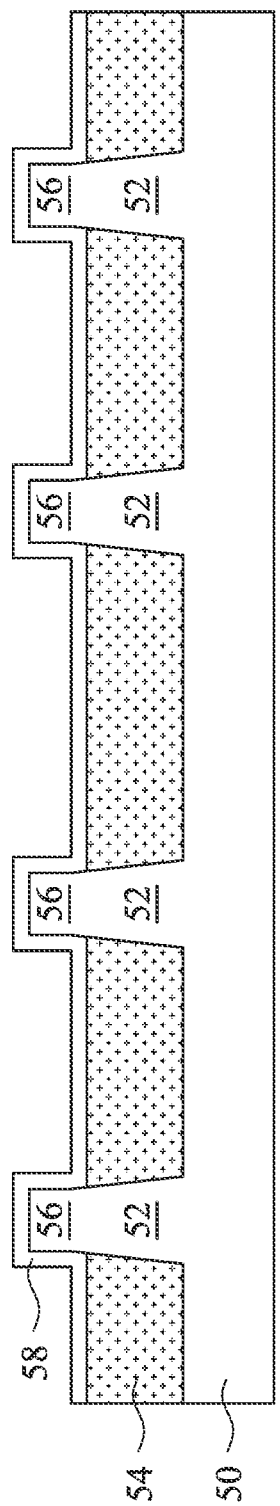

Referring to FIGS. 7A, 7B, and 7C, the mask 62 (see FIGS. 6A and 6B) may be patterned using acceptable photolithography and etching techniques to form a patterned mask 72. The pattern of the patterned mask 72 is transferred to the gate electrode layer 60 by an acceptable etching technique to form gates 70. The pattern of the gates 70 cover respective channel regions of the fins 56 (see FIG. 7B) while exposing source/drain regions of the fins 56 (see FIG. 7C). The gates 70 may also have a lengthwise direction substantially perpendicular to the lengthwise direction of respective fins 56, within process variations (see FIG. 7A). A size of the gates 70, and a pitch between the gates 70, may depend on a region of a die in which the gates 70 are formed. In some embodiments, the gates 70 may have a larger size and a larger pitch when located in, for example, an input/output region of a die (e.g., where input/output circuitry is disposed) than when located in, for example, a logic region of a die (e.g., where logic circuitry is disposed). As described below in greater detail, the gates 70 are sacrificial gates and are subsequently replaced by replacement gates. Accordingly, the gates 70 may also be referred to as sacrificial gates 70.

Referring further to FIGS. 7A, 7B, and 7C, lightly doped source/drain (LDD) regions 75 may be formed in the substrate 50. Similar to the implantation process discussed above with reference to FIG. 2A, appropriate impurities are implanted into the fins 56 to form the LDD regions 75. In some embodiments where the resulting FinFET device is a p-type device, p-type impurities are implanted into the fins 56 to form p-type LDD regions 75. In some embodiments where the resulting FinFET device is an n-type device, n-type impurities are implanted into the fins 56 to form n-type LDD regions 75. During the implantation of the LDD regions 75, the gates 70 and the patterned mask 72 may act as a mask to prevent (or at least reduce) dopants from implanting into channel regions of the fins 56. Thus, the LDD regions 75 may be formed substantially in source/drain regions of the fins 56. The n-type impurities may be any of the n-type impurities previously discussed, and the p-type impurities may be any of the p-type impurities previously discussed. The LDD regions 75 may have a concentration of impurities between about $10^{15}$ cm$^{-3}$ to about $10^{22}$ cm$^{-3}$. After the implantation process, an annealing process may be performed to activate the implanted impurities.

Figure 8A:
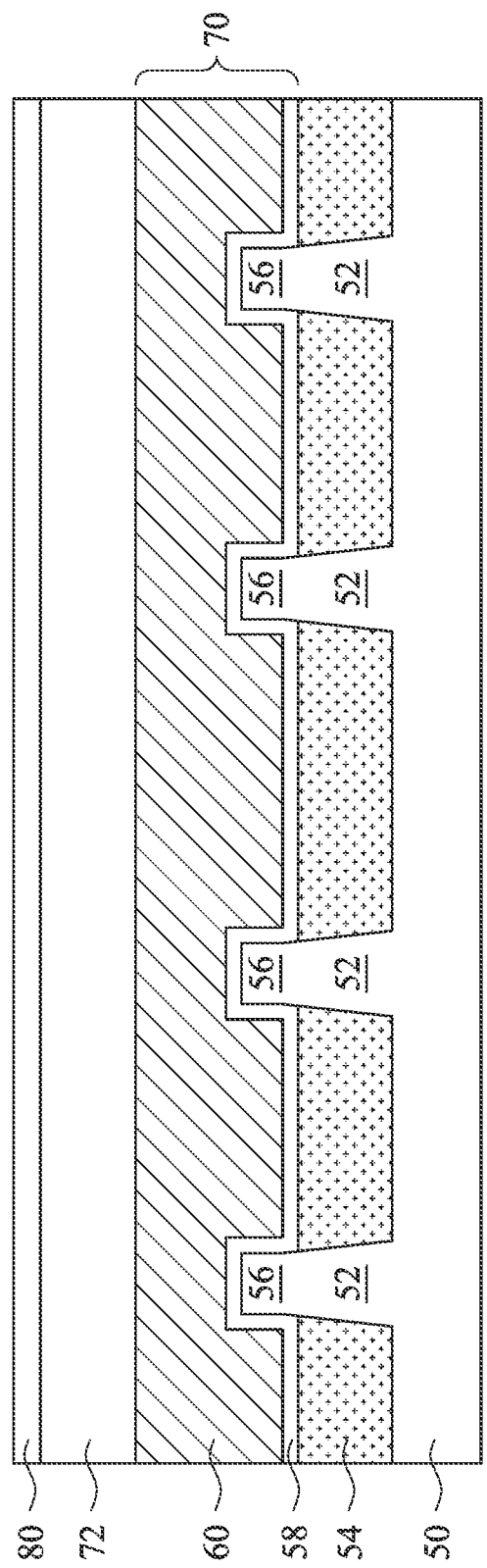
FIGS. 8A, 8B and 8C are cross-sectional views of an intermediate stage in the manufacture of a FinFET device in accordance with some embodiments.
Figure 8B:
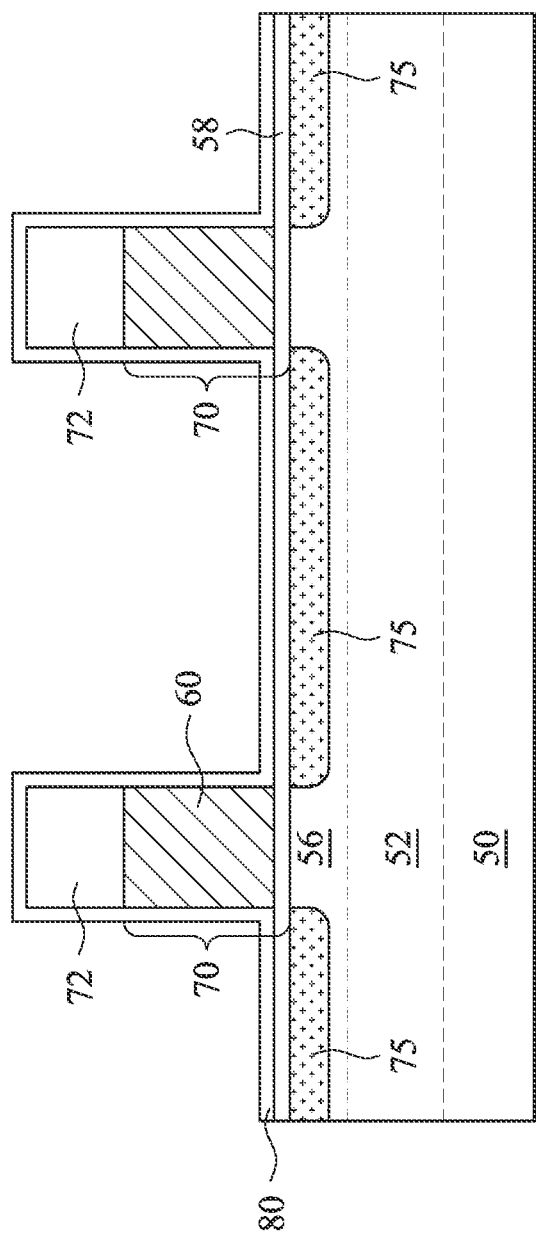
Figure 8C:
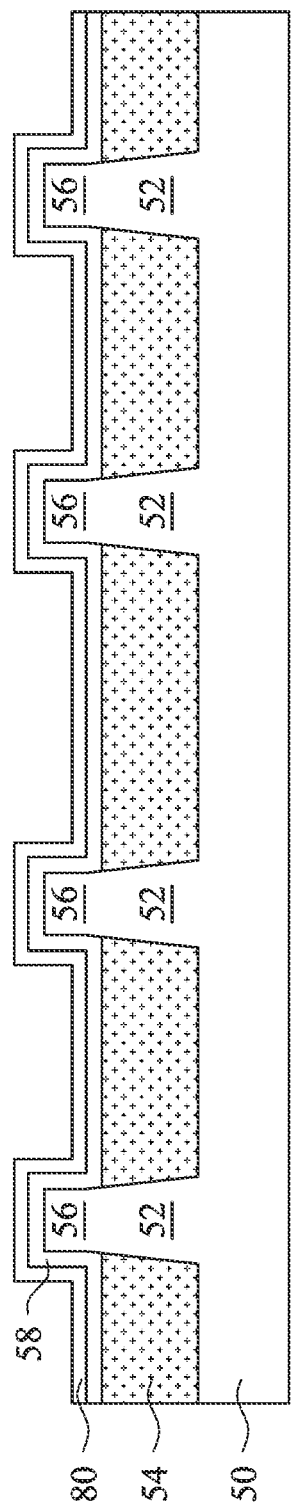

FIGS. 8A-8C and 9A-9C illustrate the formation of spacers 82 on sidewalls of the gates 70 and sidewalls of the fins 56 in accordance with some embodiments. Referring first to FIGS. 8A, 8B, and 8C, a dielectric layer 80 is blanket formed on exposed surfaces of the gates 70, the patterned mask 72, and the dielectric layer 58. In some embodiments, the dielectric layer 80 may comprise silicon nitride (SiN), silicon oxynitride (SiON), silicon oxycarbide (SiOC), silicon carbonitride (SiCN), silicon carboxynitride (SiOCN), a combination thereof, or the like, and may be formed using CVD, ALD, a combination thereof, or the like.

Figure 9A:
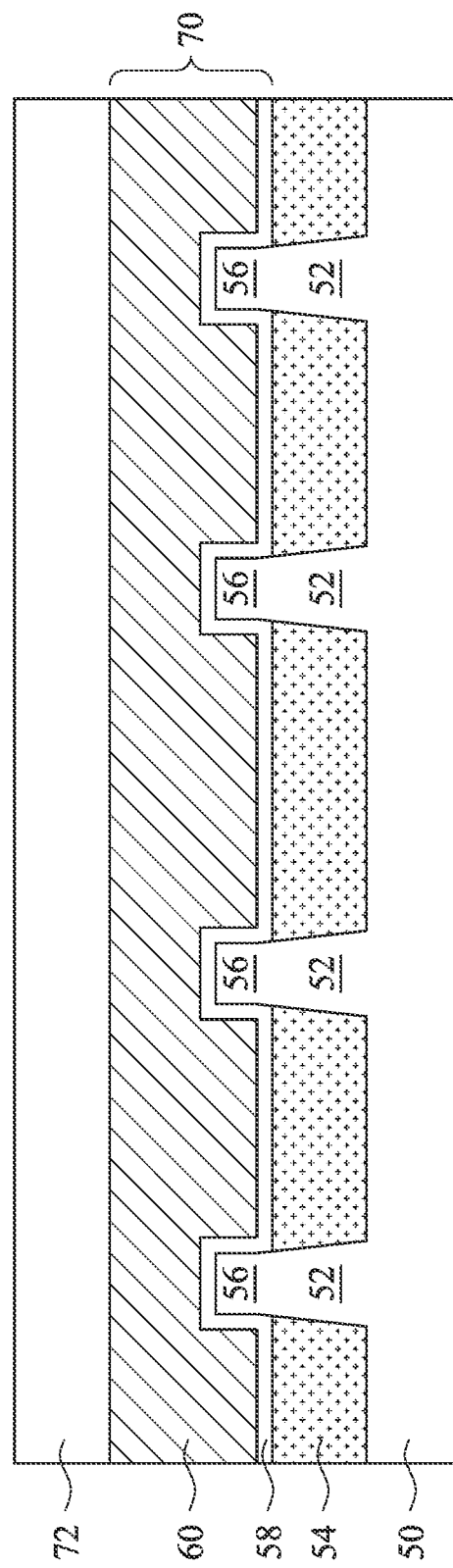
FIGS. 9A, 9B and 9C are cross-sectional views of an intermediate stage in the manufacture of a FinFET device in accordance with some embodiments.
Figure 9B:
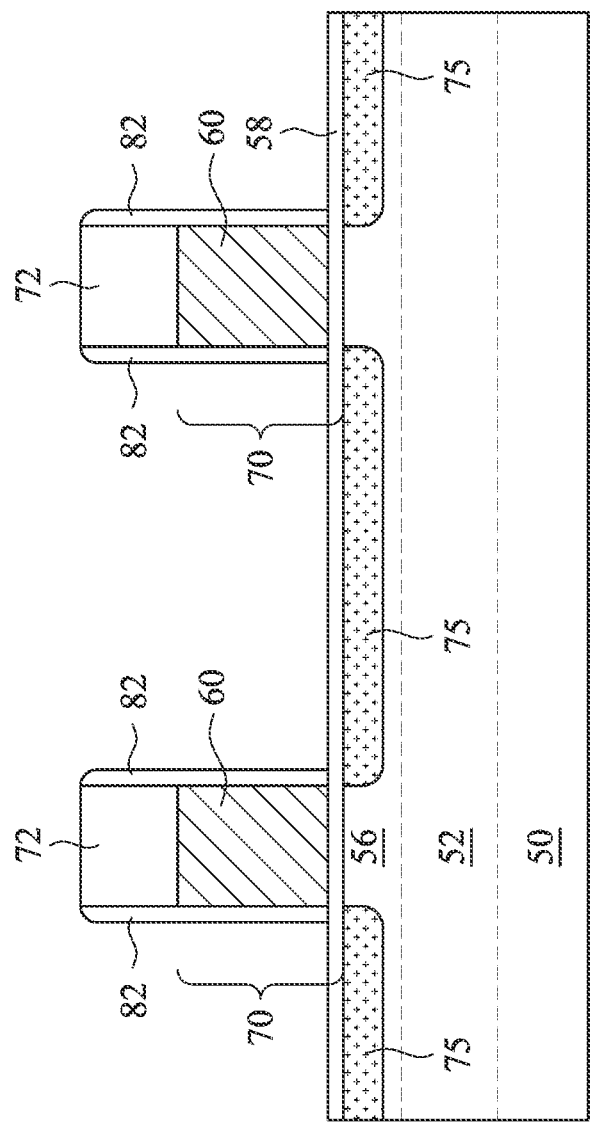
Figure 9C:
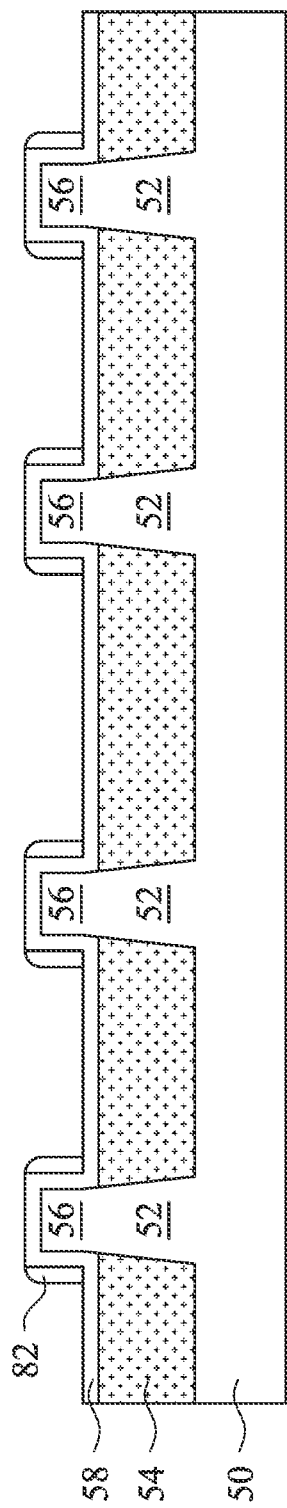

Referring next to FIGS. 9A, 9B, and 9C, horizontal portions of the dielectric layer 80 are removed, such that remaining vertical portions of the dielectric layer 80 form spacers 82 on the sidewalls of the gates 70 and the sidewalls of the fins 56. In some embodiments, the horizontal portions of the dielectric layer 80 may be removed using a suitable etching process, such as an anisotropic dry etching process.

Figure 10A:
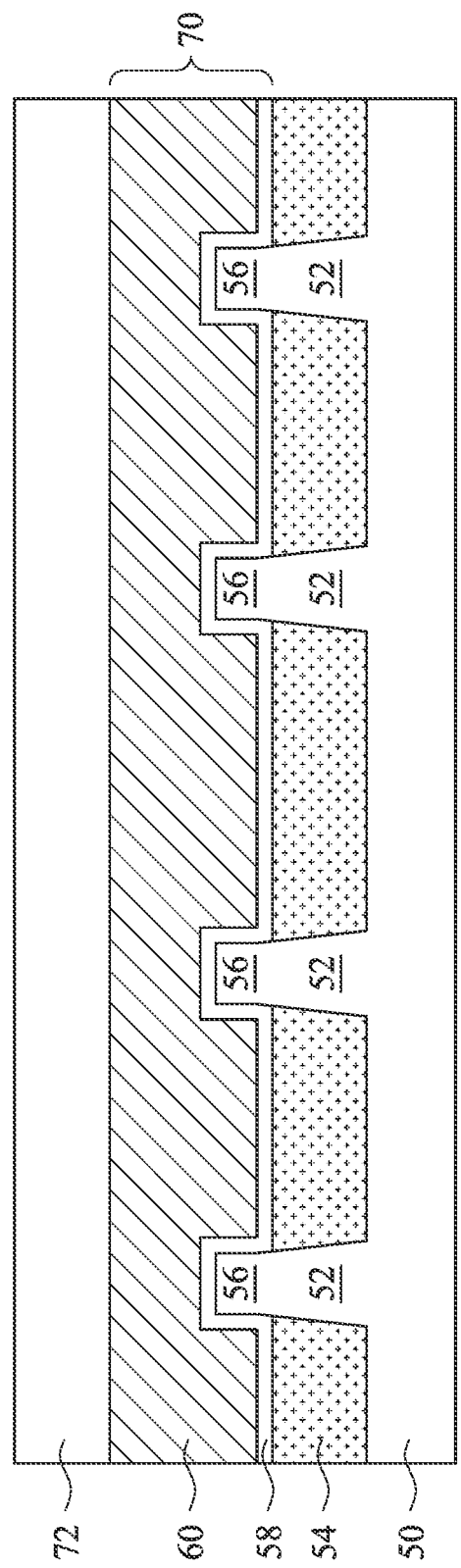
FIGS. 10A, 10B and 10C are cross-sectional views of an intermediate stage in the manufacture of a FinFET device in accordance with some embodiments.
Figure 10B:
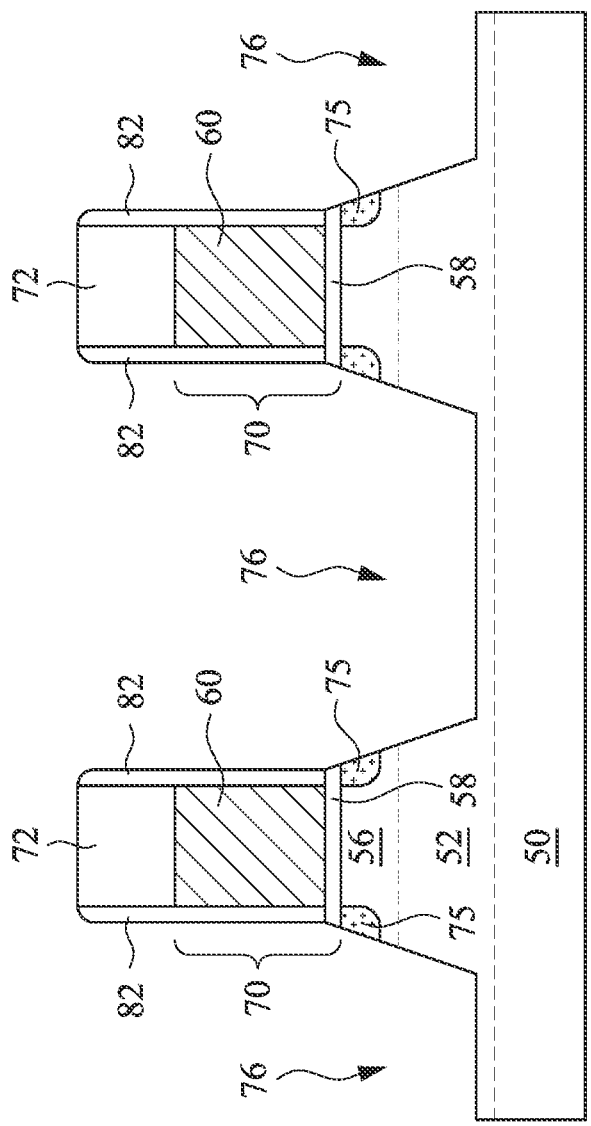
Figure 10C:
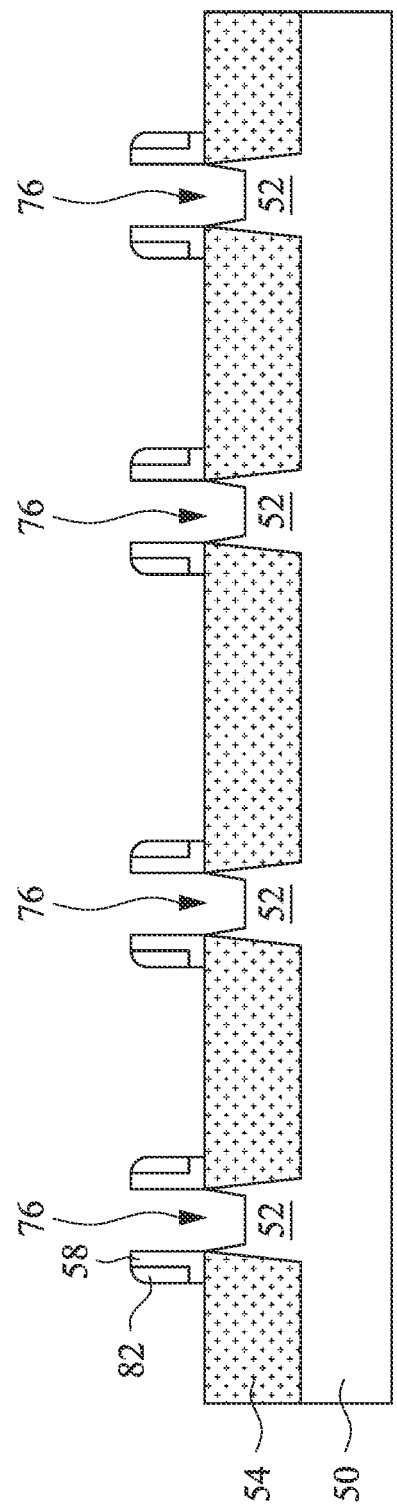

Referring to FIGS. 10A, 10B, and 10C, after forming the spacers 82, a patterning process is performed on the fins 56 to form recesses 76 in the source/drain regions of the fins 56. In some embodiments, the patterning process may include a suitable anisotropic dry etching process, while using the patterned mask 72, the gates 70, the spacers 82, and/or isolation regions 54 as a combined mask. The suitable anisotropic dry etching process may include a reactive ion etch (RIE), a neutral beam etch (NBE), a combination thereof, or the like. In some embodiments, portions of the dielectric layer 58 may be removed over the isolation regions 54 during the patterning process.

Figure 11A:
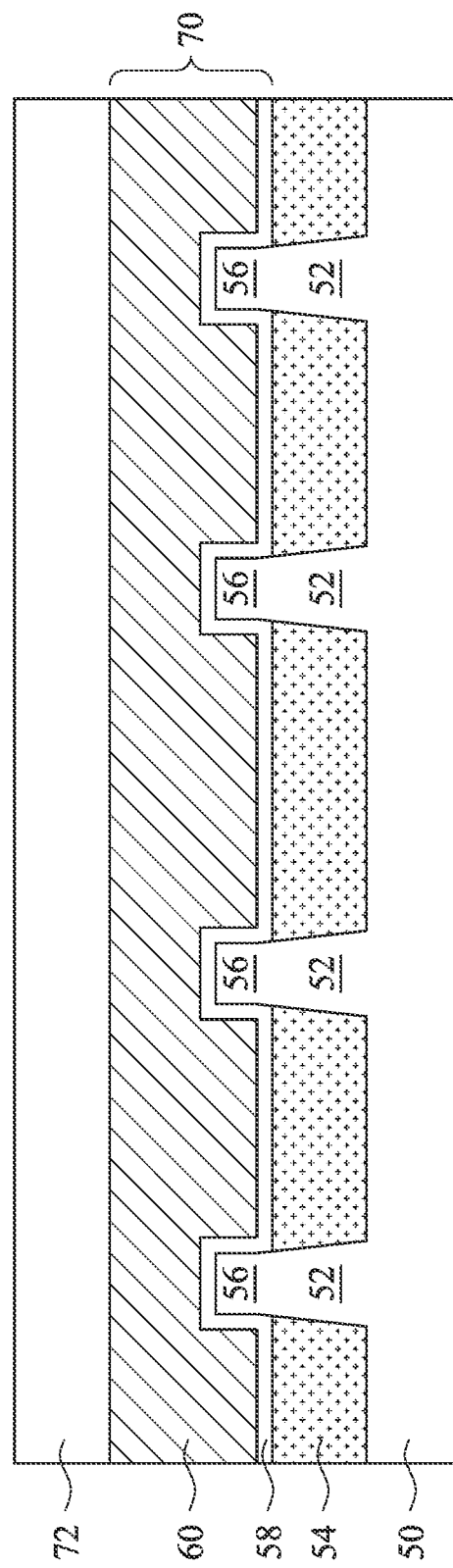
FIGS. 11A, 11B and 11C are cross-sectional views of an intermediate stage in the manufacture of a FinFET device in accordance with some embodiments.
Figure 11B:
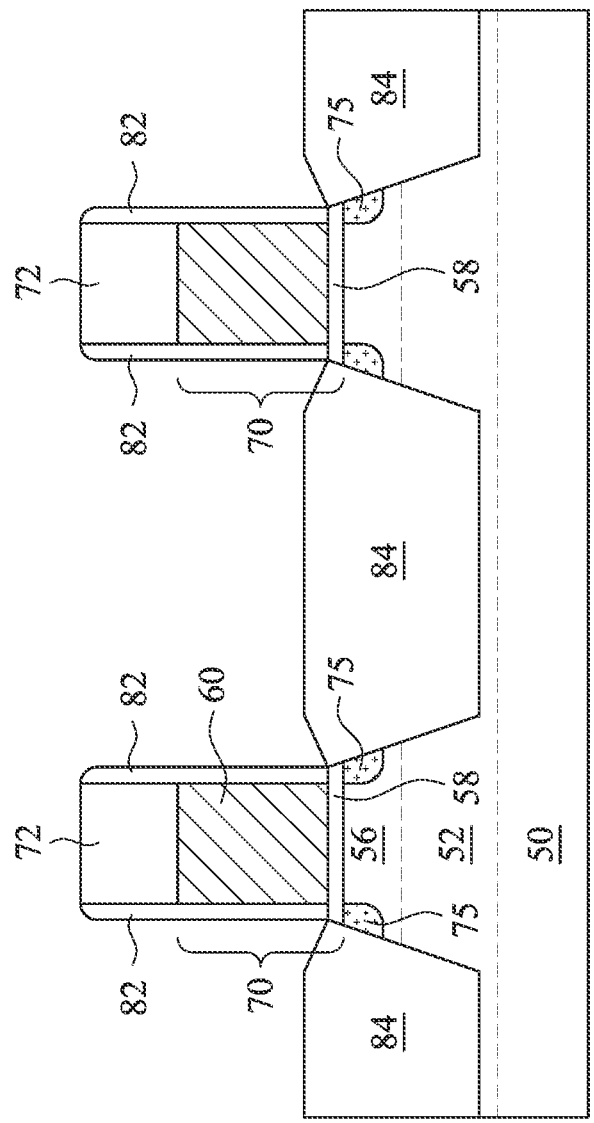
Figure 11C:
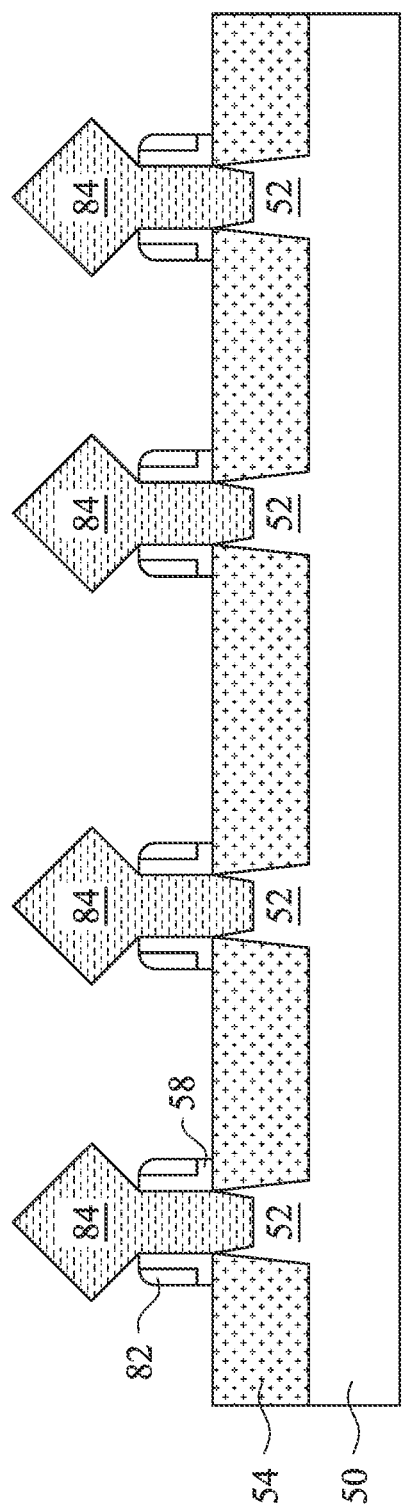

Referring to FIGS. 11A, 11B, and 11C, epitaxial source/drain regions 84 are formed in the recesses 76 (see FIGS. 10A, 10B, and 10C). In some embodiments, the epitaxial source/drain regions 84 are epitaxially grown in the recesses 76 using metal-organic CVD (MOCVD), molecular beam epitaxy (MBE), liquid phase epitaxy (LPE), vapor phase epitaxy (VPE), selective epitaxial growth (SEG), a combination thereof, or the like. In some embodiments, the epitaxial source/drain regions 84 may have a thickness between about 2 nm and about 30 nm.

In some embodiments where the resulting FinFET device is an n-type device and the fins 56 are formed of silicon, the epitaxial source/drain regions 84 may include silicon, SiC, SiCP, SiP, or the like. In some embodiments where the resulting FinFET device is an n-type device and the fins 56 are formed of a III-V semiconductor material, the epitaxial source/drain regions 84 may include InP, GaAs, AlAs, InAs, InAlAs, InGaAs, or the like. In some embodiments where the resulting FinFET device is a p-type device and the fins 56 are formed of silicon, the epitaxial source/drain regions 84 may include SiGe, SiGeB, Ge, GeSn, or the like. In some embodiments where the resulting FinFET device is a p-type device and the fins 56 are formed of a III-V semiconductor material, the epitaxial source/drain regions 84 may include InSb, GaSb, InGaSb, or the like. The epitaxial source/drain regions 84 may have surfaces raised from respective surfaces of the fins 56 and may have facets. In some embodiments, the epitaxial source/drain regions 84 may extend past the fins 56 and into the semiconductor strips 52. In some embodiments, the material of the epitaxial source/drain regions 84 may be implanted with suitable dopants. In some embodiments, the implantation process is similar to the process used for forming the LLD regions 75 as described above with reference to FIGS. 7A, 7B, and 7C, and the description is not repeated herein for the sake of brevity. In other embodiments, the material of the epitaxial source/drain regions 84 may be in situ doped during growth.

Figure 12C:
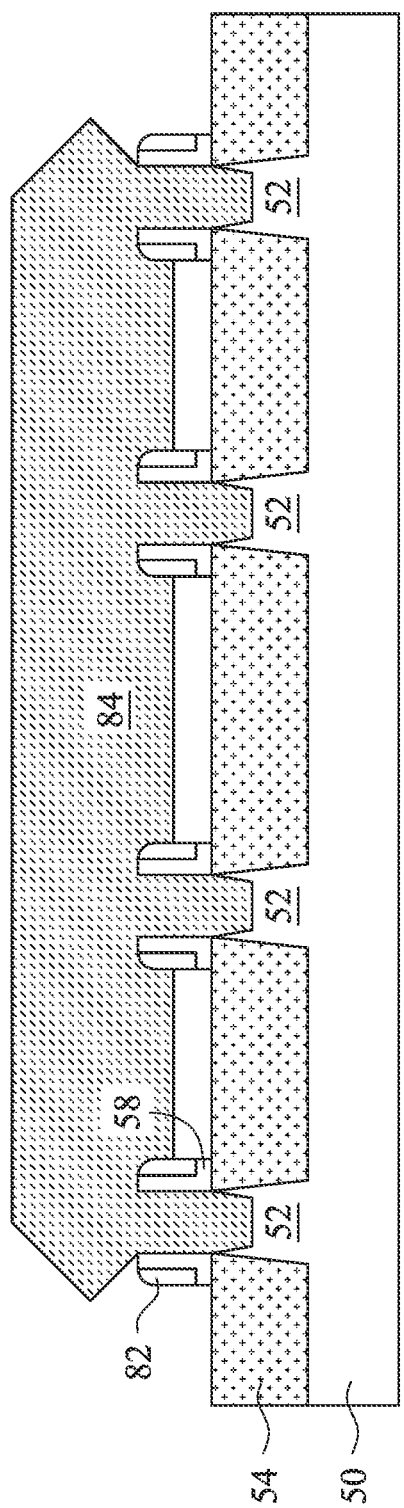
FIG. 12C is a cross-sectional view of an intermediate stage in the manufacture of a FinFET device in accordance with some embodiments.

Referring further to FIGS. 11A, 11B, and 11C, in the illustrated embodiment, each of the epitaxial source/drain regions 84 are physically separated from other epitaxial source/drain regions 84. In other embodiments, adjacent epitaxial source/drain regions 84 may be merged. Such an embodiment is depicted in FIG. 12C, where adjacent epitaxial source/drain regions 84 are merged to form a common epitaxial source/drain region 84.

Figure 13A:
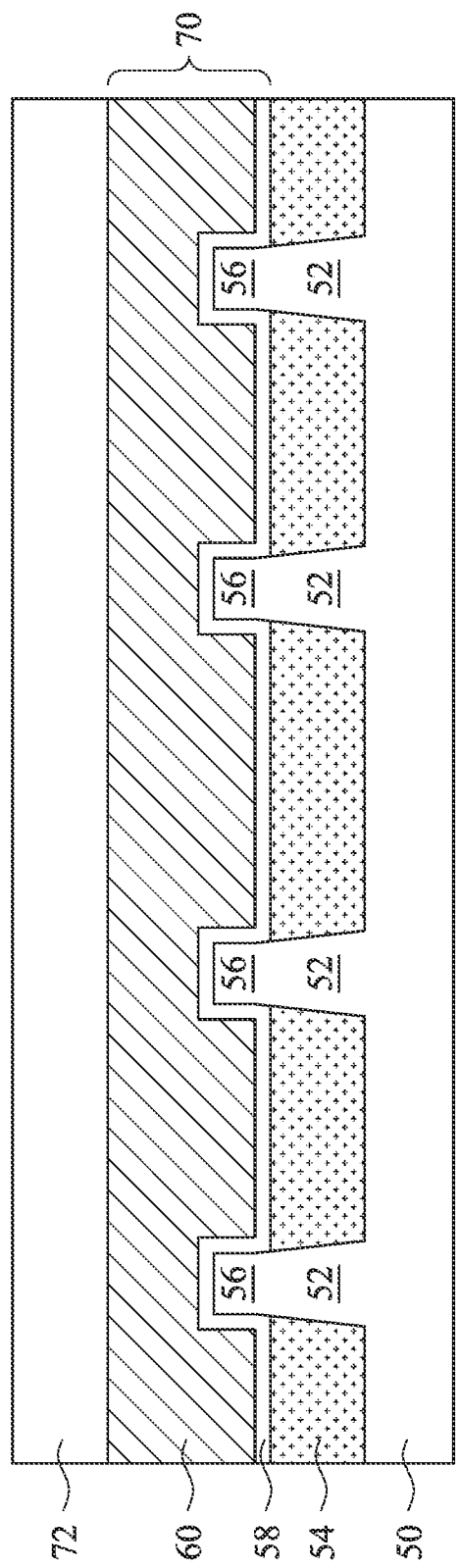
FIGS. 13A and 13B are cross-sectional views of an intermediate stage in the manufacture of a FinFET device in accordance with some embodiments.
Figure 13B:
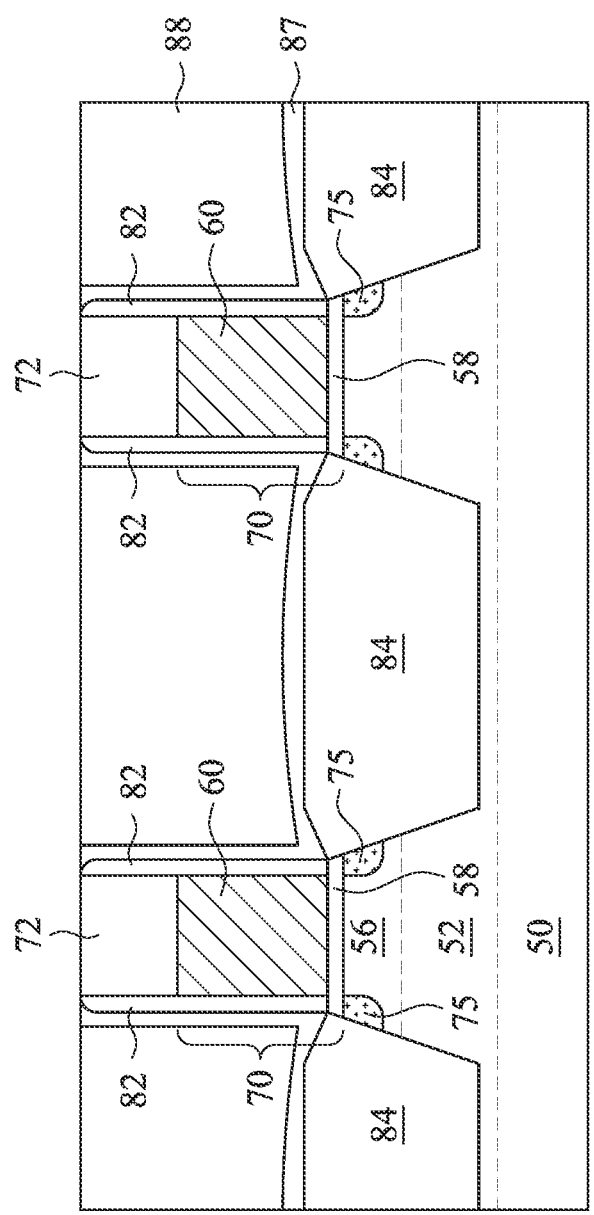

Referring to FIGS. 13A and 13B, an etch stop layer (ESL) 87 and an interlayer dielectric (ILD) 88 are deposited over the gates 70, and over the epitaxial source/drain regions 84. In some embodiments, the ILD 88 is a flowable film formed by a flowable CVD. In some embodiments, the ILD 88 is formed of a dielectric material such as silicon oxide, SiOC, ZrO$_2$, HfO$_2$, Phospho-Silicate Glass (PSG), Boro-Silicate Glass (BSG), Boron-Doped Phospho-Silicate Glass (BPSG), undoped Silicate Glass (USG), low-k dielectric materials, extremely low-k dielectric materials, high-k dielectric materials, a combination thereof, or the like, and may be deposited by any suitable method, such as CVD, PECVD, a spin-on-glass process, a combination thereof, or the like. In some embodiments, the ESL 87 is used as a stop layer while patterning the ILD 88 to form openings for subsequently formed contact plugs. Accordingly, a material for the ESL 87 may be chosen such that the material of the ESL 87 has a lower etch rate than the material of the ILD 88. In some embodiments, the ESL 87 may comprise silicon nitride (SiN), silicon oxynitride (SiON), silicon oxycarbide (SiOC), silicon carbonitride (SiCN), silicon carboxynitride (SiOCN), a combination thereof, or the like, and may formed using CVD, ALD, a combination thereof, or the like. In some embodiments, a planarization process, such as a CMP process, may be performed to level the top surface of ILD 88 with the top surfaces of the patterned mask 72.

Figure 14A:
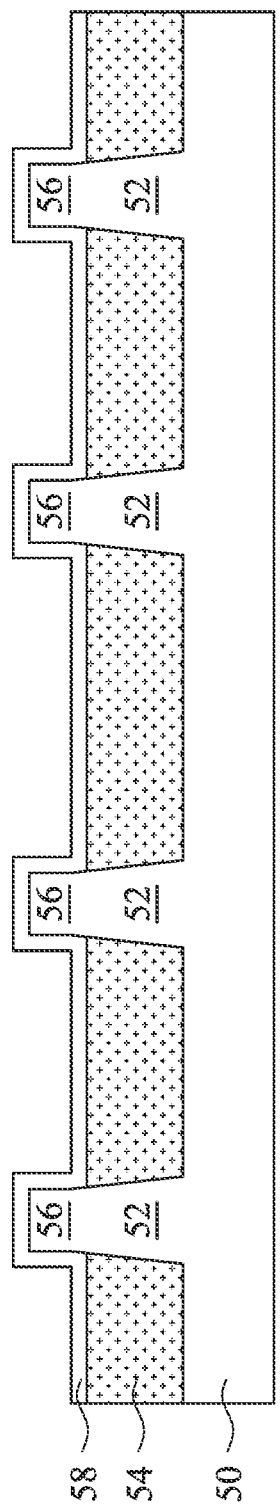
FIGS. 14A and 14B are cross-sectional views of an intermediate stage in the manufacture of a FinFET device in accordance with some embodiments.
Figure 14B:
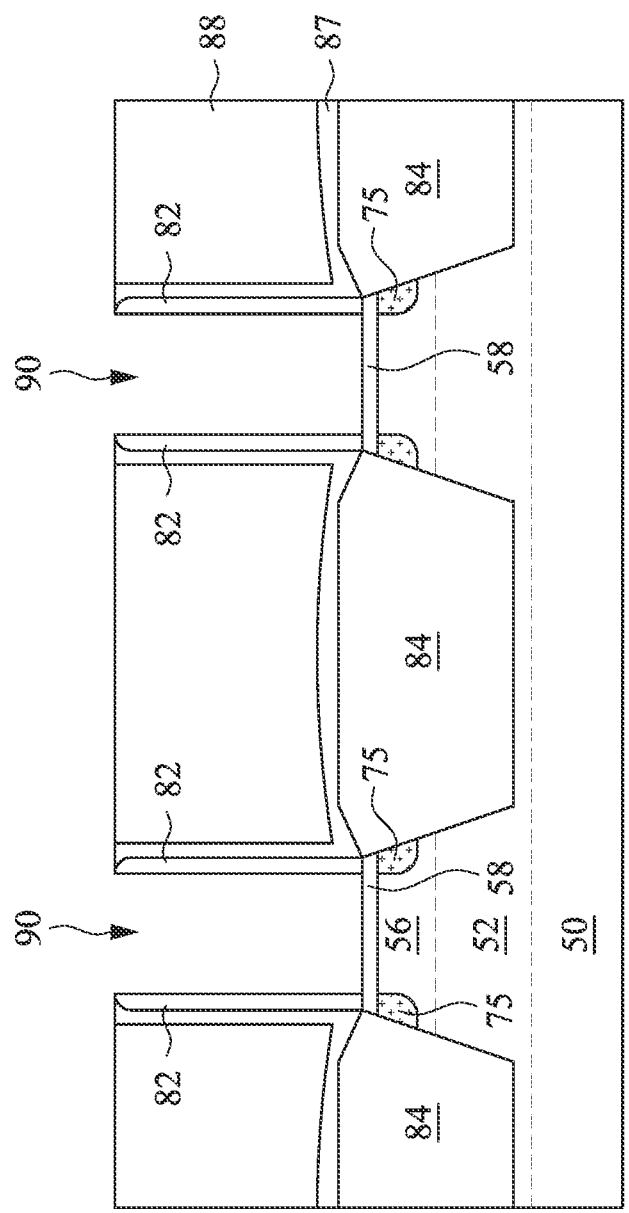

Referring to FIGS. 14A and 14B, the gates 70 (see FIGS. 13A and 13B) are removed to form recesses 90. In some embodiments, the gates 70 may be removed using one or more suitable etching processes. Each of the recesses 90 exposes a channel region of a respective fin 56. In some embodiments, the dielectric layer 58 may be used as an etch stop layer when the gates 70 are etched. In some embodiments, after removing the gate electrode layers 60 of the gates 70, exposed portions of the dielectric layer 58 may be also removed. In some embodiments, the exposed portions of the dielectric layer 58 may remain in the recesses 90.

Figure 15A:
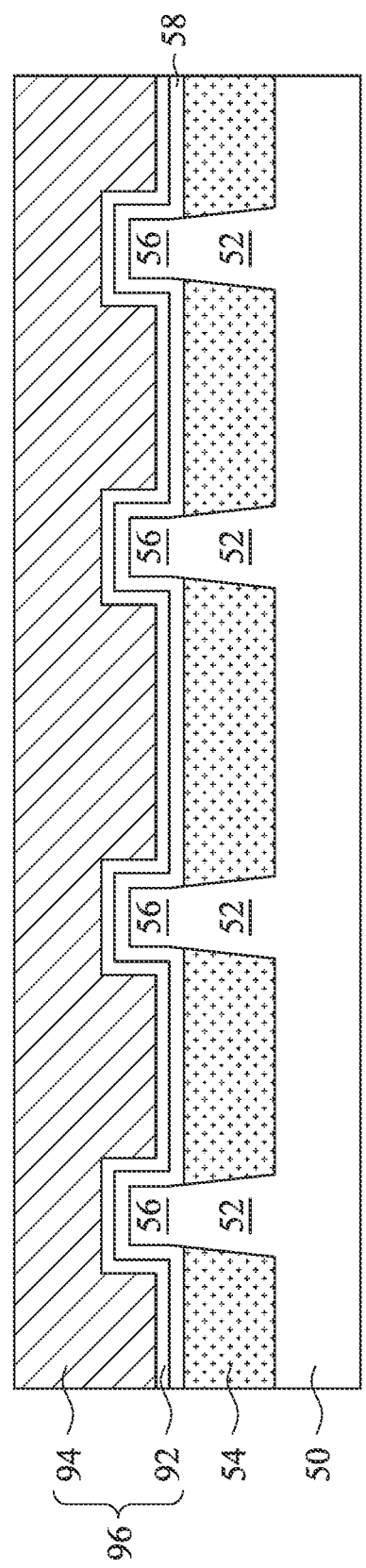
FIGS. 15A and 15B are cross-sectional views of an intermediate stage in the manufacture of a FinFET device in accordance with some embodiments.
Figure 15B:
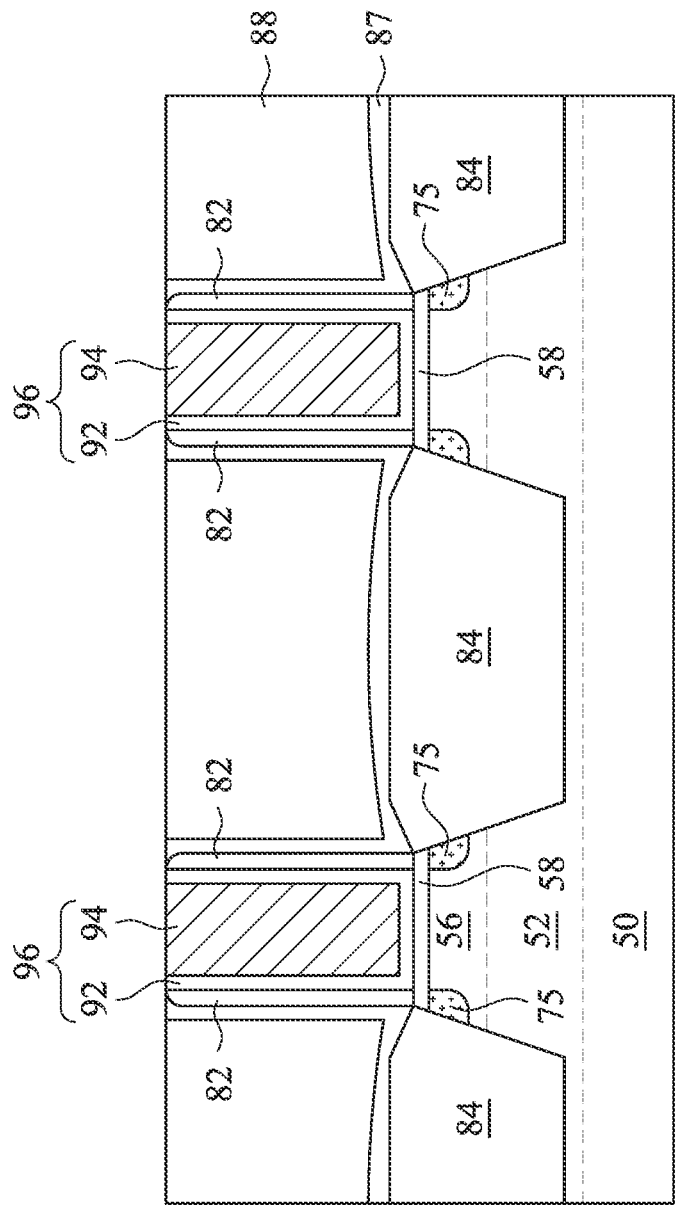

Referring to FIGS. 15A and 15B, a gate dielectric layer 92 and a gate electrode layer 94 are formed in the recesses 90 (see FIGS. 14A and 14B). In some embodiments, the gate dielectric layer 92 is conformally deposited in the recesses 90. In some embodiments, the gate dielectric layer 92 comprises silicon oxide, silicon nitride, or multilayers thereof. In other embodiments, the gate dielectric layer 92 includes a high-k dielectric material, and in these embodiments, the gate dielectric layer 92 may have a k value greater than about 7.0, and may include a metal oxide or a silicate of Hf, Al, Zr, La, Mg, Ba, Ti, Pb, and combinations thereof. The formation methods of the gate dielectric layer 92 may include Molecular-Beam Deposition (MBD), ALD, PECVD, a combination thereof, or the like. In some embodiments, the gate dielectric layer 92 may have a thickness between about 0.3 nm and about 5 nm.

Referring further to 15A and 15B, in some embodiments where the portions of the dielectric layer 58 are not removed over the channel regions of the fins 56 while forming the recesses 90, the portions of the dielectric layer 58 over the channel regions of the fins 56 may act as interfacial layers between the gate dielectric layer 92 and the channel regions of the fins 56. In some embodiments where the portions of the dielectric layer 58 are removed over the channel regions of the fins 56 while forming the recesses 90, one or more interfacial layers may be formed over the channel regions of the fins 56 prior to forming the gate dielectric layer 92, and the gate dielectric layer 92 is formed over the one or more interfacial layers. The interfacial layers help to buffer the subsequently formed high-k dielectric layer from the underlying semiconductor material. In some embodiments, the interfacial layers comprise a chemical silicon oxide, which may be formed of chemical reactions. For example, a chemical oxide may be formed using deionized water+ozone ($O_3$), $NH_4OH+H_2O_2+H_2O$ (APM), or other methods. Other embodiments may utilize a different material or processes (e.g., a thermal oxidation or a deposition process) for forming the interfacial layers.

Next, the gate electrode layer 94 is deposited over the gate dielectric layer 92 and fills the remaining portions of the recesses 90 (see FIGS. 14A and 14B). In some embodiments, the gate electrode layer 94 may comprise one or more layers of suitable conductive materials. The gate electrode layer 94 may comprise a metal selected from a group of W, Cu, Ti, Ag, Al, TiAl, TiAlN, TaC, TaCN, TaSiN, Mn, Co, Pd, Ni, Re, Ir, Ru, Pt, Zr, and combinations thereof. In some embodiments, the gate electrode layer 94 may comprise a material selected from a group of TiN, WN, TaN, Ru, and combinations thereof. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used. The gate electrode layer 94 may be formed using a suitable process such as ALD, CVD, PVD, plating, combinations thereof, or the like. After filling the recesses 90 with the gate electrode layer 94, a planarization process, such as a CMP process, may be performed to remove the excess portions of the gate dielectric layer 92 and the gate electrode layer 94, which excess portions are over the top surface of the ILD 88. The resulting remaining portions of materials of the gate electrode layer 94 and the gate dielectric layer 92 thus form replacement gates 96 of the resulting FinFET device. In other embodiments, the gates 70 may remain rather than being replaced by the replacement gates 96. In some embodiments, after the planarization process, the gate electrode layer 94 may have a thickness between about 5 nm and about 50 nm.

Figure 16B:
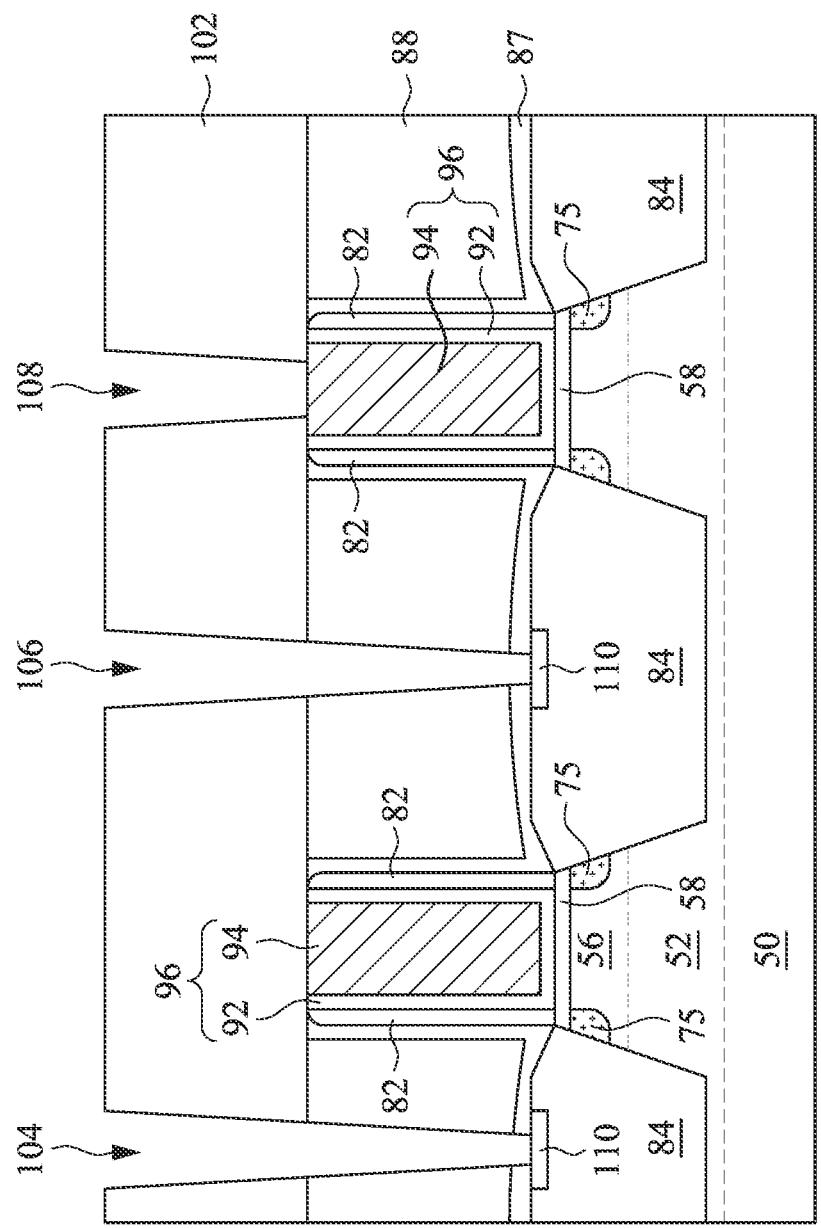

Referring to FIG. 16B, an ILD 102 is deposited over the ILD 88. In some embodiments, the ILD 102 may be formed using similar materials and methods as the ILD 88 described above with reference to FIGS. 15A and 15B, and the description is not repeated herein. In some embodiments, the ILD 102 and the ILD 88 are formed of a same material. In other embodiments, the ILD 102 and the ILD 88 are formed of different materials. The ESL 87 and the ILDs 88 and 102 are patterned to form openings 104, 106 and 108. In some embodiments, the ESL 87 and the ILDs 88 and 102 may be patterned using one or more suitable etching processes, such as anisotropic dry etching process, or the like. The openings 104 and 106 expose portions of the respective epitaxial source/drain regions 84. The opening 108 exposes the respective replacement gate 96. As described below in greater detail, the openings are filled with one or more conductive materials to form contact plugs that provide electrical connections to the epitaxial source/drain regions 84 and the replacement gates 96. In some embodiments, the ILD 102 has a thickness between about 10 nm and about 100 nm. In some embodiments, the opening 104 has a width between about 5 nm and about 50 nm. In some embodiments, the opening 106 has a width between about 5 nm and about 50 nm. In some embodiments, the opening 108 has a width between about 5 nm and about 50 nm.

Referring further to FIG. 16B, self-aligned silicide (salicide) layers 110 are formed through the openings 104 and 106. In some embodiments, a metallic material is deposited in the openings 104 and 106. The metallic material may comprise Ti, Co, Ni, NiCo, Pt, NiPt, Ir, PtIr, Er, Yb, Pd, Rh, Nb, a combination thereof, or the like and may be formed using PVD, sputtering, or the like. Subsequently, an annealing process is performed to form the salicide layers 110. In some embodiments where the epitaxial source/drain regions 84 comprise silicon, the annealing process causes the metallic material to react with silicon to form a silicide of the metallic material. In some embodiments, after forming the salicide layers 110, a nitridation process may be performed on the salicide layers 110 to alter nitrogen content in the salicide layers 110. In some embodiments, the salicide layers 110 have a thickness between about 2 nm and about 10 nm.

Figure 17B:
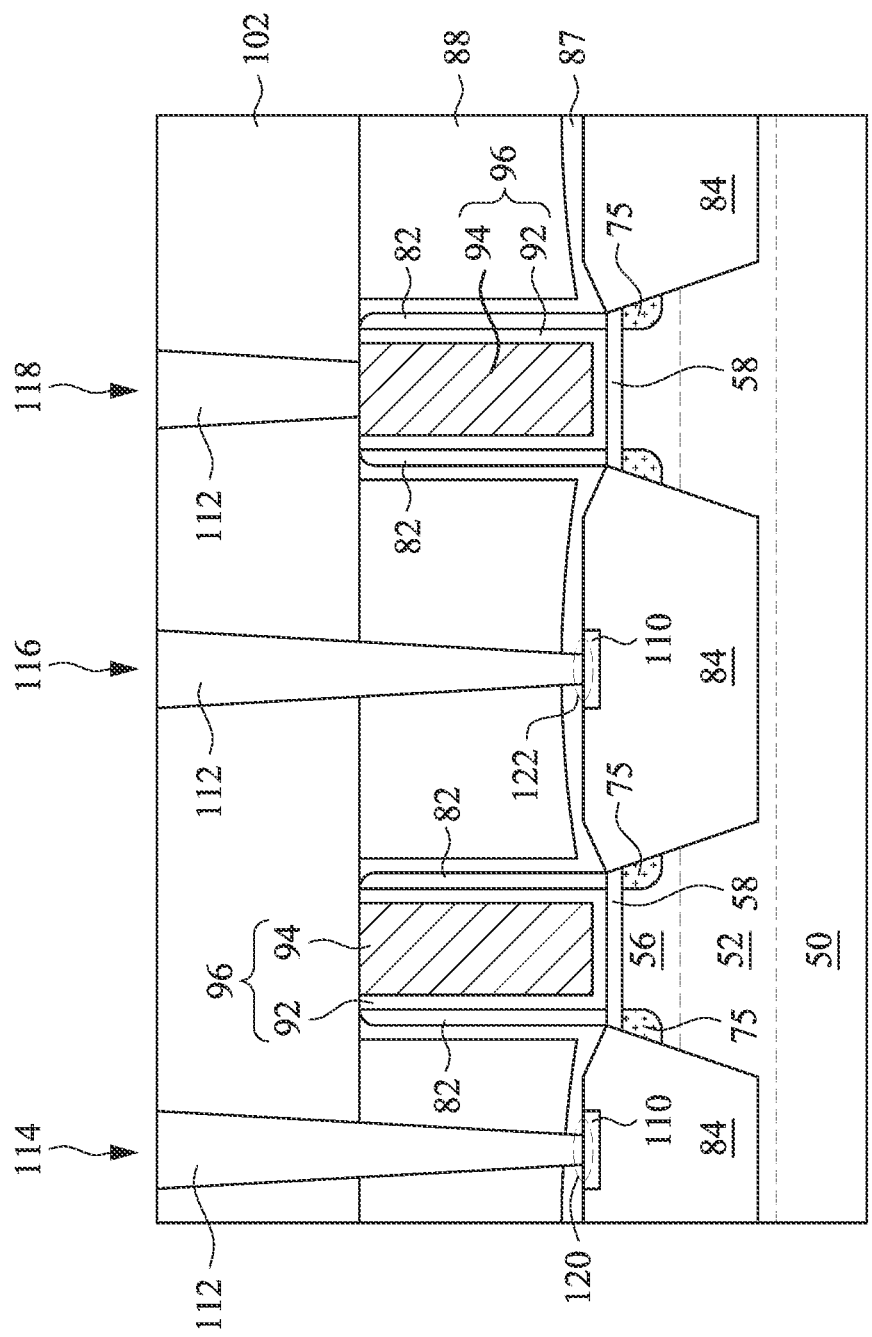

Referring to FIG. 17B, the openings 104, 106 and 108 (see FIG. 16B) are filled with a conductive material 112 to form contact plugs 114, 116, and 118 in the openings 104, 106 and 108, respectively. In some embodiment, before filling the openings 104, 106 and 108 with the conductive material 112, a cleaning process may be performed. In some embodiments, the cleaning process may be a plasma cleaning process using a process gas comprising $H_2$, $BCl_3$, $NF_3$, HF, HCl, $SiCl_4$, $Cl_2$, $SF_6$, $CF_4$, $CH_xF_y$, He, Ar, a mixture thereof, or the like. In some embodiments, the conductive material 112 may comprise Ru, Ir, Ni, Os, Rh, Al, Mo, W, Co, a combination thereof, or the like, and may be formed using CVD, PVD, ALD, an electrochemical plating process, an electroless plating process, a combination thereof, or the like. In some embodiments, the conductive material 112 may comprise a metallic material having a low electron mean free path. In some embodiments, the metallic material may have an electron mean free path less than the electron mean free path of copper (Cu). In some embodiments, parameters of the deposition process for the conductive material 112 is tuned, such that the conductive material 112 is deposited in the openings 104, 106 and 108 in a non-conformal bottom-up manner. In some embodiments, the parameters of the deposition process are tuned, such that a deposition rate of the conductive material 112 on materials of the ESL 87 and the ILDs 88 and 102 is reduced or suppressed compared to a deposition rate of the conductive material 112 on a material of the salicide layers 110. In the manner, the conductive material 112 is selectively formed on the salicide layers 110 and fills the openings 104, 106 and 108 bottom-up, which allows for reducing or avoiding the formation of voids in the conductive material 112. By reducing or avoiding the formation of the voids in the conductive material 112, the resistance of the contact plugs 114, 116 and 118 is reduced. In some embodiments, the bottom-up deposition process may be enhanced by capillary condensation.

In some embodiments where the conductive material 112 comprises Ru, the conductive material 112 may be deposited using CVD, PECVD, ALD, or the like. In some embodiments, the deposition process may be performed using a precursor gas, such as $Ru(CO)_5$, $Ru_3(CO)_{12}$, $RuCl_3$, $Ru(od)_3$, Bis(cyclopentadienyl)ruthenium(II), $Ru(CO)_3C_6H_8$, $Ru(CO)_2(tmhd)_2$, $Ru(EtCp)_2$, $Ru(CO)_2(acac)_2$, $Ru(C_6H_6)(C_6H_8)$, $Ru(DMBD)(CO)_3$, amidamate-based or hexadiene-based Ru precursors, a combination thereof, or the like. In some embodiments, the precursor gas may have a flow rate between about 10 sccm and about 100 sccm. In some embodiments, in addition to the precursor gas, a carrier gas and additional process gases may be used during the deposition. The carrier gas may comprise $N_2$, Ar, CO, $O_2$, a mixture thereof, or the like. The carrier gas may have a flow rate between about 50 sccm and about 500 sccm. The additional process gas may comprise $H_2$, $O_2$, $NH_3$, a mixture thereof, or the like. The additional process gas may have a flow rate between about 100 sccm and about 1000 sccm. In some embodiment, the deposition process may be performed at a temperature between about 75° C. and about 300° C., such as between about 75° C. and about 150° C. In some embodiments, by performing the deposition process in the low-temperature regime (for example, between about 75° C. and about 150° C.), selectivity of the deposition process is further improved. In some embodiment, the deposition process may be performed at pressure between about 0.1 mTorr and about 10 mTorr.

In some embodiments where the conductive material 112 comprises W, the conductive material 112 may be deposited by CVD, PECVD, ALD, or the like using a precursor gas, such as $W(CO)_6$, $W(F)_6$, or the like. In some embodiments where the conductive material 112 comprises Os, the conductive material 112 may be deposited by CVD, PECVD, ALD, or the like using a precursor gas, such as $Os_3(CO)_{12}$, or the like. In some embodiments where the conductive material 112 comprises Co, the conductive material 112 may be deposited by CVD, PECVD, ALD, or the like using a precursor gas, such as $Co_4(CO)_{12}$, $Co_2(CO)_8$, or the like. In some embodiments where the conductive material 112 comprises Rh, the conductive material 112 may be deposited by CVD, PECVD, ALD, or the like using a precursor gas, such as $Rh_6(CO)_{16}$, or the like. In some embodiments where the conductive material 112 comprises Mo, the conductive material 112 may be deposited by CVD, PECVD, ALD, or the like using a precursor gas, such as $MoF_6$, $Mo(CO)_6$, $MoCl_5$, $MoO_xCl_y$, or the like.

Referring further to FIG. 17B, after filling the openings 104, 106 and 108 with the conductive material 112, a polishing process, such as a CMP process, may be performed to remove excess portions of the conductive material 112. After completing the polishing process, top surfaces of the contact plugs 114, 116 and 118 are coplanar or level with a top surface of the ILD 102. In the embodiment illustrated in FIG. 17B, the contact plugs 114, 116 and 118 are formed without forming barrier layers in the openings 104, 106 and 108 (see FIG. 16B) prior to filling the openings 104, 106 and 108 with the conductive material 112. By omitting the barrier layers, gapfill capability for the openings 104, 106 and 108 is improved, formation of voids in the conductive material 112 is reduced or avoided, and the resistance of the contact plugs 114, 116 and 118 is reduced.

Figure 18B:
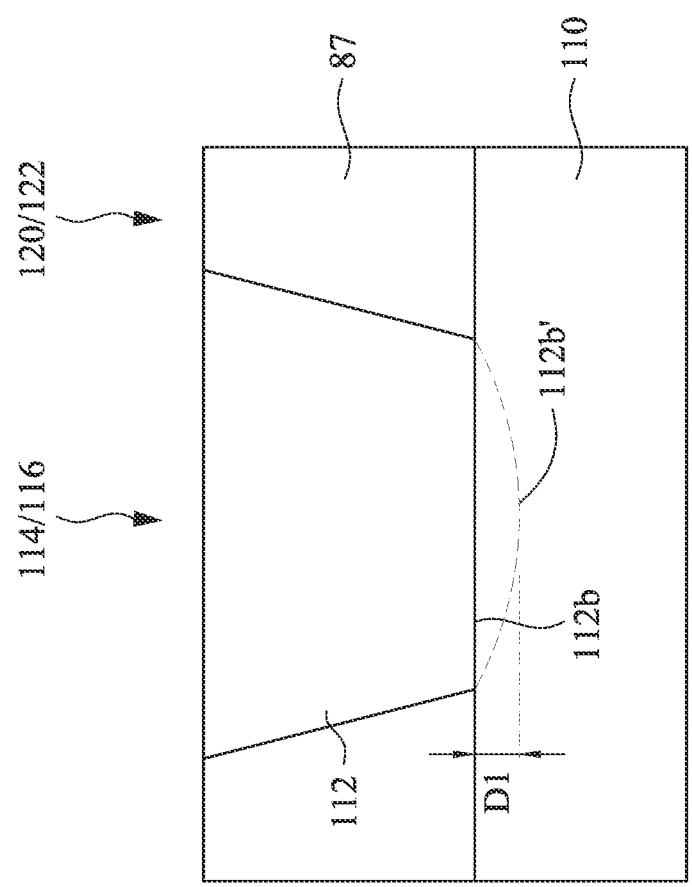

FIG. 18B illustrates a magnified view of portions 120 and 122 of the structure shown in FIG. 17B. In some embodiments, the conductive material 112 of the contact plugs 114 and 116 has a planar bottom surface 112b. In other embodiments, the conductive material 112 of the contact plugs 114 and 116 has a non-planar bottom surface 112b', such as a convex surface. In such embodiments, the contact plugs 114 and 116 extend into respective salicide layers 110 and respective epitaxial source/drain regions 84 (see FIG. 17B) at a distance D1 below top surfaces of the respective salicide layers 110 and the respective epitaxial source/drain regions 84. In some embodiments, the distance D1 may be between about 0.5 nm and about 7 nm.

Figure 19B:
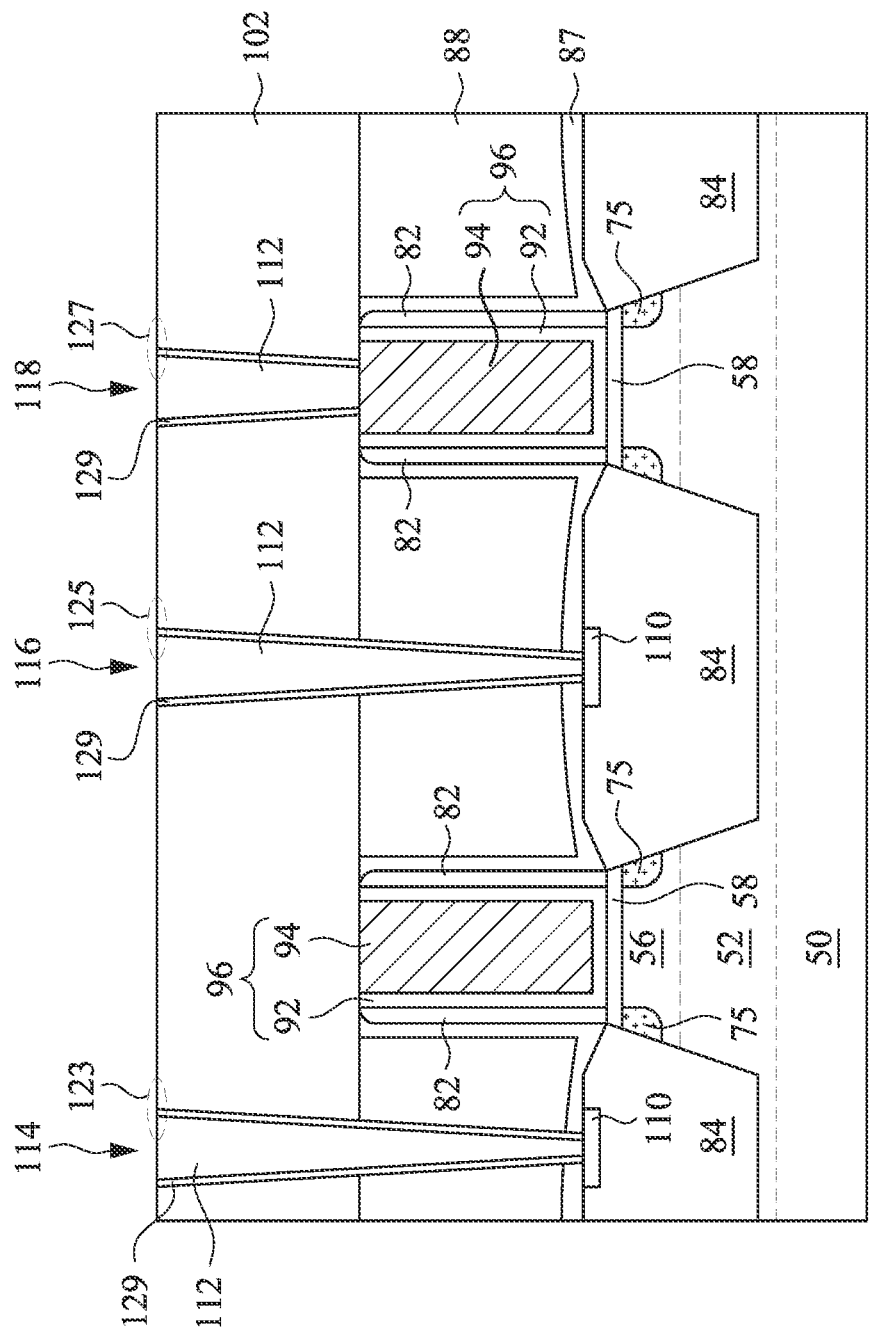

FIG. 19B illustrates a structure similar to the structure shown in FIG. 17B, with like elements labeled by like numerical references. In the illustrated embodiment, after forming the openings 104, 106, and 108 (see FIG. 16B) and before filling the openings 104, 106, and 108 with the conductive material 112, a surface treatment is performed on exposed surfaces of the ESL 87 and the ILDs 88 and 102, such as a top surface of the ILD 102 and surfaces of the ESL 87, the ILD 88 and the ILD 102 exposed in the openings 104, 106, and 108. In some embodiments, the surface treatment forms self-assembled monolayers (SAMs) 129 on the exposed surfaces of the ESL 87, the ILD 88 and the ILD 102 and alters properties of the resulting exposed surfaces of the ESL 87, the ILD 88 and the ILD 102. In some embodiments, the surface treatment changes the exposed surfaces of the ESL 87 and the ILDs 88 and 102 from hydrophilic to hydrophobic, or vice versa. By altering the properties of the exposed surfaces of the ESL 87, the ILD 88 and the ILD 102 from hydrophilic to hydrophobic, deposition rate of the conductive material 112 on the exposed surfaces of the ESL 87, the ILD 88 and the ILD 102 may be further reduced or suppressed. Accordingly, the non-conformal bottom-up deposition of the conductive material 112 in the openings 104, 106 and 108 (see FIG. 16B) may be further improved.

Referring further to FIG. 19B, in some embodiments, the SAMs 129 may seal out roughness or irregularities of the exposed surfaces of the ESL 87, the ILD 88 and the ILD 102. In some embodiments, the SAMs 129 may improve adhesion between the conductive material 112 and the ESL 87, and between the conductive material 112 and the ILDs 88 and 102. In some embodiments, the SAMs 129 may act as a diffusion barrier layer between the conductive material 112 and the ESL 87, and between the conductive material 112 and the ILDs 88 and 102. The SAMs 129 may also be referred to as barrier layers 129. In some embodiments, by altering the surface properties and by sealing voids or slurry penetration paths in the ILD 102, the SAMs 129 allow for reducing CMP slurry or wet etchant penetration at the interfaces between the conductive material 112 and the ILD 102. In some embodiments, the SAMs 129 have a thickness between about 0.5 nm and about 2 nm.

In some embodiments, the surface treatment may comprise a silylation process performed using chemicals, such as dimethylsilane (DMS), trimethylsilane (TMS), dimethylaminotrimethylsilane (DMA-TMS), octadecyltrichlorosilane (OTS), fluorooctyltrichlorosilane (FOTS), dichlorodimethylsilane (DMDCS), trimethylsilydiethylamine (TMSDEA), trimethylsilylacetylene (TMSA), (chloromethyl)dimethylchlorosilane (CMDMCS), (chloromethyl)dimethylsilane (CMDMS), hexamethyldisilazane (HMDS), tert-Butyldimethylsilane (TBDMS), octamethylcyclotetrasiloxane (OMCTS), bis(dimethylamino)dimethylsilane (DMADMS), trimethylchlorosilane (TMCS), chemicals with thiol and thiolate terminated molecules, such as Triisopropylsilanethiol, silylethane-thiol, $SOCl_2$, a combination thereof, or the like. In some embodiments, the surface treatment is a liquid-phase treatment, such that process chemicals are in the liquid phase during the surface treatment. In some embodiments, the surface treatment is a vapor-phase treatment, such that process chemicals are in the vapor phase during the surface treatment. In some embodiments when the surface treatment is a liquid-phase treatment, the surface treatment is performed at a temperature between about 20° C. and about 30° C. In some embodiments when the surface treatment is a vapor-phase treatment, the surface treatment is performed at a temperature between about 50° C. and about 200° C. In some embodiments when the surface treatment is a vapor-phase treatment, the surface treatment is performed at a pressure between about 10 mTorr and about 1 Torr. In some embodiments when the surface treatment is a vapor-phase treatment, a flow rate of process chemicals is between about 10 sccm and about 100 sccm.

Figure 20:
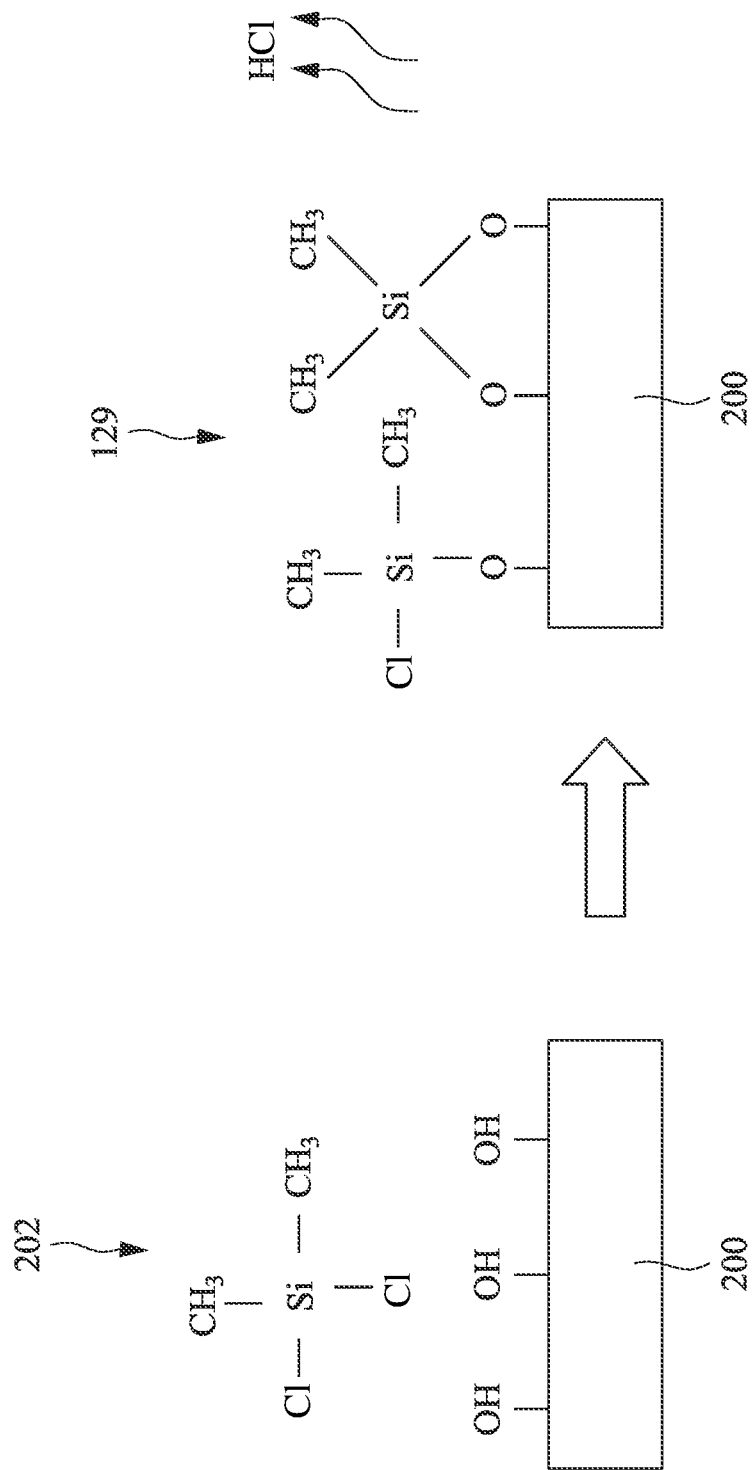
FIG. 20 illustrates a chemical reaction occurring during the surface treatment process in accordance with some embodiments.

FIG. 20 illustrates a chemical reaction occurring during the surface treatment process performed on a dielectric layer 200 in accordance with some embodiments. In some embodiments, the dielectric layer 200 may be the ESL 87, the ILD 88, or ILD 102 (see FIG. 19B). In some embodiment, the surface treatment process is performed with a chemical 202. In the illustrated embodiments, the chemical 202 is dichlorodimethylsilane (DMDCS). In some embodiments, exposed surfaces of the dielectric layer 200 may comprise a hydroxyl (OH) terminated surface. In some embodiments, a hydroxylation process may be performed on the dielectric layer 200 to form the hydroxyl (OH) terminated surface. In some embodiments, the chemical 202 reacts with hydroxyl (OH) groups and forms a SAM 129 on the exposed surfaces of the dielectric layer 200. In the illustrated embodiment, the chemical reaction further produces HCl as a byproduct. In some embodiments where Cl in the chemical 202 is replaced by I, the chemical reaction produces HI as a byproduct. In some embodiments where Cl in the chemical 202 is replaced by Br, the chemical reaction produces HBr as a byproduct.

Figure 21:
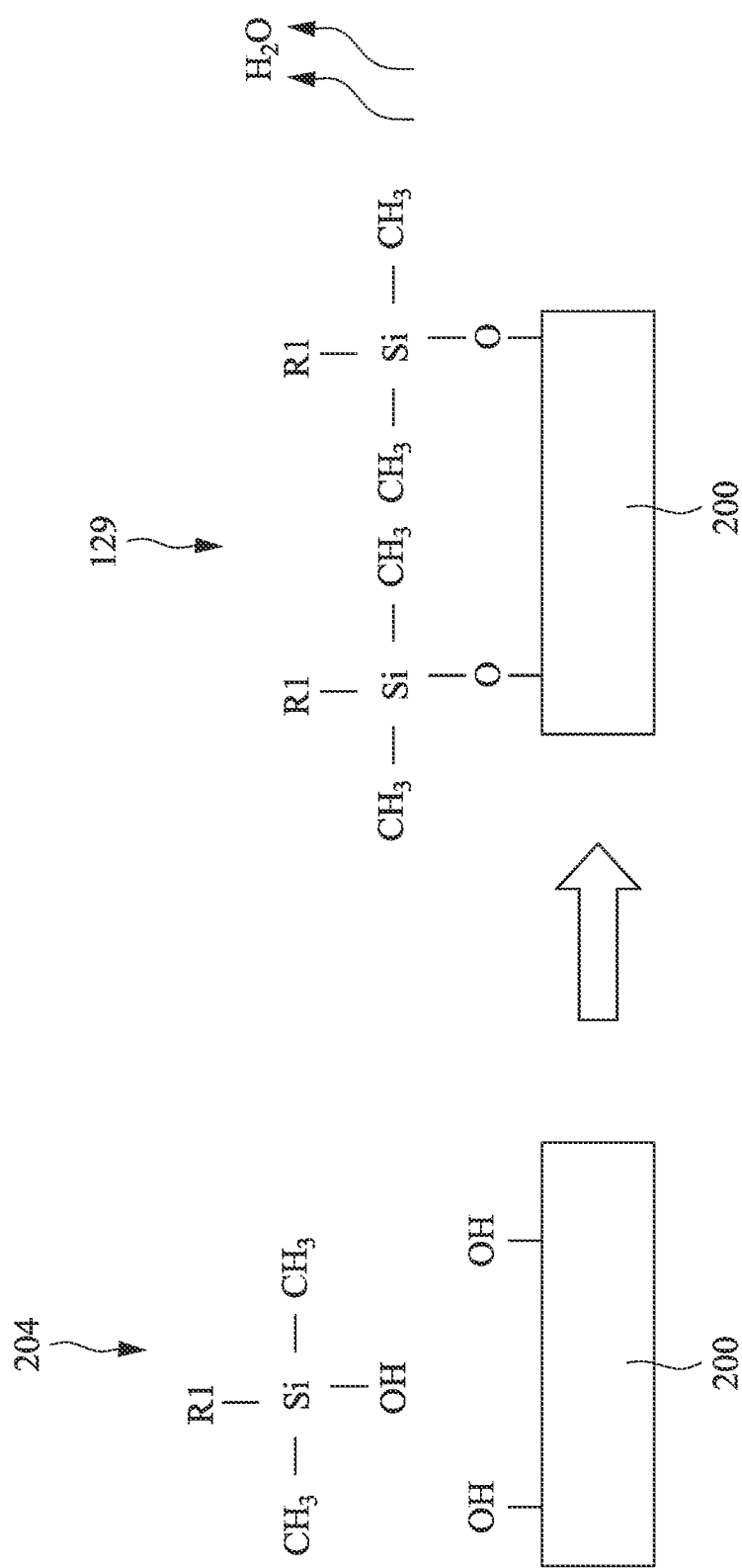
FIG. 21 illustrates a chemical reaction occurring during the surface treatment process in accordance with some embodiments.

FIG. 21 illustrates a chemical reaction occurring during the surface treatment process performed on a dielectric layer 200 in accordance with some embodiments. In some embodiments, the dielectric layer 200 may be the ESL 87, the ILD 88, or ILD 102 (see FIG. 19B). In some embodiment, the surface treatment process is performed with a chemical 204. In the illustrated embodiments, the chemical 204 is a silanol, where —R1 comprises —$CH_3$, —H, —$CH_3(CH_2)_n$, —$CF_3(CF_2)_7(CH_2)_2$, $(CH_3)_2N$—, —(OCH$CH_2$), methoxy, aminopropyl, trifluoromethyl (—$CF_3$), methyl, —$CH_3Cl_2$, triethoxysilane (—$Si(OC_2H_5)_3$), dimethylchlorosilane (—$Si(CH_3)_2Cl$), methyldichlorosilane (—$Si(CH_3)Cl_2$), derivatives thereof, or the like. In some embodiments, exposed surfaces of the dielectric layer 200 may comprise a hydroxyl (OH) terminated surface. In some embodiments, a hydroxylation process may be performed on the dielectric layer 200 to form the hydroxyl (OH) terminated surface. In some embodiments, the chemical 204 reacts with hydroxyl (OH) groups and forms a SAM 129 on the exposed surfaces of the dielectric layer 200. The chemical reaction further produces $H_2O$ as a byproduct.

Figure 22:
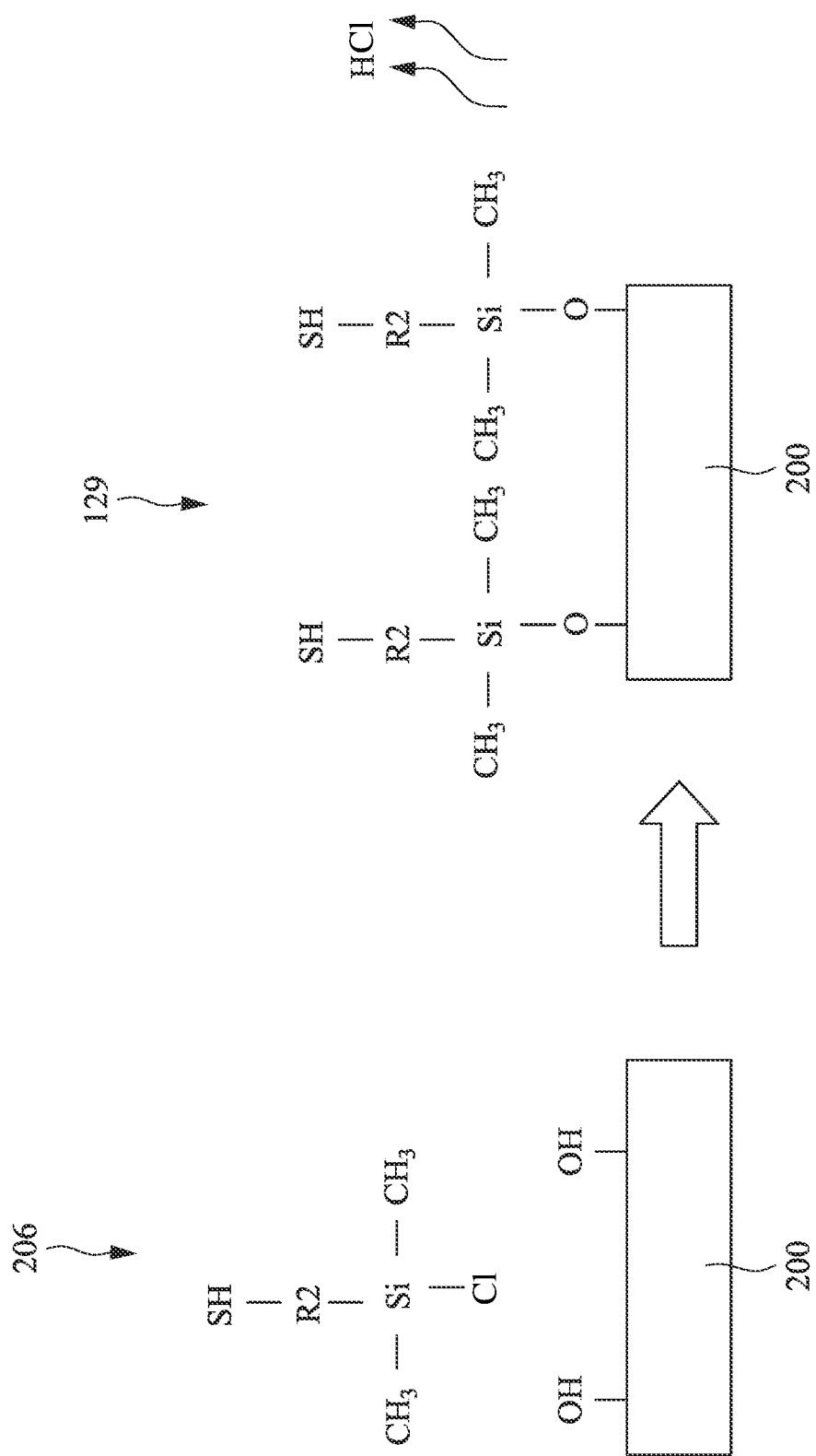
FIG. 22 illustrates a chemical reaction occurring during the surface treatment process in accordance with some embodiments.

FIG. 22 illustrates a chemical reaction occurring during the surface treatment process performed on a dielectric layer 200 in accordance with some embodiments. In some embodiments, the dielectric layer 200 may be the ESL 87, the ILD 88, or ILD 102 (see FIG. 19B). In some embodiment, the surface treatment process is performed with a chemical 206. In the illustrated embodiments, the chemical 206 comprises thiol (SH) terminated molecules, where —R2 comprises —$CH_3$, —$CH_3(CH_2)_n$, $(CH_3)_2N$—, —$(CH_2)_nCOOH$, —$CF_3(CF_2)_2CF_2$, —$C_{12}H_{25}$, —CN, —$(CH_2)_nPO_3H_2$, —$NH_2$, phenyl, benzyl, pyridyl, derivatives thereof, or the like. In some embodiments, exposed surfaces of the dielectric layer 200 may comprise a hydroxyl (OH) terminated surface. In some embodiments, a hydroxylation process may be performed on the dielectric layer 200 to form the hydroxyl (OH) terminated surface. In some embodiments, the chemical 206 reacts with hydroxyl (OH) groups and forms a SAM 129 on the exposed surfaces of the dielectric layer 200. The chemical reaction further produces HCl as a byproduct. In some embodiments, an exposed surface of the SAM 129 is a thiol (SH) terminated surface.

Figure 23B:
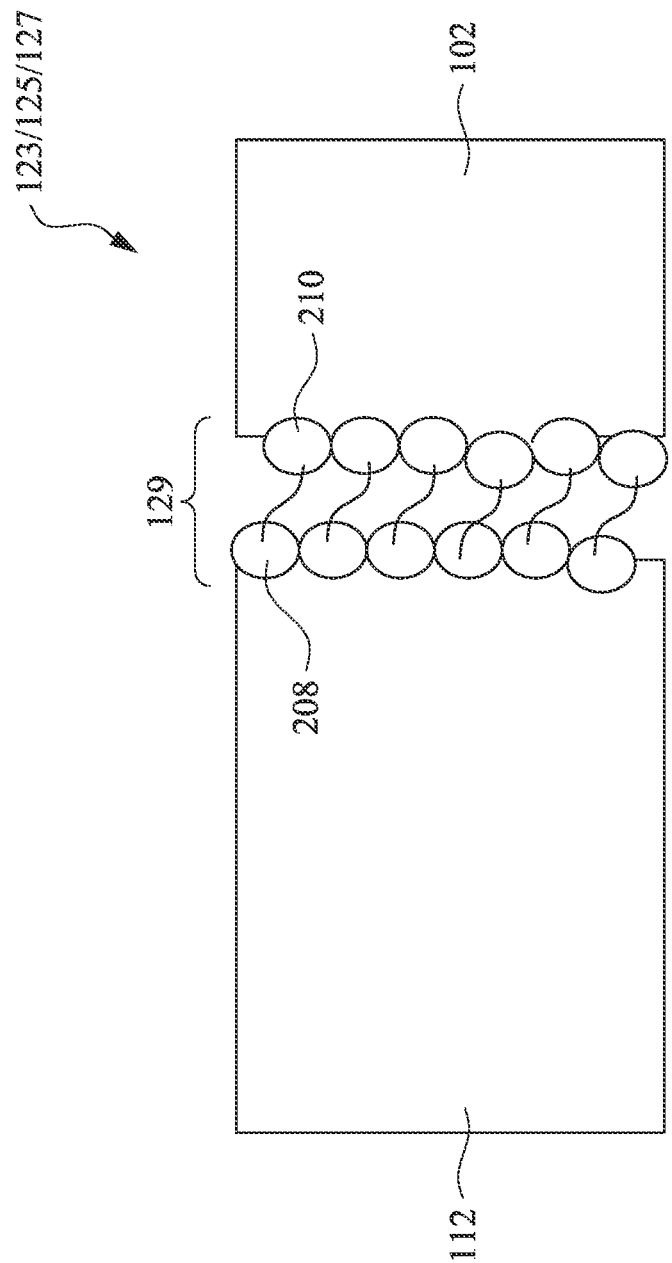

FIG. 23B illustrates a magnified view of portions 123, 125, and 127 of the structure shown in FIG. 19B. In some embodiments where the surface treatment is performed using chemicals with thiol and thiolate terminated molecules, the SAMs 129 may comprise self-assembled monolayers of thiol and/or thiolate terminated molecules. In some embodiments, head groups 210 of the SAMs 129 bond with the materials of the ESL 87, the ILD 88 and the ILD 102 by a chemical bond or an ionic bond, and tail groups 208 of the SAMs 129 bond with the conductive material 112 by a chemical bond or an ionic bond. In some embodiments, the tail groups 208 of the SAMs 129 comprise thiol or thiolate groups. In some embodiments, the thiol or thiolate groups of the SAMs 129 may improve adhesion between the conductive material 112 and the ESL 87, and between the conductive material 112 and the ILDs 88 and 102.

Figure 24B:
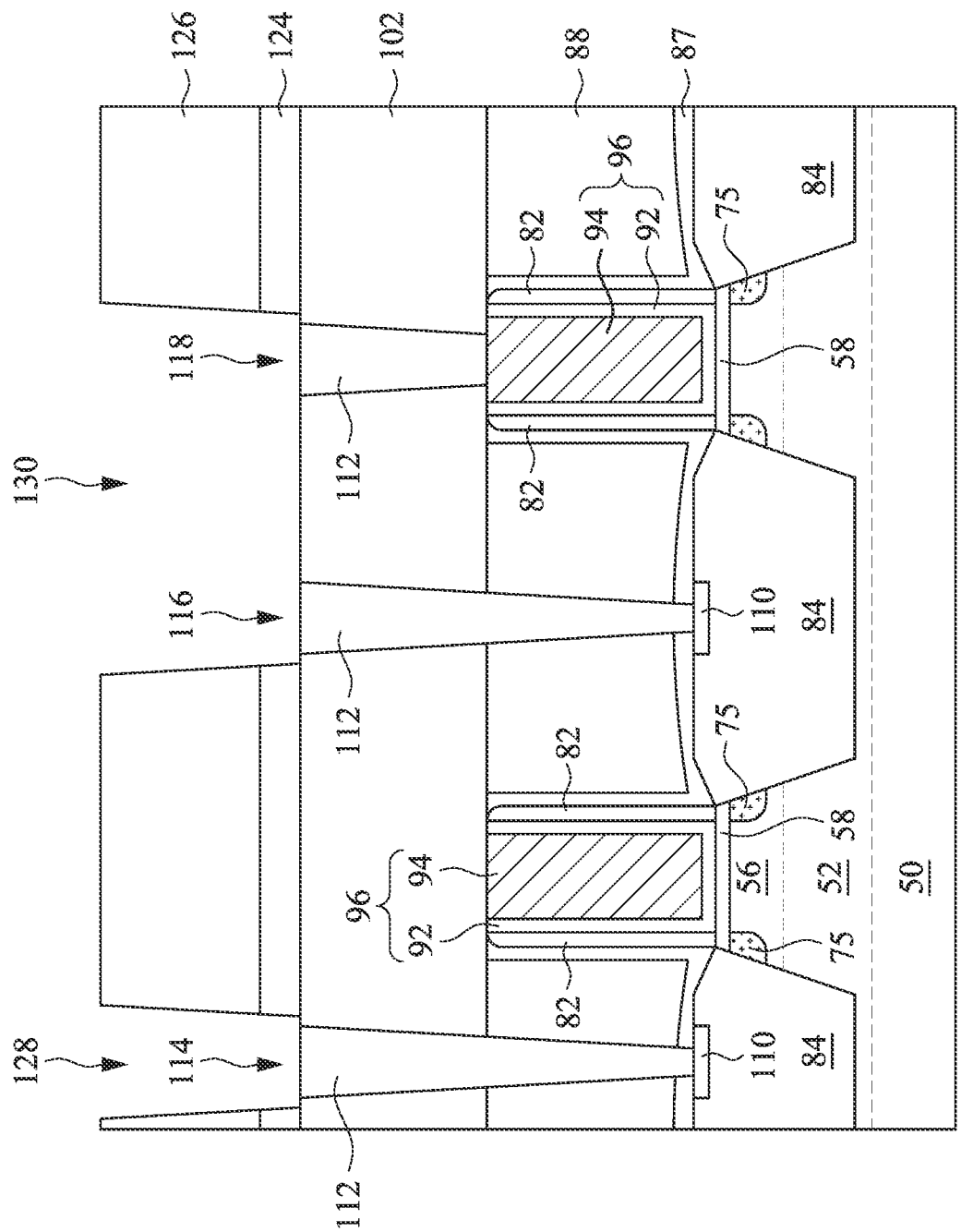

Referring to FIG. 24B, after preforming process steps described above with reference to FIG. 17B, an ESL 124 is formed over the ILD 102 and the contact plugs 114, 116 and 118, and an ILD 126 is formed over the ESL 124. In some embodiments, the ESL 124 may be formed using similar materials and methods as the ESL 87 described above with reference to FIGS. 13A and 13B, and the description is not repeated herein. In some embodiments, the ESL 124 and the ESL 87 may comprise a same material. In other embodiments, the ESL 124 and the ESL 87 may comprise different materials. In some embodiment, the ILD 126 may be formed using similar materials and methods as the ILD 88 described above with reference to FIGS. 13A and 13B, and the description is not repeated herein. In some embodiments, the ILDs 88, 102 and 126 may comprise a same material. In other embodiments, the ILDs 88, 102 and 126 may comprise different materials. In some embodiments, the ESL 124 has a thickness between about 1 nm and about 10 nm. In some embodiments, the ILD 126 has a thickness between about 50 nm and about 200 nm.

Referring further to FIG. 24B, The ESL 124 and the ILD 126 are patterned to form openings 128 and 130. In some embodiments, the ESL 124 and the ILD 126 may be patterned using one or more suitable etching processes, such as anisotropic dry etching process, or the like. The opening 128 exposes the contact plug 114. The opening 130 exposes the contact plugs 116 and 118. As described below in greater detail, the openings 128 and 130 are filled with one or more conductive materials to form conductive vias that provide electrical connections to the contact plugs 114, 116, and 118. In some embodiments, the opening 128 has a width between about 10 nm and about 50 nm. In some embodiments, the opening 130 has a width between about 30 nm and about 300 nm.

Figure 25B:
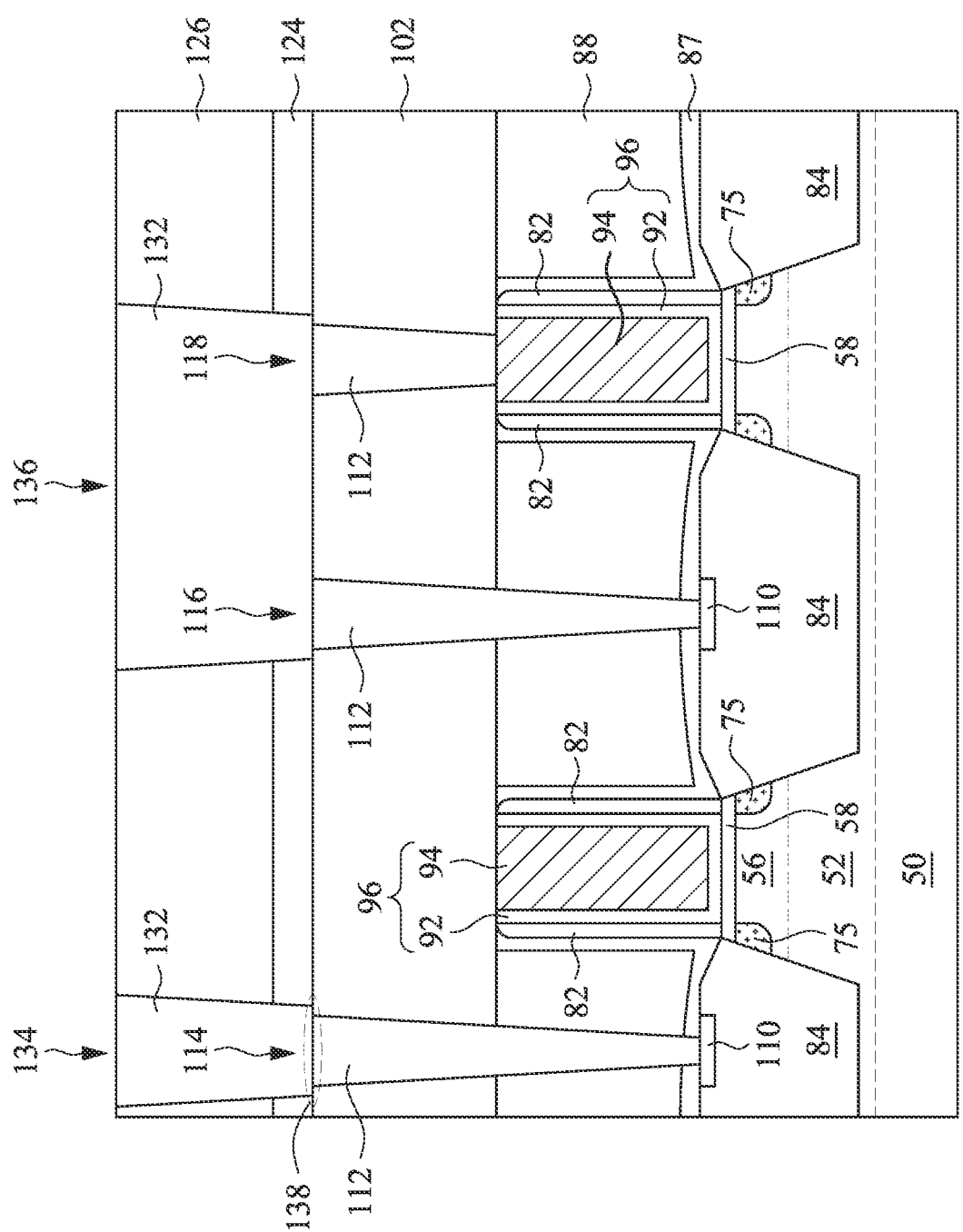

Referring to FIG. 25B, the openings 128 and 130 (see FIG. 24B) are filled with a conductive material 132 to form conductive vias 134 and 136 in the openings 128 and 130, respectively. In some embodiment, before filling the openings 128 and 130 with the conductive material 132, a cleaning process may be performed to remove native oxides from top surfaces of the contact plugs 114, 116, and 118. In some embodiments, the cleaning process may be a plasma cleaning process using a process gas comprising $H_2$, $BCl_3$, $NF_3$, HF, HCl, $SiCl_4$, $Cl_2$, $SF_6$, $CF_4$, $CH_xF_y$, He, Ar, a mixture thereof, or the like. In some embodiments, the conductive material 132 may comprise Co, Cu, Ru, Ni, Al, Pt, Mo, W, Al, Ir, Os, a combination thereof, or the like and may be formed using CVD, PVD, ALD, an electrochemical plating process, an electroless plating process, a combination thereof, or the like. In some embodiments, the conductive material 132 may comprise a metallic material having a low electron mean free path. In some embodiments, the metallic material may have an electron mean free path less than the electron mean free path of copper (Cu). In some embodiments, the conductive material 132 and the conductive material 112 may comprise a same material. In other embodiments, the conductive material 132 and the conductive material 112 may comprise different materials. In some embodiments, parameters of the deposition process for the conductive material 132 is tuned, such that the conductive material 132 is deposited in the openings 128 and 130 in a non-conformal bottom-up manner. In some embodiments, the conductive material 132 may deposited using similar methods as the conductive material 112 described above with reference to FIG. 17B, and the description is not repeated herein. By forming the conductive material 132 in a non-conformal bottom-up manner, the formation of voids in the conductive material 132 may be reduced or avoided. By reducing or avoiding the formation of the voids in the conductive material 132, the resistance of the conductive vias 134 and 136 is reduced.

Referring further to FIG. 25B, after filling the openings 128 and 130 (see FIG. 24B) with the conductive material 132, a polishing process, such as a CMP process, may be performed to remove excess portions of the conductive material 132. After completing the polishing process, top surfaces of the conductive vias 134 and 136 are coplanar or level with a top surface of the ILD 126. In the embodiment illustrated in FIG. 25B, the conductive vias 134 and 136 are formed without forming barrier layers in the openings 128 and 130 prior to filling the openings 128 and 130 with the conductive material 132. By omitting the barrier layers, gapfill capability for the openings 128 and 130 is improved and the resistance of the conductive vias 134 and 136 is reduced.

Figure 26B:
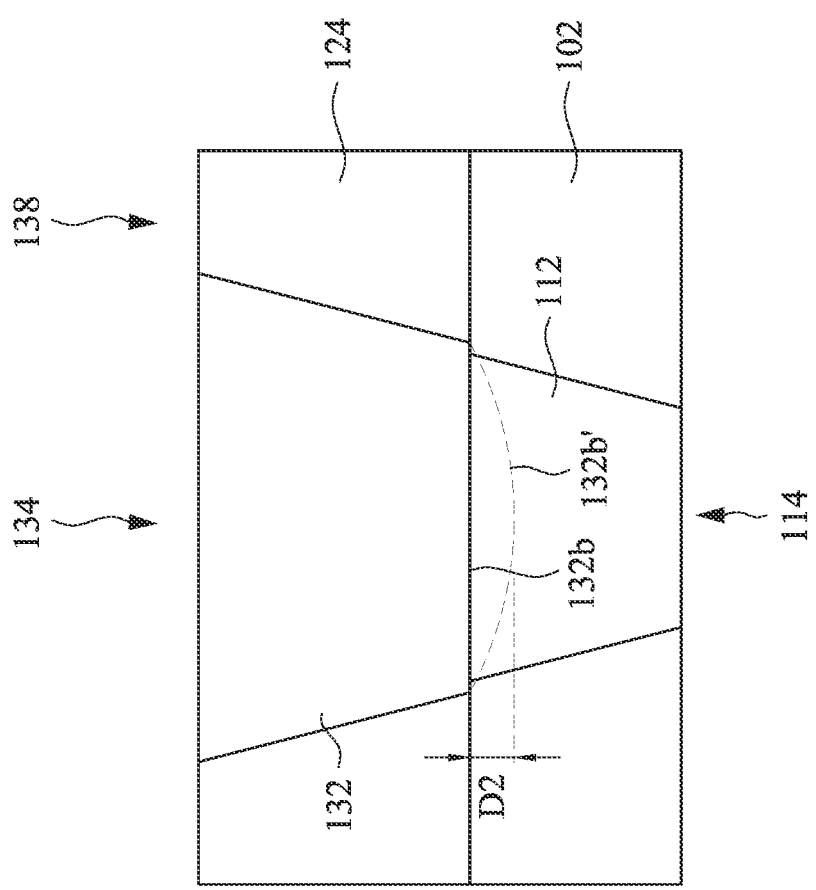

FIG. 26B illustrates a magnified view of a portion 138 of the structure shown in FIG. 25B. In some embodiments, the conductive material 132 of the conductive via 134 has a planar bottom surface 132b. In other embodiments, the conductive material 132 of the conductive via 134 has a non-planar bottom surface 132b', such as a convex surface. In such embodiments, the conductive via 134 extends into the contact plug 114 at a distance D2 below a top surface of the ILD 102. In some embodiments, the distance D2 may be between about 0.5 nm and about 5 nm. In some embodiments, the non-planar bottom surface 132b' of the conductive material 132 may be formed by recessing the conductive material 112 below the top surface of the ILD 102 before forming the ESL 124 over the ILD 102, such that the conductive material 132 is formed over a non-planar top surface of the conductive material 112. The conductive material 112 may be recessed using a suitable etching process, such as an anisotropic dry etching process. In other embodiments, the non-planar bottom surface 132b' of the conductive material 132 may be formed by recessing the conductive material 112 below the top surface of the ILD 102 during formation of the opening 128 (see FIG. 24B), such that the conductive material 132 is formed over a non-planar top surface of the conductive material 112.

Figure 27B:
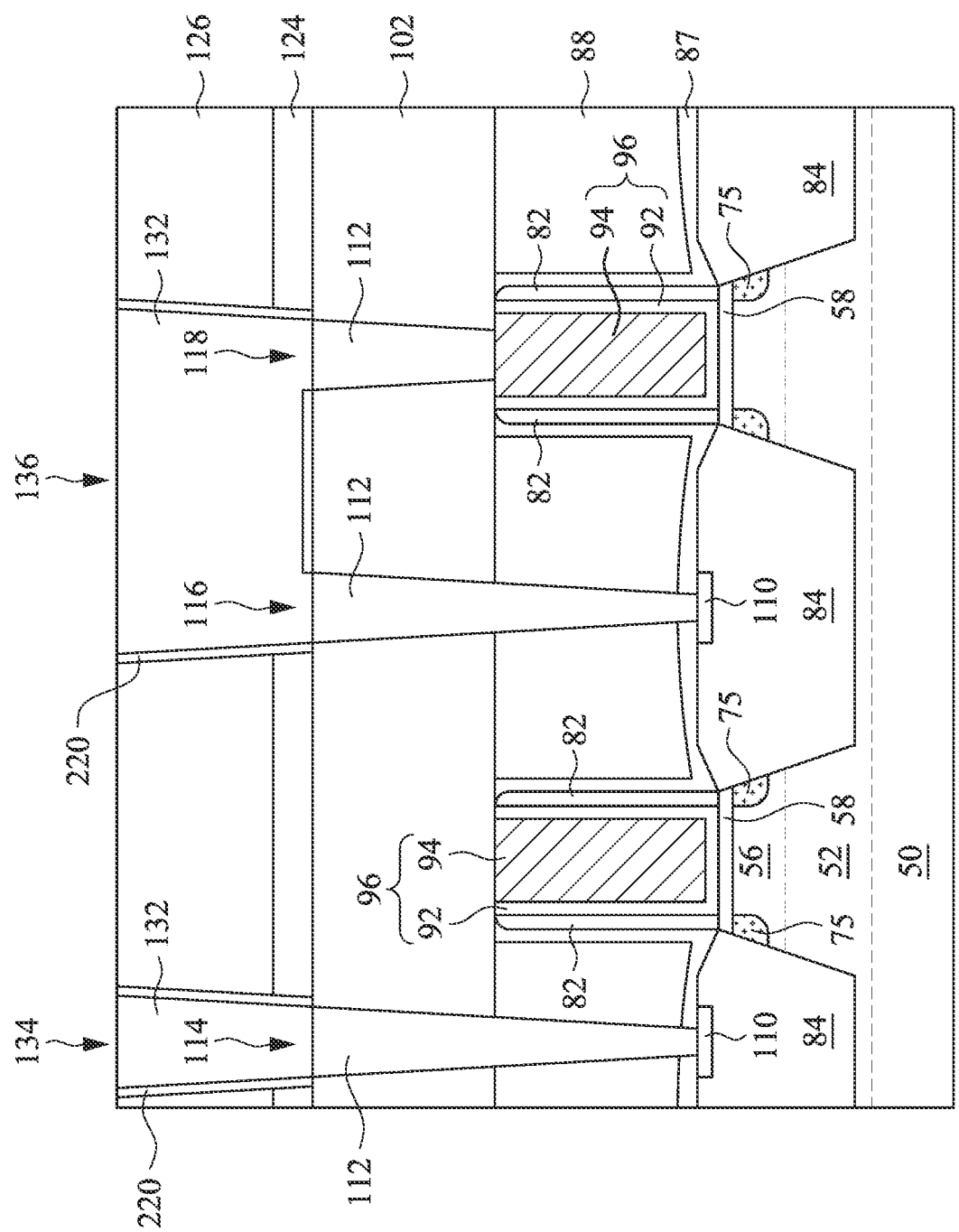

FIG. 27B illustrates a structure similar to the structure shown in FIG. 26B, with like elements labeled by like numerical references. In the illustrated embodiment, after forming the openings 128 and 130 (see FIG. 24B) and before filling the openings 128 and 130 with the conductive material 132 (see FIG. 25B), a surface treatment is performed on exposed surfaces of the ESL 124 and the ILD 126, such as a top surface of the ILD 126 and surfaces of the ESL 124 and the ILD 126 exposed in the openings 128 and 130. In some embodiments, the surface treatment performed on exposed surfaces of the ESL 124 and the ILD 126 may be similar to the surface treatment described above with reference to FIGS. 19B, 20-22, and 23B, and the description is not repeated herein. In some embodiments, the surface treatment forms SAMs 220 on the exposed surfaces of the ESL 124 and the ILD 126. In some embodiment, the SAMs 220 may be similar to the SAMs 129 described above with reference to FIGS. 19B, 20-22, and 23B, and the description is not repeated herein.

Figure 28B:
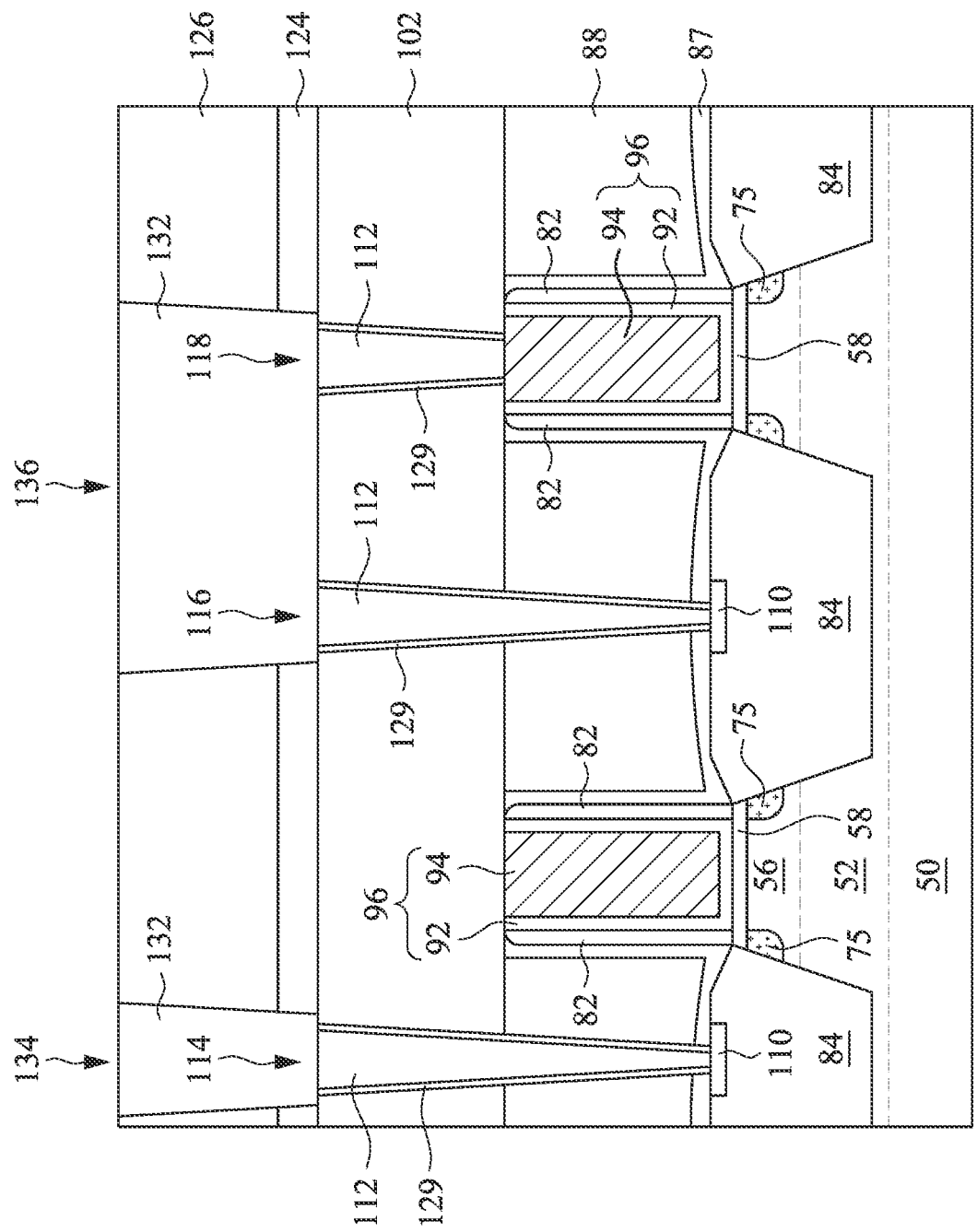

FIG. 28B illustrates a structure similar to the structure shown in FIG. 25B, with like elements labeled by like numerical references. In the illustrated embodiment, the process steps described above with reference to FIGS. 24B and 25B are performed on the structure illustrated in FIG. 19B.

Figure 29B:
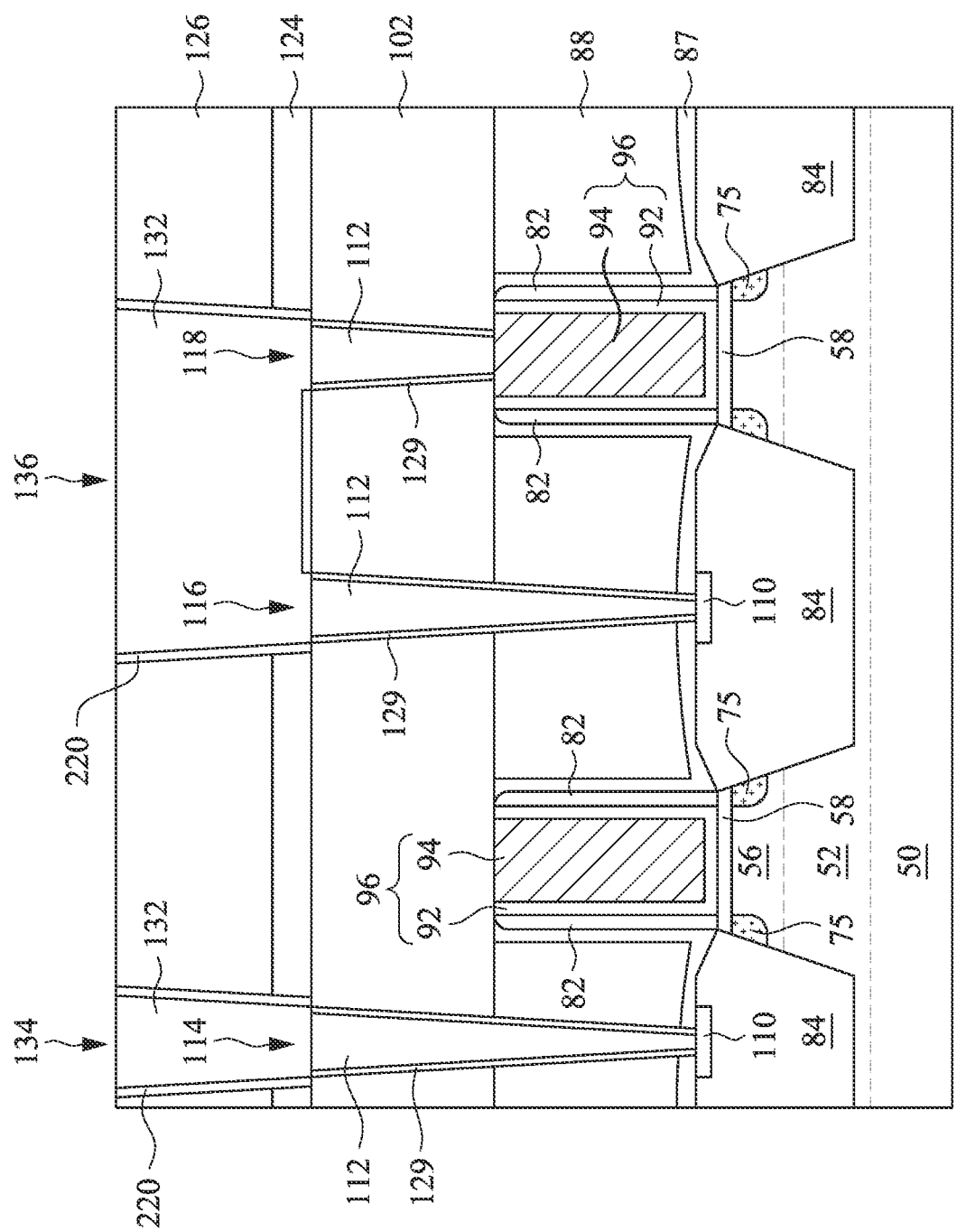

FIG. 29B illustrates a structure similar to the structure shown in FIG. 28B, with like elements labeled by like numerical references. In the illustrated embodiment, the process steps described above with reference to FIGS. 24B and 27B are performed on the structure illustrated in FIG. 19B.

Figure 30B:
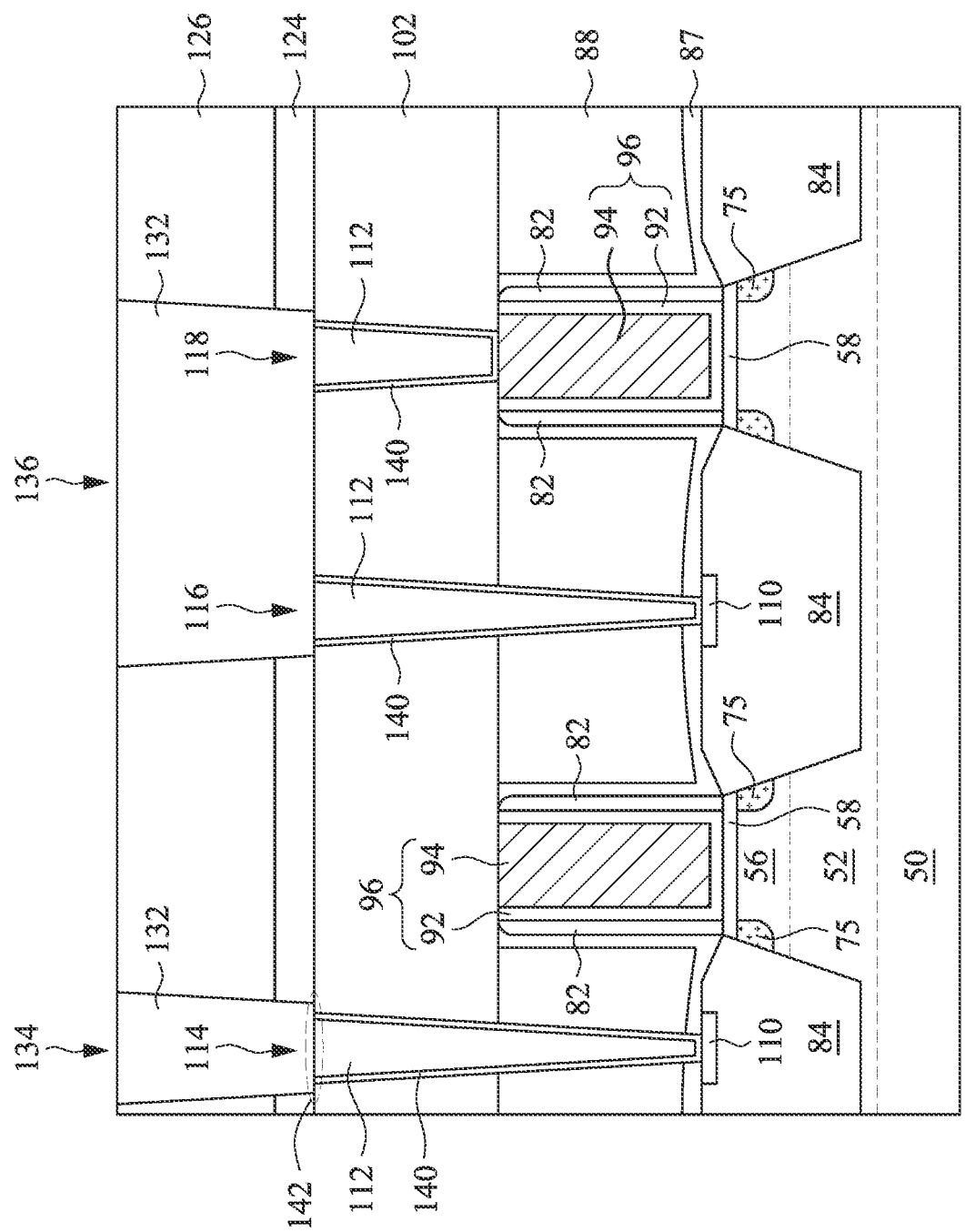

FIG. 30B illustrates a structure similar to the structure shown in FIG. 25B, with like elements labeled by like numerical references. In some embodiments, the structure of FIG. 30B may be formed using similar materials and methods as the structure of FIG. 25B and the description is not repeated herein. In the embodiment illustrated in FIG. 30B, the contact plugs 114, 116, 118 further comprise barrier layers 140 extending along sidewalls and bottom surfaces of the contact plugs 114, 116, 118. The barrier layers 140 may comprise metallic materials, metal alloys, metal nitride materials, combinations thereof, or the like. The metallic materials may comprise W, Mo, Ir, Pt, Os, a combination thereof, and the like. The metal alloys may comprise RuSi, CoSi, NiSi, RuGeP, a combination thereof, and the like. The metal nitride materials may comprise TiN, TaN, TaMnN, TaAlN, TiAlN, a combination thereof, and the like. In some embodiments, the barrier layers 140 are conformally formed in the openings 104, 106 and 108 (see FIG. 16B) before filling the openings 104, 106 and 108 with the conductive material 112. In some embodiments, the barrier layers 140 may be formed by CVD, PECVD, ALD, a combination thereof, or the like. In some embodiments, the barrier layers 140 have a thickness between about 0.5 nm and about 5 nm.

Figure 31B:
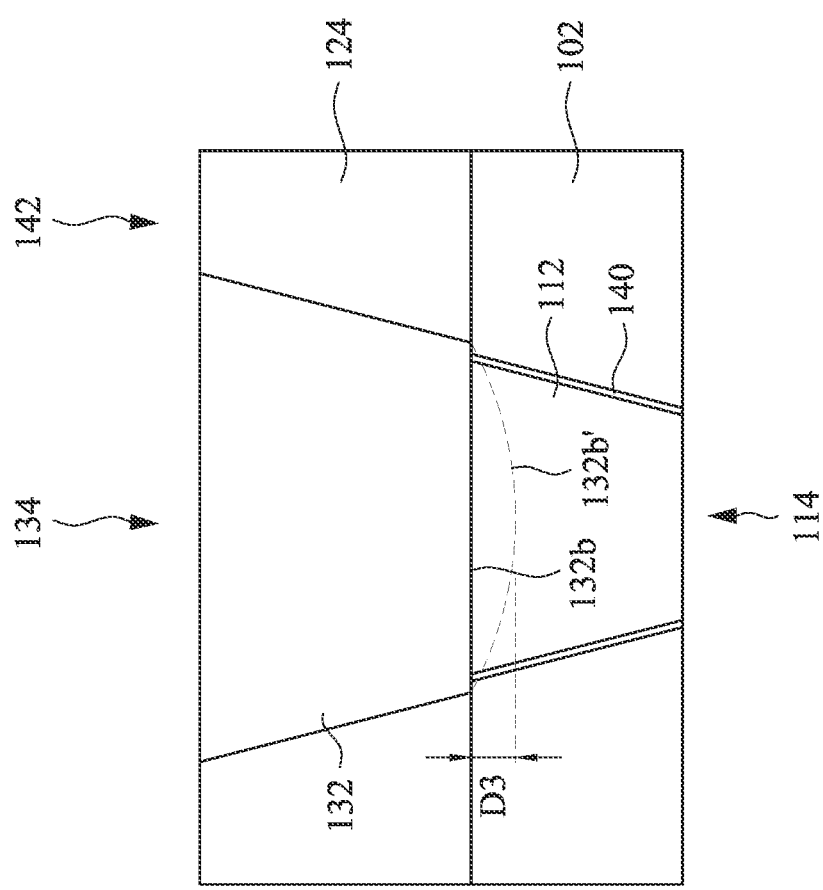

FIG. 31B illustrates a magnified view of a portion 142 of the structure shown in FIG. 30B. In some embodiments, the conductive material 132 of the conductive via 134 has a planar bottom surface 132b. In other embodiments, the conductive material 132 of the conductive via 134 has a non-planar bottom surface 132b', such as a convex surface. In such embodiments, the conductive via 134 extends into the contact plug 114 at a distance D3 below a top surface of the ILD 102. In some embodiments, the distance D3 may be between about 0.5 nm and about 5 nm. In some embodiments, the non-planar bottom surface 132b' of the conductive material 132 may be formed using similar methods as described above with reference to FIG. 26B, and the description is not repeated herein.

Figure 32B:
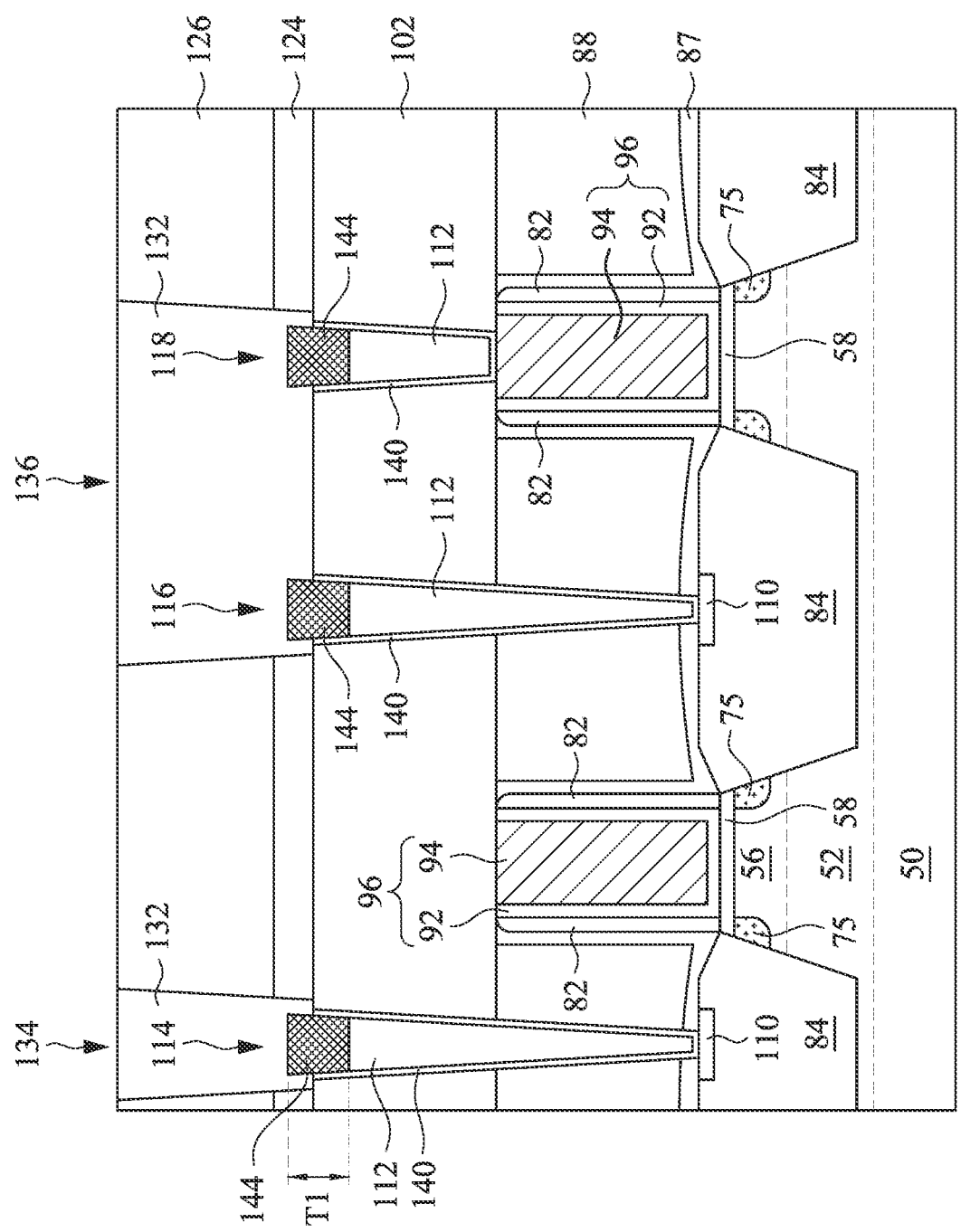

FIG. 32B illustrates the structure of FIG. 30B after alloy layers 144 are formed at interfaces between the conductive material 112 of the contact plugs 114, 116 and 118, and the conductive material 132 of the conductive vias 134 and 136. In some embodiments, the alloy layers 144 comprise an alloy of the conductive materials 112 and 132 and provide adhesion between the conductive material 112 and the conductive material 132. In other embodiments, the alloy layers 144 may comprise an alloy of the conductive materials 112 and 132 and the material of the barrier layers 140. In some embodiments, the alloy layers 144 are formed by performing a thermal process on the conductive materials 112 and 132. In some embodiments, the thermal process may be performed at a temperature between about 200° C. and about 500° C. In some embodiments, the thermal process may be performed in a gas ambient comprising $N_2$, He, Ar, $H_2$, a forming gas (such as, for example, 5% by volume of $H_2$ in $N_2$), a mixture thereof, or the like. In some embodiments where the forming gas is used as an ambient gas during the thermal process, the forming gas forms dissociated ammonia atmosphere that acts as a reducing agent, which may help to reduce native oxides on surfaces of the conductive materials 112 and 132 and may remove carbon and oxygen impurities from the conductive materials 112 and 132. In some embodiments, the alloy layers 144 may have a thickness T1 between about 0.5 nm and about 10 nm. In some embodiments, parameters of the thermal process may be altered to tune the composition and the thickness T1 of the alloy layers 144 and to achieve desired resistance and adhesion properties for the alloy layers 144. A person having ordinary skill in the art will readily understand that a similar alloying process may be also performed on the structures of FIGS. 25B, 27B, 28B and 29B.

Figure 33B:
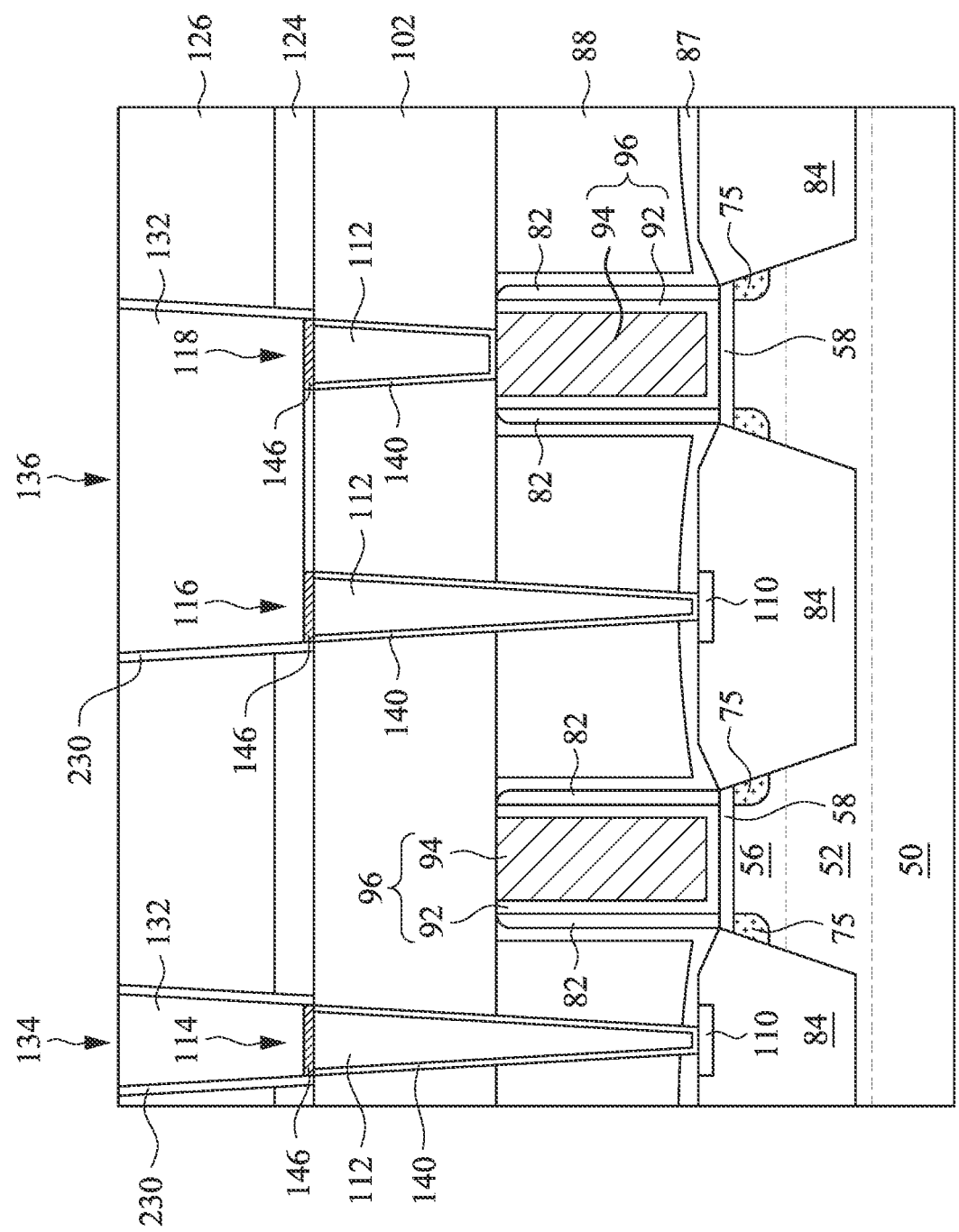

FIG. 33B illustrates a structure similar to the structure shown in FIG. 30B, with like elements labeled by like numerical references. In some embodiments, the structure of FIG. 33B may be formed using similar materials and methods as the structure of FIG. 30B and the description is not repeated herein. In the embodiment illustrated in FIG. 33B, before filling the openings 128 and 130 (see FIG. 24B) with the conductive material 132, barrier layers 146 are selectively formed over the contact plugs 114, 116 and 118. In some embodiments, the barrier layers 146 may prevent mixing of the conductive materials 112 and 132, and may prevent the formation of alloy layers at the interfaces between the conductive material 112 and the conductive material 132. In some embodiments where an alloy of the conductive materials 112 and 132 have higher resistivity than the conductive materials 112 and 132, the formation of the barrier layers 146 prevents increasing a resistance of the interfaces between the conductive material 112 and the conductive material 132.

In some embodiments, the barrier layers 146 may comprise similar materials as the barrier layers 140 and the description is not repeated herein. In some embodiments, after forming the openings 128 and 130 (see FIG. 24B), a surface treatment is performed on exposed surfaces of the ESL 124 and the ILD 126, such as a top surface of the ILD 126 and surfaces of the ESL 124 and the ILD 126 exposed in the openings 128 and 130. The surface treatment forms SAMs 230 on the exposed surfaces of the ESL 124 and the ILD 126 and alters properties of the resulting exposed surfaces of the ESL 124 and the ILD 126. In some embodiments, the surface treatment changes the exposed surfaces of the ESL 124 and the ILD 126 from hydrophilic to hydrophobic. In some embodiments, the surface treatment performed on the exposed surfaces of the ESL 124 and the ILD 126 may be similar to the surface treatment described above with reference to FIGS. 19B, 20-22, and 23B, and the description is not repeated herein. In some embodiment, the SAMs 230 may be similar to the SAMs 129 described above with reference to FIGS. 19B, 20-22, and 23B, and the description is not repeated herein.

After preforming the surface treatment, the barrier layers 146 are formed in the openings 128 and 130 using ALD, CVD, PECVD, or the like. By altering the properties of the exposed surfaces of the ESL 124 and the ILD 126 from hydrophilic to hydrophobic, deposition rates of the barrier layers 146 on the exposed surfaces of the ESL 124 and the ILD 126 are reduced or suppressed. Accordingly, the barrier layers 146 are selectively formed on the conductive material 112 of the contact plugs 114, 116 and 118. In some embodiments, the barrier layers 146 have a thickness between about 0.5 nm and about 5 nm. After forming the barrier layers 146, the openings 128 and 130 are filled with the conductive material 132 to form conductive vias 134 and 136. In some embodiments, parameters of the deposition process for the conductive material 132 is tuned, such that the conductive material 132 is deposited in the openings 128 and 130 in a non-conformal bottom-up manner. In some embodiments, the conductive material 132 may be deposited using similar methods as the conductive material 112 described above with reference to FIG. 17B, and the description is not repeated herein. In some embodiments, by altering the properties of the exposed surfaces of the ESL 124 and the ILD 126 from hydrophilic to hydrophobic, deposition rates of the conductive material 132 on the exposed surfaces of the ESL 124 and the ILD 126 is further reduced or suppressed. Accordingly, the non-conformal bottom-up filling property of the deposition process for forming the conductive material 132 is further improved. In some embodiments, the barrier layers 146 and the barrier layers 140 may comprise a same material. In other embodiments, the barrier layers 146 and the barrier layers 140 may comprise different materials.

Figure 34B:
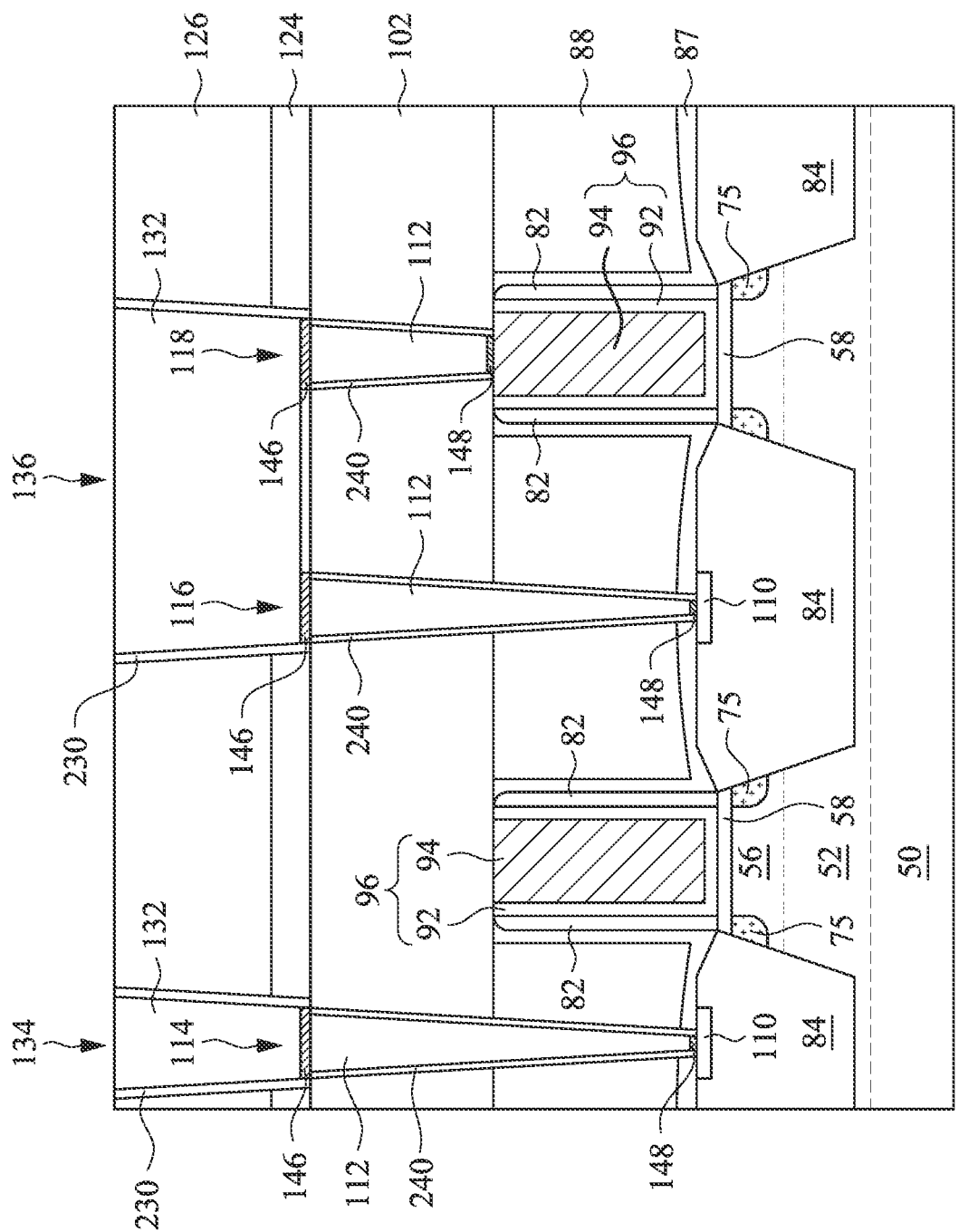

FIG. 34B illustrates a structure similar to the structure shown in FIG. 33B, with like elements labeled by like numerical references. In some embodiments, the structure of FIG. 34B may be formed using similar materials and methods as the structure of FIG. 33B and the description is not repeated herein. In the embodiment illustrated in FIG. 34B, instead of forming conformal barrier layers 140 (see FIG. 33B) as described above with reference to FIG. 33B, non-conformal barrier layers 148 are selectively formed on the salicide layers 110 and the replacement gate 96. In some embodiment, SAMs 240 and the barrier layers 148 may be formed using similar materials and methods as the SAMs 230 and the barrier layers 146, respectively, described above with reference to FIG. 33B, and the description is not repeated herein. In some embodiments, the barrier layers 148 have a thickness between about 0.5 nm and about 5 nm. In some embodiments, the barrier layers 146 and the barrier layers 148 may comprise a same material. In other embodiments, the barrier layers 146 and the barrier layers 148 may comprise different materials. In some embodiment, the SAMs 240 may be similar to the SAMs 129 described above with reference to FIGS. 19B, 20-22, and 23B, and the description is not repeated herein.

Figure 35B:
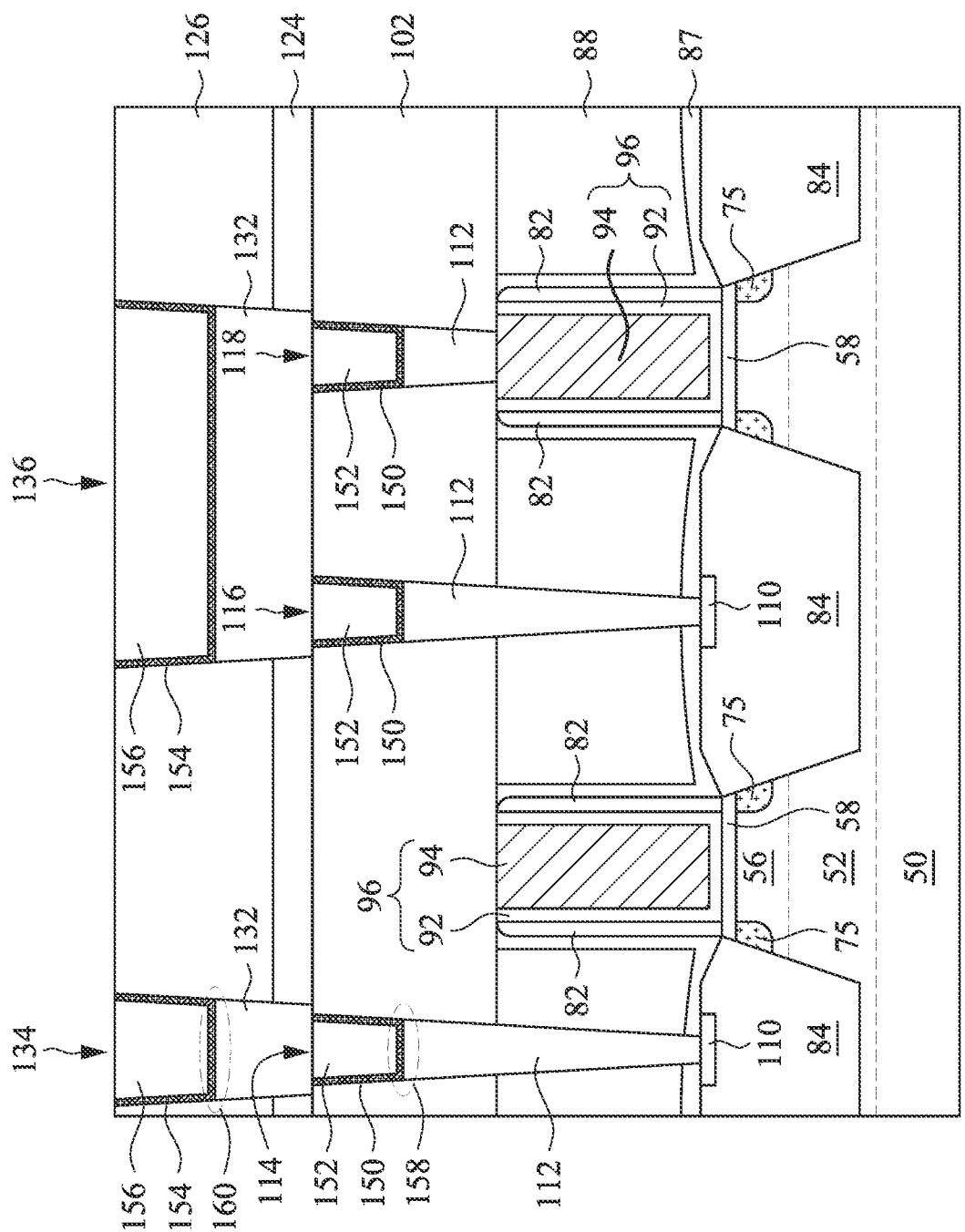

FIG. 35B illustrates a structure similar to the structure shown in FIG. 25B, with like elements labeled by like numerical references. In some embodiments, the structure of FIG. 35B may be formed using similar materials and methods as the structure of FIG. 25B and the description is not repeated herein. In the embodiment illustrated in FIG. 35B, the conductive material 112 partially fills the openings 104, 106 and 108 (see FIG. 16B). In some embodiments, heights of the unfilled portions of the openings 104, 106 and 108 may be altered by altering heights of the conductive material 112 within the openings 104, 106 and 108. In some embodiments, the deposition process may be stopped as the conductive material 112 reaches the desired heights within the openings 104, 106 and 108. In other embodiments, the conductive material 112 fully fills the openings 104, 106 and 108, and the conductive material 112 is recessed below the top surface of the ILD 102 to form the unfilled portions of the openings 104, 106 and 108. In some embodiment, the conductive material 112 may be recessed using a suitable etching process. Subsequently, conformal barrier layers 150 are formed in the unfilled portions of the openings 104, 106 and 108. In some embodiments, the barrier layers 150 may be formed using similar materials and methods as the barrier layers 140 described above with reference to FIG. 30B, and the description is not repeated herein. In some embodiments, the barrier layers 150 have a thickness between about 0.5 nm and about 5 nm. After forming the barrier layers 150, a conductive material 152 is deposited to fully fill the unfilled portions of openings 104, 106 and 108. In some embodiments, the conductive material 152 may be formed using similar materials and methods as the conductive material 112 described above with reference to FIG. 17B, and the description is not repeated herein. In some embodiment, the conductive material 152 and the conductive material 112 may comprise a same material. In other embodiment, the conductive material 152 and the conductive material 112 may comprise different materials. After filling the openings 104, 106 and 108 with the conductive material 152, a polishing process, such as a CMP process, may be performed to remove excess portions of the conductive material 152 and the barrier layers 150. In some embodiments, the barrier layers 150 may act as CMP etch stop layers. In some embodiments, the barrier layers 150 may protect the contact plugs 114, 116 and 118 from peeling and corrosion during the polishing process. After completing the polishing process, the top surfaces of the contact plugs 114, 116 and 118 are coplanar or level with the top surface of the ILD 102.

Referring further to FIG. 35B, the conductive material 132 partially fills the openings 128 and 130 (see FIG. 24B). In some embodiments, heights of the unfilled portions of the openings 128 and 130 may be altered by altering heights of the conductive material 132 within the openings 128 and 130. In some embodiments, the deposition process may be stopped as the conductive material 132 reaches the desired heights within the openings 128 and 130. In other embodiments, the conductive material 132 fully fills the openings 128 and 130, and the conductive material 132 is recessed below the top surface of the ILD 126 to form the unfilled portions of the openings 128 and 130. In some embodiment, the conductive material 132 may be recessed using a suitable etching process. Subsequently, conformal barrier layers 154 are formed in the unfilled portions of the openings 128 and 130. In some embodiments, the barrier layers 154 may be formed using similar materials and methods as the barrier layers 140 described above with reference to FIG. 30B, and the description is not repeated herein. In some embodiments, the barrier layers 154 have a thickness between about 0.5 nm and about 5 nm. In some embodiment, the barrier layers 154 and the barrier layers 150 may comprise a same material. In other embodiment, the barrier layers 154 and the barrier layers 150 may comprise different materials. After forming the barrier layers 154, a conductive material 156 is deposited to fully fill the unfilled portions of openings 128 and 130. In some embodiments, the conductive material 156 may be formed using similar materials and methods as the conductive material 132 described above with reference to FIG. 25B, and the description is not repeated herein. In some embodiment, the conductive material 156 and the conductive material 132 may comprise a same material. In other embodiment, the conductive material 156 and the conductive material 132 may comprise different materials. After filling the openings 128 and 130 with the conductive material 156, a polishing process, such as a CMP process, may be performed to remove excess portions of the conductive material 156 and the barrier layers 154. In some embodiments, the barrier layers 154 may act as CMP etch stop layers. In some embodiments, the barrier layers 154 may protect the conductive vias 134 and 136 from peeling and corrosion during the polishing process. After completing the polishing process, the top surfaces of the conductive vias 134 and 136 are coplanar or level with the top surface of the ILD 126.

Figure 36B:
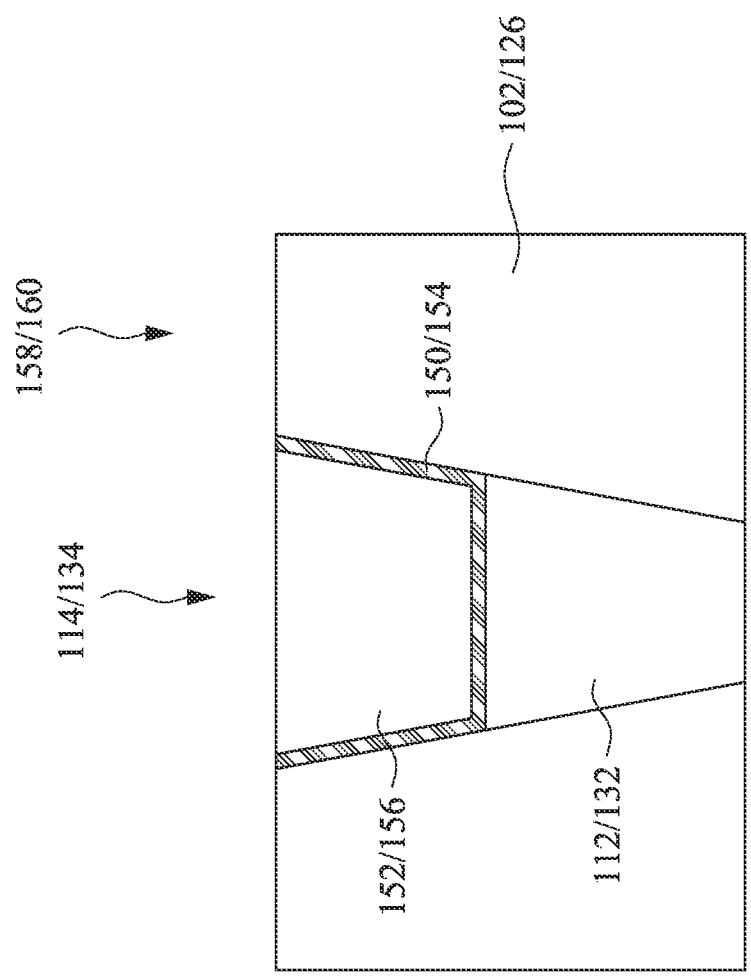
Figure 37B:
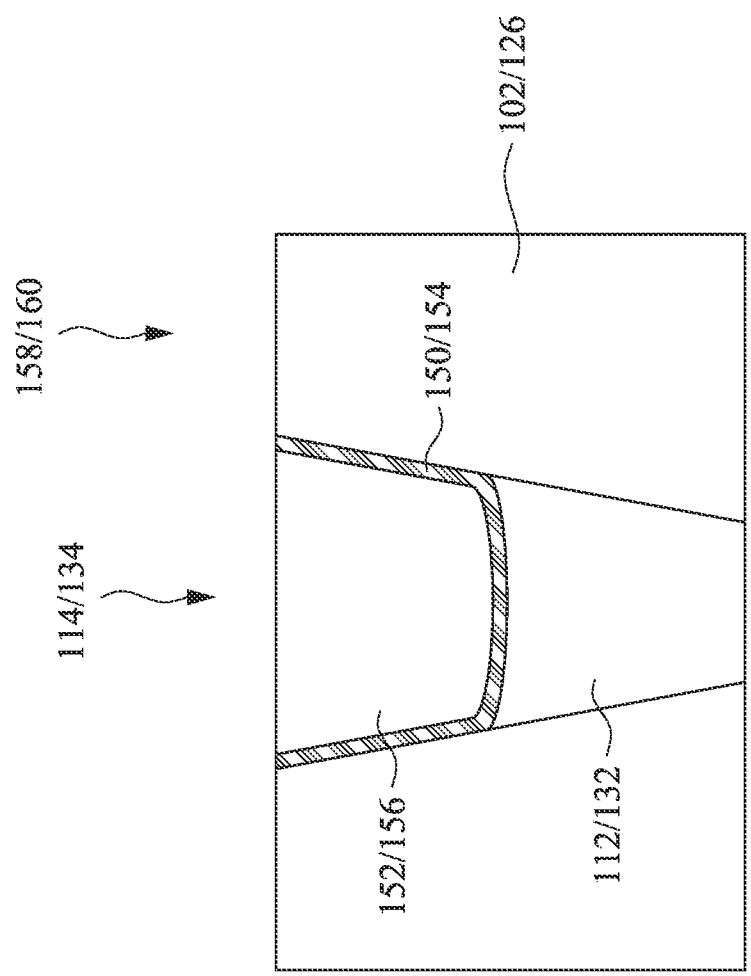
Figure 38B:
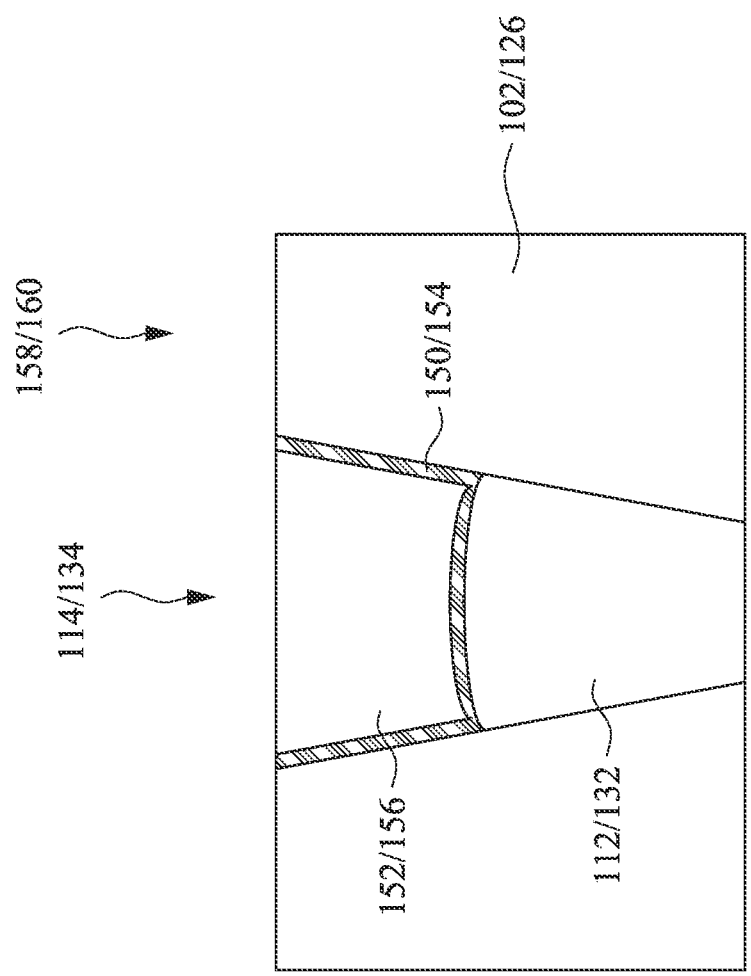

FIGS. 36B, 37B, and 38B illustrate magnified views of portions 158 and 160 of the structure shown in FIG. 35B in accordance with some embodiments. Referring to FIG. 36B, in some embodiments, the conductive materials 112 and 132 have planar top surfaces and the conductive materials 152 and 156 have planar bottom surfaces. Referring to FIG. 37B, in some embodiments, the conductive materials 112 and 132 have non-planar top surfaces (such as concave surfaces) and the conductive materials 152 and 156 have non-planar bottom surfaces (such as convex surfaces). Referring to FIG. 38B, in some embodiments, the conductive materials 112 and 132 have non-planar top surfaces (such as convex surfaces) and the conductive materials 152 and 156 have non-planar bottom surfaces (such as concave surfaces).

Figure 39B:
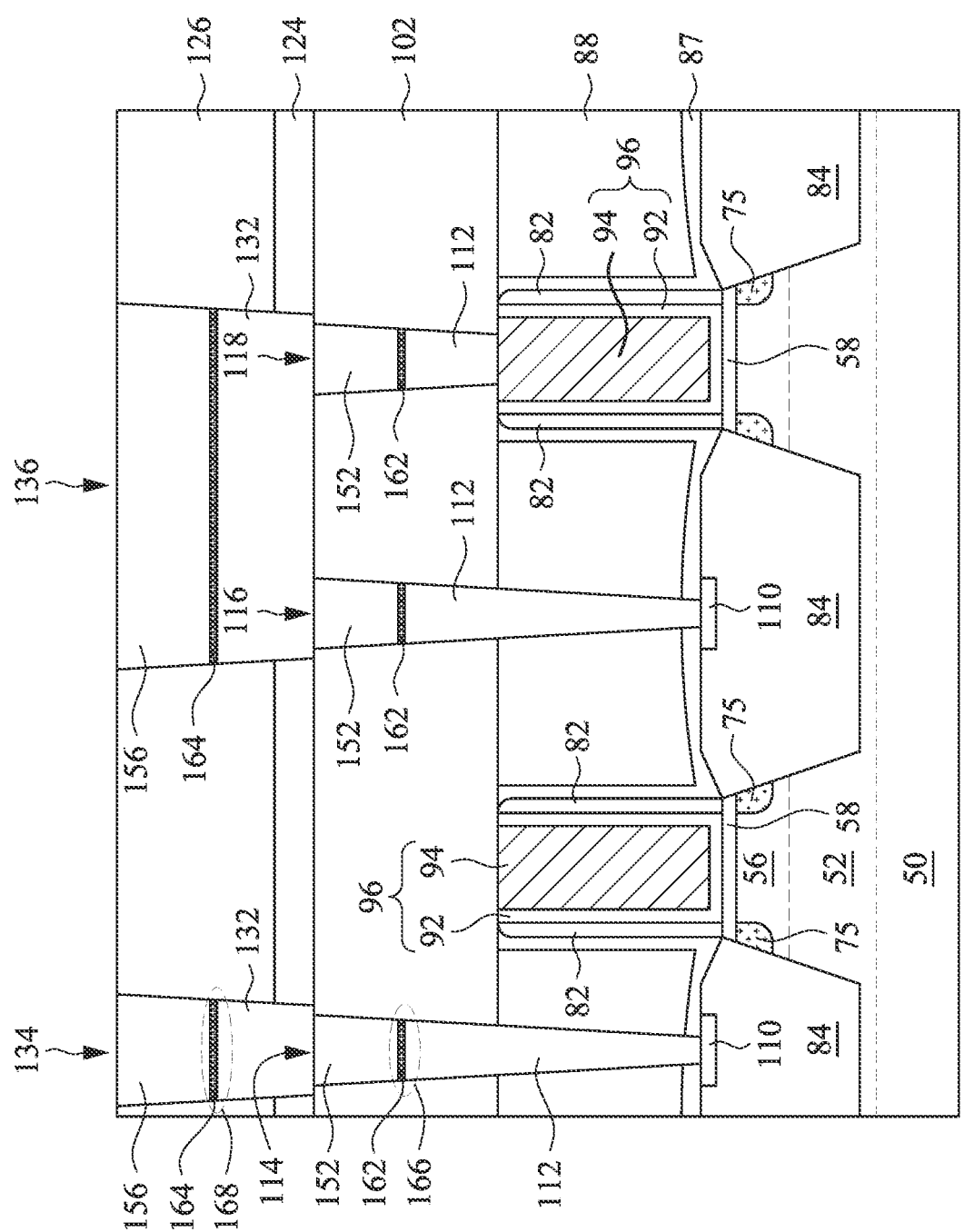

FIG. 39B illustrates a structure similar to the structure shown in FIG. 35B, with like elements labeled by like numerical references. In some embodiments, the structure of FIG. 39B may be formed using similar materials and methods as the structure of FIG. 35B and the description is not repeated herein. In the embodiment illustrated in FIG. 39B, instead of forming the conformal barrier layers 150 (see FIG. 35B), non-conformal barrier layers 162 are selectively formed between the conductive materials 112 and 152. In some embodiments, the barrier layers 162 may be formed using similar materials and methods as the barrier layer 146 described above with reference to FIG. 33B, and the description is not repeated herein. Furthermore, instead of forming the conformal barrier layers 154 (see FIG. 35B), non-conformal barrier layers 164 are selectively formed between the conductive materials 132 and 156. In some embodiments, the barrier layers 164 may be formed using similar materials and methods as the barrier layer 146 described above with reference to FIG. 33B, and the description is not repeated herein. In some embodiments, the barrier layers 162 and the barrier layers 164 may comprise a same material. In other embodiments, the barrier layers 162 and the barrier layers 164 may comprise different materials. In some embodiments, the barrier layers 162 have a thickness between about 0.5 nm and about 5 nm. In some embodiments, the barrier layers 164 have a thickness between about 0.5 nm and about 5 nm.

Figure 40B:
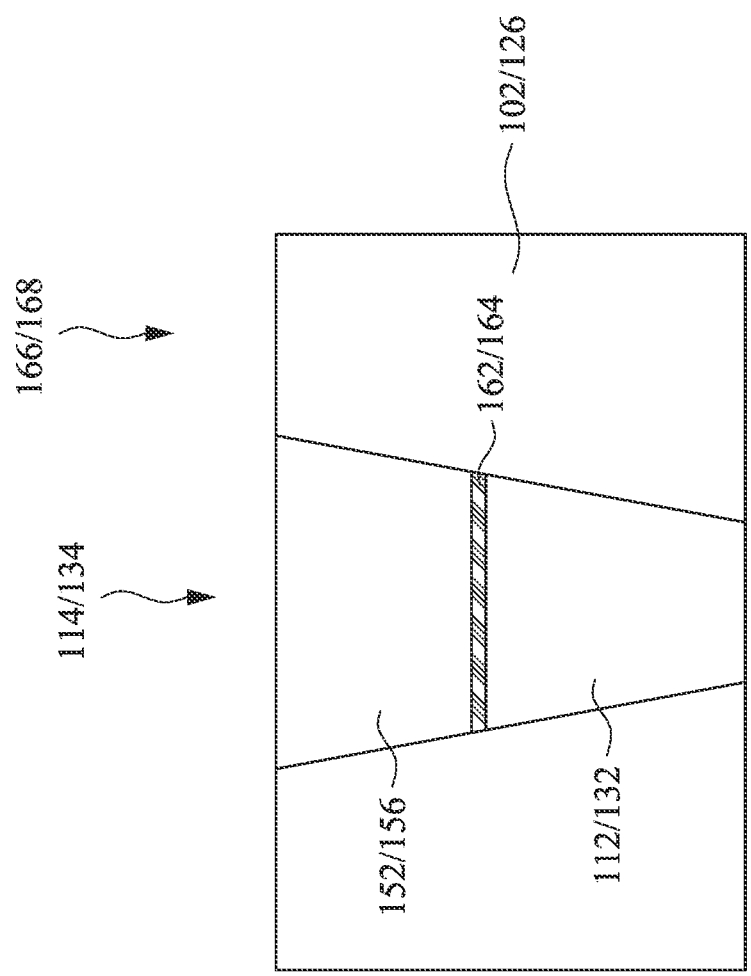
Figure 41B:
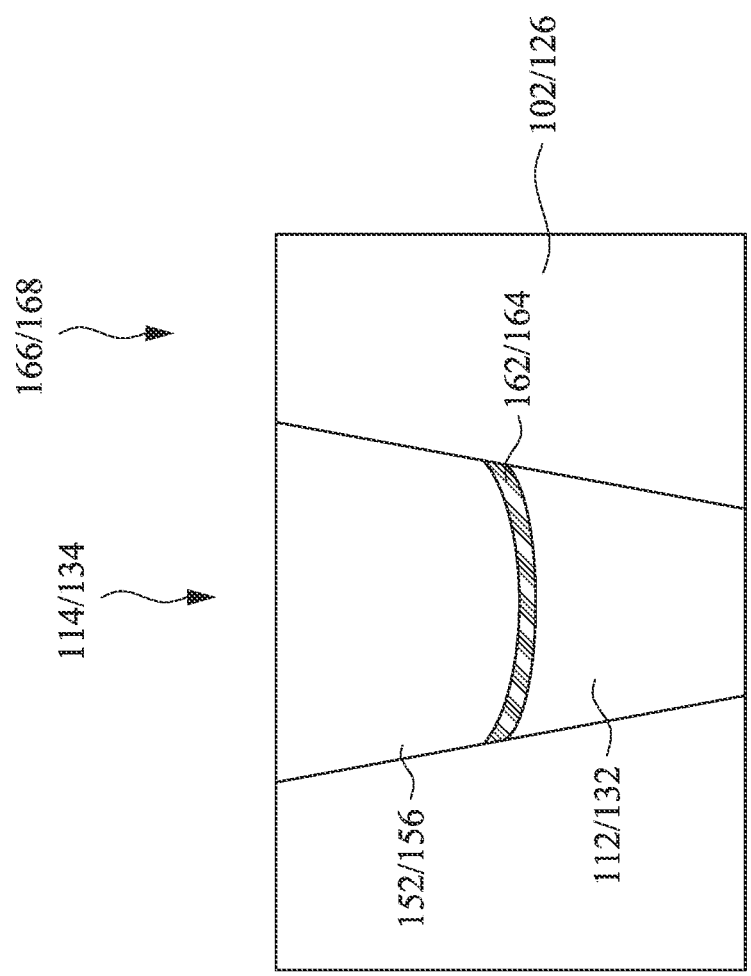
Figure 42B:
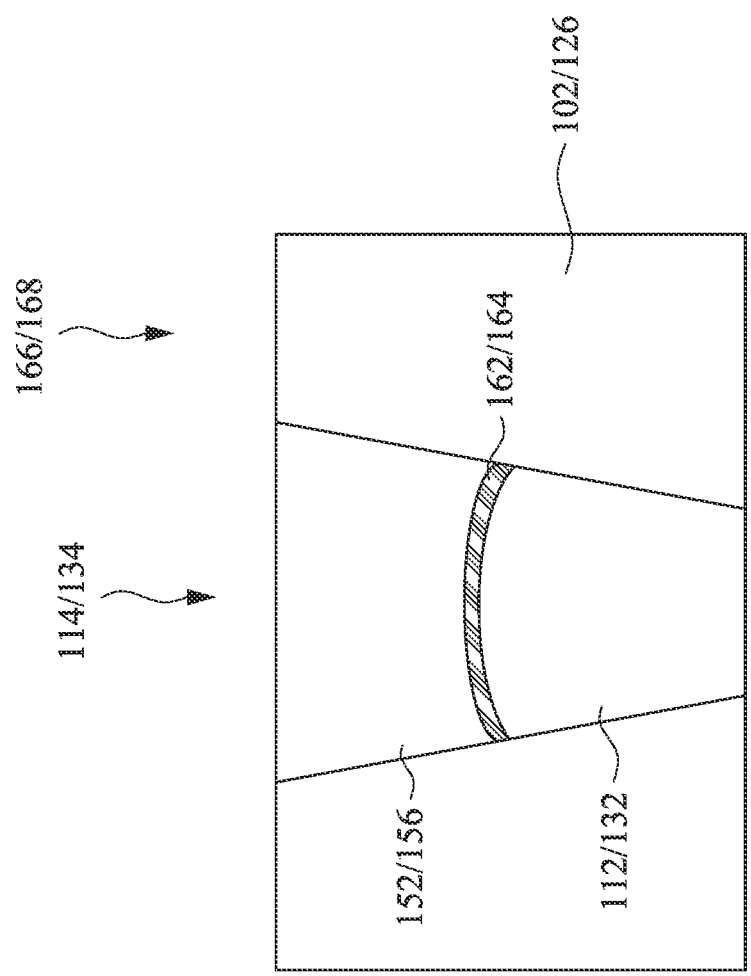

FIGS. 40B, 41B, and 42B illustrate magnified views of portions 166 and 168 of the structure shown in FIG. 39B. Referring to FIG. 40B, the conductive materials 112 and 132 have planar top surfaces and the conductive materials 152 and 156 have planar bottom surfaces. Referring to FIG. 41B, the conductive materials 112 and 132 have non-planar top surfaces (such as concave surfaces) and the conductive materials 152 and 156 have non-planar bottom surfaces (such as convex surfaces). Referring to FIG. 42B, the conductive materials 112 and 132 have non-planar top surfaces (such as convex surfaces) and the conductive materials 152 and 156 have non-planar bottom surfaces (such as concave surfaces).

Figure 43:
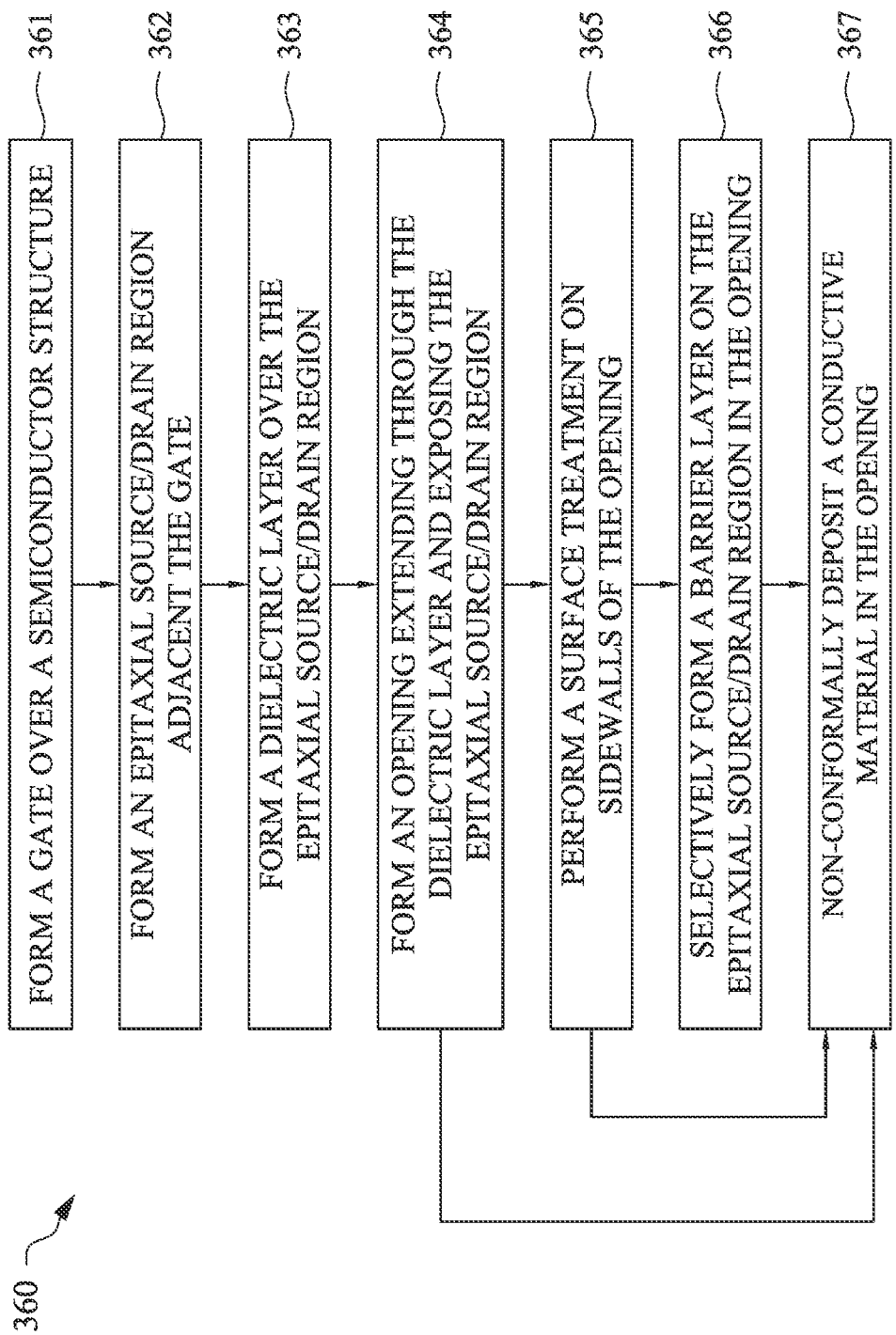
FIG. 43 is a flow diagram illustrating a method of forming a contact plug in accordance with some embodiments.

FIG. 43 is a flow diagram illustrating a method 360 of forming a contact plug in accordance with some embodiments. The method 360 starts with step 361, where a gate (such as, for example, the gate 70 illustrated in FIGS. 8A and 8B) is formed over a semiconductor structure (such as, for example, the fins 56 illustrated in FIGS. 8A, 8B and 8C) as described above with reference to FIGS. 8A, 8B and 8C. In step 362, an epitaxial source/drain region (such as, for example, the epitaxial source/drain region 84 illustrated in FIGS. 11B and 11C) is formed adjacent the gate as described above with reference to FIGS. 11A, 11B and 11C. In step 363, a dielectric layer (such as, for example, the ILD 102 illustrated in FIG. 16B) is formed over the epitaxial source/drain region as described above with reference to FIG. 16B. In step 364, an opening (such as, for example, the opening 104 illustrated in FIG. 16B) is formed extending through the dielectric layer and exposing the epitaxial source/drain region as described above with reference to FIG. 16B. In step 365, a surface treatment is performed on sidewall of the opening as described above with reference to FIGS. 19B, 20-22 and 23B. In step 366, a barrier layer (such as, for example, the barrier layer 148 illustrated in FIG. 34B) is selectively formed on the epitaxial source/drain region in the opening as described above with reference to FIG. 27B. In step 367, a conductive material (such as, for example, the conductive material 112 illustrated in FIG. 34B) is non-conformally deposited in the opening as described above with reference to FIG. 34B. In some embodiments, steps 365 and 366 are omitted, such that step 367 is performed after performing step 364. In some embodiments, step 366 is omitted, such that step 367 is performed after performing step 365.

Figure 44:
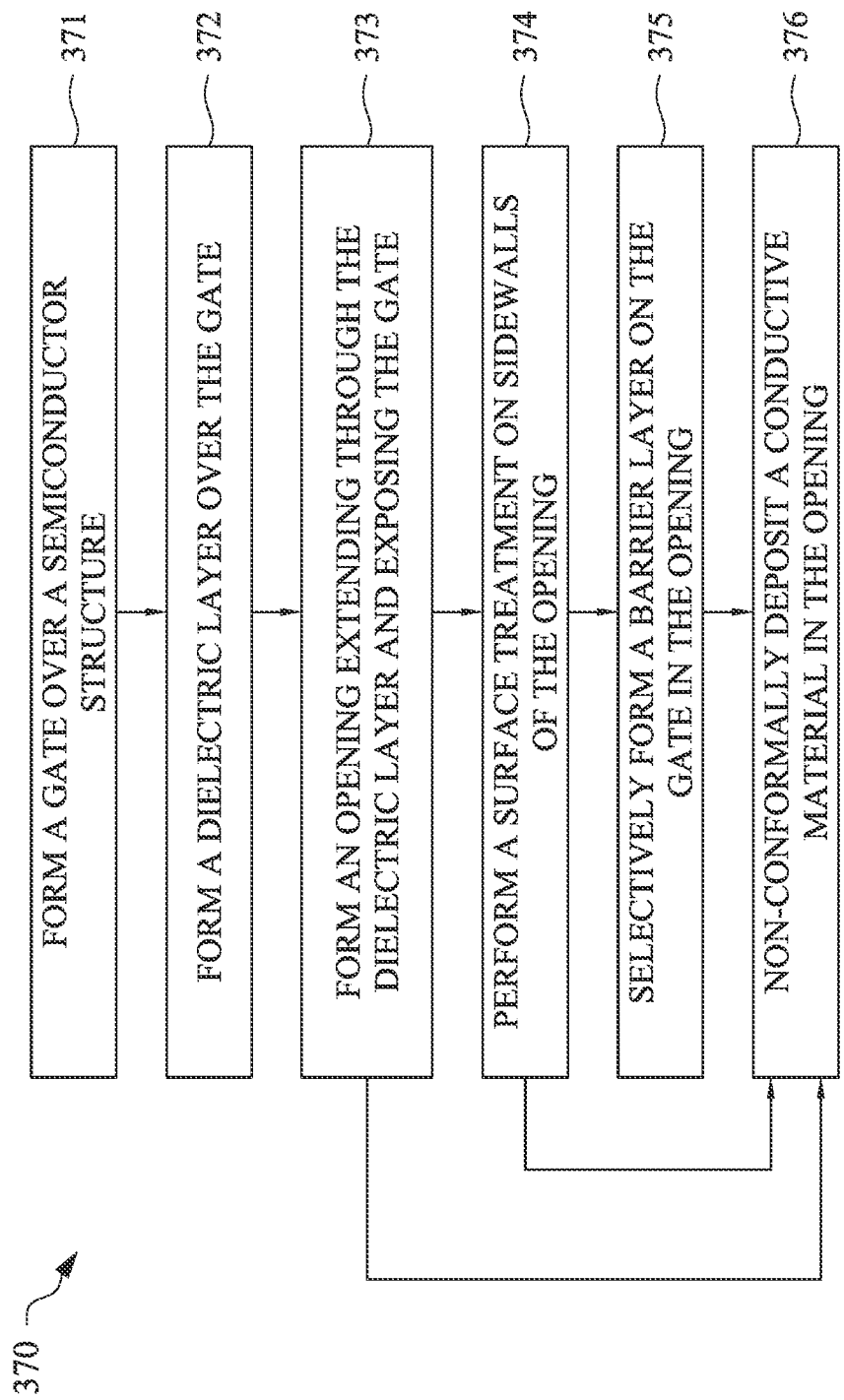
FIG. 44 is a flow diagram illustrating a method of forming a contact plug in accordance with some embodiments.

FIG. 44 is a flow diagram illustrating a method 370 of forming a contact plug in accordance with some embodiments. The method 370 starts with step 371, where a gate (such as, for example, the gate 96 illustrated in FIGS. 15A and 15B) is formed over a semiconductor structure (such as, for example, the fins 56 illustrated in FIGS. 15A and 15B) as described above with reference to FIGS. 15A and 15B. In step 372, a dielectric layer (such as, for example, the ILD 102 illustrated in FIG. 16B) is formed over the gate as described above with reference to FIG. 16B. In step 373, an opening (such as, for example, the opening 108 illustrated in FIG. 16B) is formed extending through the dielectric layer and exposing the gate as described above with reference to FIG. 16B. In step 374, a surface treatment is performed on sidewall of the opening as described above with reference to FIGS. 19B, 20-22 and 23B. In step 375, a barrier layer (such as, for example, the barrier layer 148 illustrated in FIG. 34B) is selectively formed on the gate in the opening as described above with reference to FIG. 34B. In step 376, a conductive material (such as, for example, the conductive material 112 illustrated in FIG. 34B) is non-conformally deposited in the opening as described above with reference to FIG. 34B. In some embodiments, steps 374 and 375 are omitted, such that step 376 is performed after performing step 373. In some embodiments, step 375 is omitted, such that step 376 is performed after performing step 374.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

According to an embodiment, a method includes: forming a gate over a semiconductor structure; forming an epitaxial source/drain region adjacent the gate; forming a dielectric layer over the epitaxial source/drain region; forming an opening extending through the dielectric layer and exposing the epitaxial source/drain region; and non-conformally depositing a conductive material in the opening, the conductive material filling the opening in a bottom-up manner. In an embodiment, the method further includes, before non-conformally depositing the conductive material in the opening, performing a surface treatment process on sidewalls of the opening, the surface treatment process reducing a deposition rate of the conductive material on the sidewalls of the opening. In an embodiment, the method further includes, after performing the surface treatment process on the sidewalls of the opening and before non-conformally depositing the conductive material in the opening, selectively depositing a barrier layer on the epitaxial source/drain region in the opening. In an embodiment, the surface treatment process reduces a deposition rate of the barrier layer on the sidewalls of the opening. In an embodiment, the surface treatment process alters hydrophilic surfaces of the dielectric layer exposed in the opening into hydrophobic surfaces. In an embodiment, performing the surface treatment process on the sidewalls of the opening includes performing a silylation process on the sidewalls of the opening. In an embodiment, the surface treatment process forms a barrier layer on the sidewalls of the opening.

According to another embodiment, a method includes: forming a gate over a semiconductor structure; forming a first dielectric layer over the gate and the semiconductor structure; forming a first opening extending through the first dielectric layer and exposing the gate; performing a first surface treatment process on sidewalls of the first opening; selectively forming a first barrier layer on a bottom of the first opening and not on the sidewalls of the first opening; and bottom-up filling the first opening with a first conductive material. In an embodiment, performing the first surface treatment process on the sidewalls of the first opening includes performing a silylation process on the sidewalls of the first opening. In an embodiment, the first surface treatment process forms a second barrier layer on the sidewalls of the first opening. In an embodiment, the first surface treatment process reduces a deposition rate of the first barrier layer on the sidewalls of the first opening.

In an embodiment, the method further includes: forming a second dielectric layer over the first dielectric layer; forming a second opening in the second dielectric layer, the second opening exposing the first conductive material; performing a second surface treatment process on sidewalls of the second opening; selectively forming a second barrier layer on a bottom of the second opening and not on the sidewalls of the second opening; and bottom-up filling the second opening with a second conductive material. In an embodiment, the first conductive material is different from the second conductive material. In an embodiment, the second surface treatment process reduces a deposition rate of the second barrier layer on the sidewalls of the second opening.

According to yet another embodiment, a method includes: forming a first epitaxial source/drain region and a second epitaxial source/drain region over a semiconductor structure; forming a gate over the semiconductor structure and between the first epitaxial source/drain region and the second epitaxial source/drain region; forming a first dielectric layer over the gate, the first epitaxial source/drain region and the second epitaxial source/drain region; etching the first dielectric layer to form a first opening and a second opening in the first dielectric layer, the first opening exposing the first epitaxial source/drain region, the second opening exposing the gate; performing a surface treatment process on sidewalls of the first opening and sidewalls of the second opening; and filling the first opening and the second opening with a conductive material in a bottom-up manner. In an embodiment, the method further includes: before filling the first opening and the second opening with the conductive material, forming a first barrier layer on a bottom of the first opening, the first barrier layer not extending along the sidewalls of the first opening; and before filling the first opening and the second opening with the conductive material, forming a second barrier layer on a bottom of the second opening, the second barrier layer not extending along the sidewalls of the second opening. In an embodiment, the first barrier layer and the second barrier layer comprise a same material. In an embodiment, performing the surface treatment process on the sidewalls of the first opening and the sidewalls of the second opening includes performing a silylation process on the sidewalls of the first opening and the sidewalls of the second opening. In an embodiment, the surface treatment process includes: forming a first barrier layer on the sidewalls of the first opening; and forming a second barrier layer on the sidewalls of the second opening. In an embodiment, the surface treatment process reduces a deposition rate of the conductive material on the sidewalls of the first opening and the sidewalls of the second opening.

According to yet another embodiment, a device includes: a substrate including an active region; a first epitaxial source/drain region in the active region; a first dielectric layer over the first epitaxial source/drain region; a first conductive feature extending through the first dielectric layer and electrically coupled to the first epitaxial source/drain region; and a first barrier layer interposed between the first epitaxial source/drain region and a bottom surface of the first conductive feature, the first barrier layer not extending along a sidewall of the first conductive feature.

According to yet another embodiment, a device includes: a substrate including an active region; a first epitaxial source/drain region extending into the active region; a silicide layer over the first epitaxial source/drain region; a first dielectric layer over the first epitaxial source/drain region; a first conductive feature extending through the first dielectric layer and electrically coupled to the silicide layer; a second conductive feature extending through the first dielectric layer and electrically coupled to the first conductive feature, where a bottom surface of the second conductive feature is a convex surface; and a first barrier layer interposed between the first conductive feature and second conductive feature.

According to yet another embodiment, a device including: a substrate including an active region; a first epitaxial source/drain region extending into the active region; a silicide layer over the first epitaxial source/drain region; a first dielectric layer over the first epitaxial source/drain region; a first conductive feature extending through the first dielectric layer and electrically coupled to the first epitaxial source/drain region; a first barrier layer interposed between a bottom surface of the first conductive feature and the silicide layer; a first self-assembled monolayer (SAM) extending along and in physical contact with a sidewall of the first conductive feature; a second dielectric layer over the first dielectric layer and the first conductive feature; a second conductive feature extending through the second dielectric layer and electrically coupled to the first conductive feature; a second barrier layer interposed between a bottom surface of the second conductive feature and a top surface of the first conductive feature; and a second SAM extending along and in physical contact with a sidewall of the second conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a substrate comprising an active region;
   a first epitaxial source/drain region in the active region;
   a first dielectric layer over the first epitaxial source/drain region;
   a first conductive feature extending through the first dielectric layer and electrically coupled to the first epitaxial source/drain region; and
   a first barrier layer at least partially disposed in the first dielectric layer, the first barrier layer being interposed between the first epitaxial source/drain region and a bottom surface of the first conductive feature, the first barrier layer not extending along a sidewall of the first conductive feature.

2. The device of claim 1, further comprising a silicide layer interposed between the first epitaxial source/drain region and the first barrier layer, wherein a width of the first barrier layer is less than a width of the silicide layer.

3. The device of claim 1, further comprising a self-assembled monolayer (SAM) at least partially disposed in the first dielectric layer, the SAM further extending along and in physical contact with a sidewall of the first conductive feature.

4. The device of claim 3, wherein the SAM is in physical contact with a sidewall of the first barrier layer.

5. The device of claim 1, further comprising:
a gate over the active region; and
a second conductive feature extending through the first dielectric layer and electrically coupled to the gate.

6. The device of claim 5, further comprising a second barrier layer interposed between a bottom surface of the second conductive feature and the gate, the second barrier layer not extending along a sidewall of the second conductive feature.

7. The device of claim 5, further comprising a second SAM extending along and in physical contact with a sidewall of the second conductive feature.

8. A device comprising:
a substrate comprising an active region;
a first epitaxial source/drain region extending into the active region;
a silicide layer over the first epitaxial source/drain region;
a first dielectric layer over the first epitaxial source/drain region;
a first conductive feature extending through the first dielectric layer and electrically coupled to the first epitaxial source/drain region;
a first barrier layer interposed between a bottom surface of the first conductive feature and the silicide layer;
a first self-assembled monolayer (SAM) in the first dielectric layer, the first SAM extending along and in physical contact with a sidewall of the first conductive feature, the first SAM further extending along a sidewall of the first barrier layer;
a second dielectric layer over the first dielectric layer and the first conductive feature;
a second conductive feature extending through the second dielectric layer and electrically coupled to the first conductive feature;
a second barrier layer interposed between a bottom surface of the second conductive feature and a top surface of the first conductive feature, and the second barrier layer being disposed over a top surface of the first SAM; and
a second SAM in the second dielectric layer, the second SAM extending along and in physical contact with a sidewall of the second conductive feature, the second SAM further extending along a sidewall of the second barrier layer.

9. The device of claim 8, wherein the first conductive feature and the second conductive feature comprise different materials.

10. The device of claim 8, wherein the second barrier layer does not extend along a sidewall of the second conductive feature.

11. The device of claim 8, wherein the second conductive feature is wider than the first conductive feature.

12. The device of claim 8, wherein the first SAM is in physical contact with a bottom surface of the second barrier layer.

13. The device of claim 8, wherein the second SAM is in physical contact with a sidewall of the second barrier layer.

14. A device comprising:
a source/drain region extending into a semiconductor substrate;
a silicide in the source/drain region;
a first conductive barrier layer over and contacting the silicide;
a first dielectric layer over the source/drain region;
a first conductive feature extending through the first dielectric layer and electrically connected to the silicide, wherein the first conductive barrier layer physically separates the first conductive feature from the silicide; and
one or more first monolayers contacting a sidewall of the first conductive feature and a sidewall of the first conductive barrier layer, the one or more first monolayers and the first conductive barrier layer each being disposed in at least the first dielectric layer, wherein the one or more first monolayers comprise thiols or thiolate terminated molecules.

15. The device of claim 14 further comprising:
a second dielectric layer over the first dielectric layer;
a second conductive feature extending through the second dielectric layer and electrically connected to the first conductive feature; and
a second conductive barrier layer physically separating the second conductive feature from the first conductive feature.

16. The device of claim 15, further comprising one or more second monolayers contacting a sidewall of the second conductive feature, wherein the one or more second monolayers comprise thiols or thiolate terminated molecules.

17. The device of claim 16, wherein the one or more second monolayers further contact a sidewall of the second conductive barrier layer.

18. The device of claim 15, wherein the first conductive feature and the second conductive feature comprise different materials.

19. The device of claim 14, wherein the first conductive barrier layer does not extend along a sidewall of the first conductive feature.

20. The device of claim 14, wherein the silicide is wider than the first conductive barrier layer.

* * * * *